US009589981B2

(12) United States Patent
Nishikawa et al.

(10) Patent No.: US 9,589,981 B2
(45) Date of Patent: Mar. 7, 2017

(54) PASSIVE DEVICES FOR INTEGRATION WITH THREE-DIMENSIONAL MEMORY DEVICES

(71) Applicant: SanDisk Technologies, Inc., Plano, TX (US)

(72) Inventors: Masatoshi Nishikawa, Yokkaichi (JP); Ryoichi Honma, Yokkaichi (JP); Toru Miwa, Yokkaichi (JP); Hiroaki Koketsu, Yokkaichi (JP); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/739,354

(22) Filed: Jun. 15, 2015

(65) Prior Publication Data

US 2016/0365352 A1 Dec. 15, 2016

(51) Int. Cl.

| | |
|---|---|
| ***H01L 27/115*** | (2006.01) |
| ***H01L 23/522*** | (2006.01) |
| ***H01L 23/528*** | (2006.01) |
| ***H01L 49/02*** | (2006.01) |
| ***H01L 21/265*** | (2006.01) |
| ***H01L 21/768*** | (2006.01) |
| ***H01L 21/3205*** | (2006.01) |

(52) U.S. Cl.

CPC .. *H01L 27/11582* (2013.01); *H01L 21/26513* (2013.01); *H01L 21/32055* (2013.01); *H01L 21/76802* (2013.01); *H01L 21/76877* (2013.01); *H01L 23/528* (2013.01); *H01L 23/5226* (2013.01); *H01L 27/11531* (2013.01); *H01L 27/11556* (2013.01); *H01L 27/11573* (2013.01); *H01L 28/20* (2013.01)

(58) Field of Classification Search

CPC ......... H01L 27/11582; H01L 21/26513; H01L 23/528; H01L 21/76877; H01L 23/5226; H01L 28/20; H01L 21/32055; H01L 27/11531; H01L 21/76802; H01L 27/11573; H01L 27/11556; H01L 27/11519; H01L 29/7926; H01L 29/7889

See application file for complete search history.

(56) References Cited

U.S. PATENT DOCUMENTS 5,915,167 A 6/1999 Leedy
7,005,350 B2 2/2006 Walker et al.

(Continued)

FOREIGN PATENT DOCUMENTS

WO WO02/15277 A2 2/2002

OTHER PUBLICATIONS

Non-Final Office Communication for U.S. Appl. No. 14/739,284, filed Jun. 15, 2015, dated Apr. 8, 2016, 10 pages.

(Continued)

*Primary Examiner* — Jarrett Stark
*Assistant Examiner* — Bitew Dinke
(74) *Attorney, Agent, or Firm* — The Marbury Law Group PLLC

(57) ABSTRACT

A three dimensional memory device includes a memory device region containing a plurality of non-volatile memory devices, a peripheral device region containing active driver circuit devices, and a stepped surface region between the peripheral device region and the memory device region containing a plurality of passive driver circuit devices.

4 Claims, 82 Drawing Sheets

(56) References Cited

U.S. PATENT DOCUMENTS

| | | | | |
|---|---|---|---|---|
| 7,023,739 | B2 | 4/2006 | Chen et al. | |
| 7,177,191 | B2 | 2/2007 | Fasoli et al. | |
| 7,221,588 | B2 | 5/2007 | Fasoli et al. | |
| 7,233,522 | B2 | 6/2007 | Chen et al. | |
| 7,514,321 | B2 | 4/2009 | Mokhlesi et al. | |
| 7,575,973 | B2 | 8/2009 | Mokhlesi et al. | |
| 7,696,559 | B2 | 4/2010 | Arai et al. | |
| 7,745,265 | B2 | 6/2010 | Mokhlesi et al. | |
| 7,808,038 | B2 | 10/2010 | Mokhlesi et al. | |
| 7,848,145 | B2 | 12/2010 | Mokhlesi et al. | |
| 7,851,851 | B2 | 12/2010 | Mokhlesi et al. | |
| 8,008,710 | B2 | 8/2011 | Fukuzumi | |
| 8,053,829 | B2 | 11/2011 | Kang et al. | |
| 8,187,936 | B2 | 5/2012 | Alsmeier et al. | |
| 8,394,716 | B2 | 3/2013 | Hwang et al. | |
| 8,643,142 | B2 | 2/2014 | Higashitani et al. | |
| 8,901,704 | B2 | 12/2014 | Kang | |
| 9,023,719 | B2 | 5/2015 | Pachamuthu et al. | |
| 9,230,979 | B1 * | 1/2016 | Pachamuthu | H01L 27/11575 |
| 2005/0117443 | A1 | 6/2005 | Park et al. | |
| 2007/0210338 | A1 | 9/2007 | Orlowski | |
| 2007/0252201 | A1 | 11/2007 | Kito et al. | |
| 2009/0230449 | A1 * | 9/2009 | Sakaguchi | H01L 27/0688 257/298 |
| 2009/0242967 | A1 | 10/2009 | Katsumata et al. | |
| 2010/0044778 | A1 | 2/2010 | Seol | |
| 2010/0112769 | A1 | 5/2010 | Son et al. | |
| 2010/0120214 | A1 | 5/2010 | Park et al. | |
| 2010/0155810 | A1 | 6/2010 | Kim et al. | |
| 2010/0155818 | A1 | 6/2010 | Cho | |
| 2010/0181610 | A1 | 7/2010 | Kim et al. | |
| 2010/0207195 | A1 | 8/2010 | Fukuzumi et al. | |
| 2010/0320528 | A1 | 12/2010 | Jeong et al. | |
| 2011/0051492 | A1 | 3/2011 | Toda | |
| 2011/0076819 | A1 | 3/2011 | Kim et al. | |
| 2011/0133606 | A1 | 6/2011 | Yoshida et al. | |
| 2011/0266606 | A1 | 11/2011 | Park et al. | |
| 2012/0001247 | A1 | 1/2012 | Alsmeier | |
| 2012/0001249 | A1 | 1/2012 | Alsmeier | |
| 2012/0001250 | A1 | 1/2012 | Alsmeier | |
| 2012/0012920 | A1 | 1/2012 | Shin et al. | |
| 2012/0068255 | A1 * | 3/2012 | Lee | H01L 27/11582 257/324 |
| 2012/0119287 | A1 | 5/2012 | Park et al. | |
| 2013/0127011 | A1 | 5/2013 | Higashitani et al. | |
| 2013/0130468 | A1 * | 5/2013 | Higashitani | H01L 29/7926 438/382 |
| 2013/0130495 | A1 | 5/2013 | Higashitani et al. | |
| 2013/0134492 | A1 * | 5/2013 | Yang | H01L 27/11582 257/314 |
| 2013/0264631 | A1 | 10/2013 | Alsmeier et al. | |
| 2014/0054675 | A1 * | 2/2014 | Lee | H01L 29/7926 257/324 |
| 2014/0070302 | A1 * | 3/2014 | Yoo | H01L 27/1157 257/324 |
| 2014/0197481 | A1 * | 7/2014 | Hwang | H01L 29/66833 257/330 |
| 2014/0329379 | A1 * | 11/2014 | Kim | H01L 21/28008 438/586 |
| 2015/0076584 | A1 | 3/2015 | Pachamuthu et al. | |
| 2015/0076586 | A1 * | 3/2015 | Rabkin | G11C 16/0483 257/324 |
| 2015/0097222 | A1 * | 4/2015 | Lee | H01L 27/1157 257/314 |
| 2015/0104916 | A1 * | 4/2015 | Lee | H01L 27/1157 438/268 |
| 2015/0179660 | A1 * | 6/2015 | Yada | H01L 21/02164 257/321 |
| 2015/0243675 | A1 * | 8/2015 | Lim | H01L 27/11556 257/324 |
| 2015/0348984 | A1 * | 12/2015 | Yada | H01L 27/11524 257/316 |
| 2015/0372004 | A1 * | 12/2015 | Jung | H01L 27/11582 257/324 |
| 2016/0027796 | A1 * | 1/2016 | Yang | H01L 27/11573 257/314 |
| 2016/0079185 | A1 * | 3/2016 | Kato | H01L 23/5226 257/314 |
| 2016/0093637 | A1 * | 3/2016 | Lee | H01L 27/11582 438/269 |
| 2016/0104719 | A1 * | 4/2016 | Jung | H01L 27/11582 257/324 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

U.S. Appl. No. 14/517,134, filed Oct. 17, 2014, SanDisk Technologies Inc.

U.S. Appl. No. 14/723,868, filed May 28, 2015, SanDisk Technologies Inc.

U.S. Appl. No. 14/739,284, filed Jun. 15, 2015, SanDisk Technologies Inc.

International Search Report and Written Opinion of the International Searching Authority from the International Searching Authority for International Application No. PCT/US2016/036771, dated Dec. 2, 2016, 21 pages.

Invitation to Pay Additional Fees and Communication Relating to the Results of the Partial International Search from the International Searching Authority for International Application No. PCT/US2016/036771, dated Oct. 11, 2016, 7 pages.

* cited by examiner

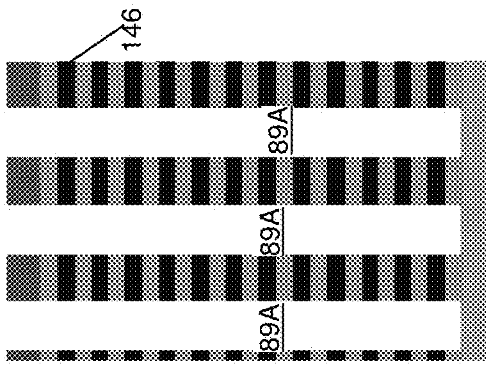
FIG. 14P
FIG. 14N
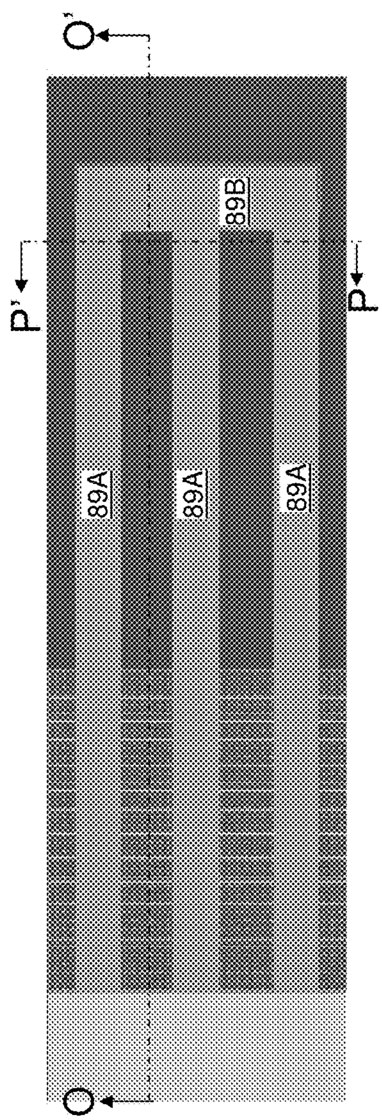
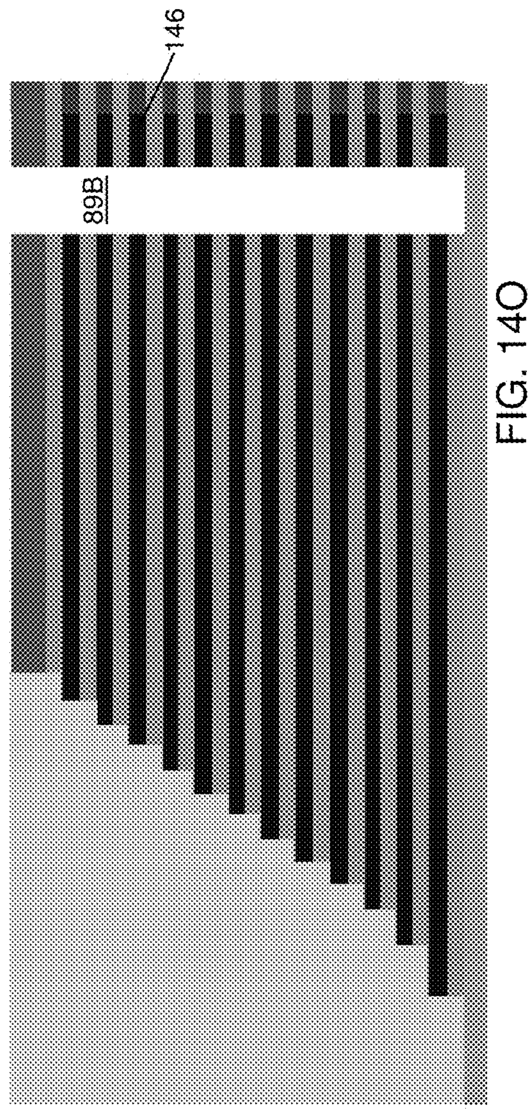
FIG. 14O

PASSIVE DEVICES FOR INTEGRATION WITH THREE-DIMENSIONAL MEMORY DEVICES

FIELD

The present disclosure relates generally to the field of semiconductor devices and specifically to passive devices that are compatible with three-dimensional memory devices and methods of making thereof.

BACKGROUND

Passive devices refer to devices that provide an output with, or without, a phase change in linear proportion to a sinusoidal electrical input. Passive devices do not have the ability to switch on, or off, the output. Passive devices include, for example, resistors, capacitors, and inductors. Semiconductor circuits routinely employ passive devices in addition to active devices such as transistors.

SUMMARY

According to an aspect of the present disclosure a three dimensional memory device is provided, comprising a memory device region containing a plurality of non-volatile memory devices, a peripheral device region containing active driver circuit devices, and a first stepped surface region between the peripheral device region and the memory device region containing a plurality of passive driver circuit devices. According to another aspect of the present disclosure, a device comprising a set of capacitors is provided, the device comprising a stack of alternating layers including electrically insulating layers and electrically conductive layers located over a substrate, wherein each underlying electrically conductive layer that is located within the stack and has at least one overlying electrically conductive layer that laterally extends farther than the underlying electrically conductive layer to form a stepped surface region on a side of the stack, and a dielectric material portion located over the stepped surface region of the stack, wherein an interface between the dielectric material portion and the stack includes a contiguous set of horizontal surfaces and vertical surfaces to provide the stepped surface region. The device further comprises a set of dielectric fill material portions located within trenches that vertically extend through the stack of alternating layers and laterally contact sidewalls of the stack of alternating layers in the stepped surface region and a plurality of contact via structures in contact with respective electrically conductive layers within the stack of alternating layers. The electrically conductive layers constitute conductive components of a set of capacitors and a subset of the electrically insulating layers constitutes node dielectrics of the set of capacitors, Each capacitor in the set comprises a first node that includes an underlying electrically conductive layer of a respective vertically neighboring pair and a respective contact via structure that extends upward from the underlying electrically conductive layer and through the dielectric material portion, and a second node that includes an overlying electrically conductive layer of the respective vertically neighboring pair and a respective contact via structure that extends upward from the overlying electrically conductive layer and through the dielectric material portion.

According to another aspect of the present disclosure a method of forming a memory device comprises forming a plurality of memory devices in a memory device region; forming a plurality of passive devices outside the memory device region, and forming a conductive layer in one deposition step such that a first portion of the conductive layer comprises a portion of at least one of the passive device and a second portion of the conductive layer forms a portion of at least one memory device.

According to yet another aspect of the present disclosure, a semiconductor device is provided, comprising an alternating stack of first material layers and second material layers located over a substrate, at least one pillar structure extending from a first horizontal plane including a top surface of the alternating stack through at least a portion of the alternating stack, a laterally-extending semiconductor or conductive structure contacting a bottom surface of the at least one pillar structure, and a contact via structure contacting a top surface of the laterally-extending semiconductor or conductive structure and laterally spaced from the at least one pillar structure. Each of the at least one pillar structure comprises at least one doped semiconductor material portion therein, and each semiconductor material portion within the at least one pillar structure has a doping of a same second conductivity type.

According to still another aspect of the present disclosure a method of forming at least one resistor structure comprises forming an alternating stack of first material layers and second material layers over a substrate, and forming at least one vertically-extending cavity from a first horizontal plane including a top surface of the alternating stack to a laterally-extending semiconductor or conductive structure. A physically exposed portion of a top surface of the laterally-extending semiconductor or conductive structure is present within a second horizontal plane located in the alternating stack below the first horizontal plane. The method further comprises forming a resistor comprising a pillar structure within each of the at least one vertically-extending cavity, wherein each pillar structure comprises at least one doped semiconductor material portion, and wherein each semiconductor material within the pillar structure has a doping of a same second conductivity type, and forming a contact via structure contacting another portion of the top surface of the laterally-extending semiconductor or conductive structure.

BRIEF DESCRIPTION OF THE DRAWINGS

FIGS. 14B, 14E, 14H, 14K, 14N, 14Q and 14T are top-down views of the alternative exemplary structures during fabrication steps of the device of FIG. 14X. FIGS. 14C, 14F, 141, 14L, 14O, 14R and 14U are vertical cross-sectional views along respective lines C-C', F-F', I-I', L-L', O-O', R-R' and U-U' in FIGS. 14B, 14E, 14H, 14K, 14N, 14Q and 14T, respectively. FIGS. 14D, 14G, 14J, 14M, 14P, 14S and 14V are vertical cross-sectional views along respective lines D-D', G-G', J-J', M-M', P-P', S-S' and V-V' in FIGS. 14B, 14E, 14H, 14K, 14N, 14Q and 14T, respectively.

DETAILED DESCRIPTION

Figure 1:
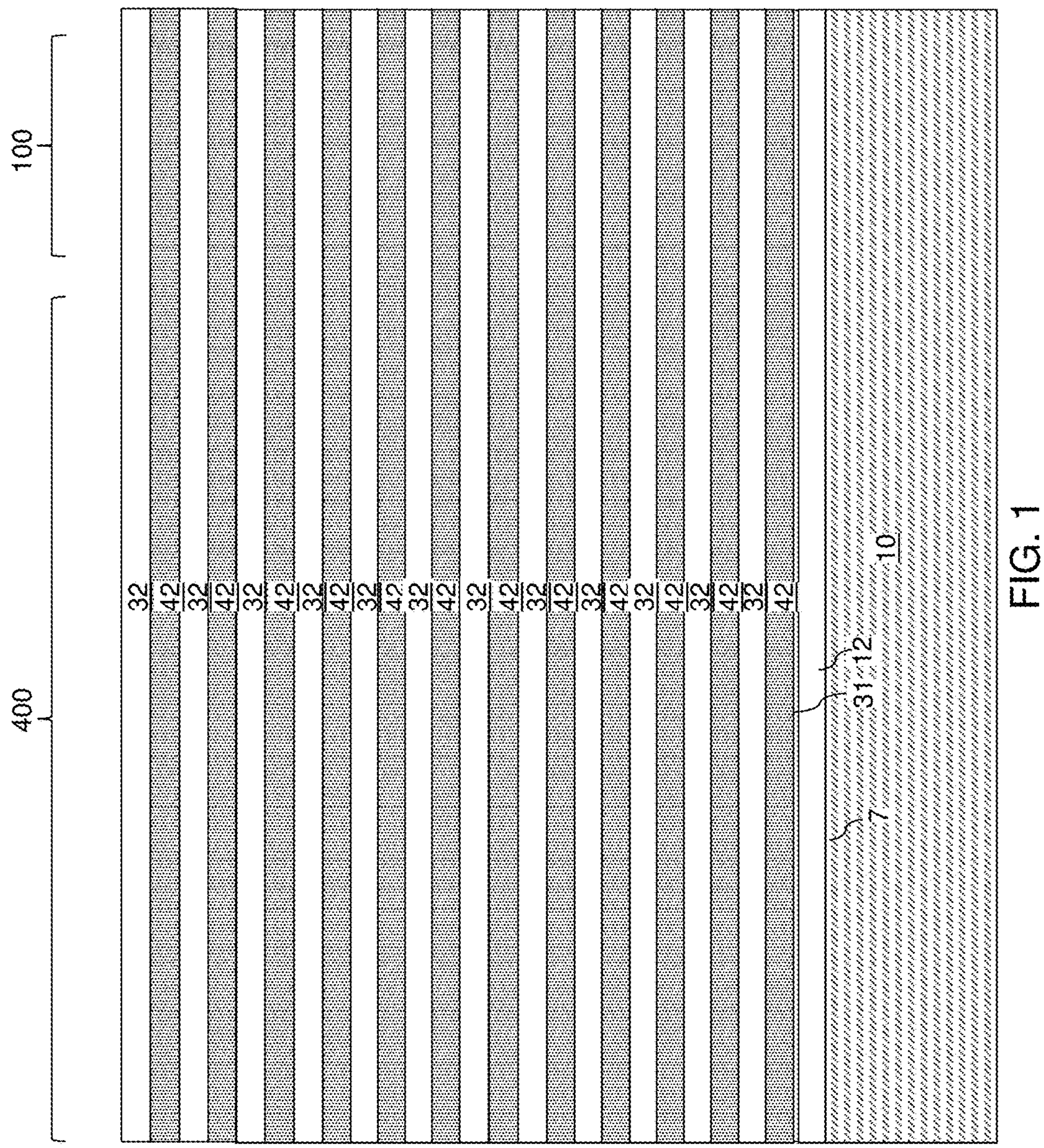
FIG. 1 is a vertical cross-sectional view of a first exemplary structure after formation of a stack of an alternating plurality of first material layers and second material layers according to a first embodiment of the present disclosure.

As discussed above, the present disclosure is directed to passive devices that are compatible with three-dimensional memory devices and methods of making thereof, the various aspects of which are described below. The embodiments of the disclosure can be employed to form various structures including a device structure, a non-limiting example of which includes capacitors and/or resistors that can be formed on a same substrate as additional semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A plane is horizontal when it is parallel to a flat portion of the top surface of the substrate. However, it should be understood that the substrate may be positioned at any angle with respect to the direction of gravity and that the term "horizontal" does not imply that a horizontal direction must be perpendicular to the direction of gravity. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The first exemplary structure includes a substrate, which can be a semiconductor substrate. The substrate can include a semiconductor material layer 10. The semiconductor material layer 10 can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the semiconductor material layer 10. The major surface 7 can be a semiconductor surface. In one embodiment, the major surface 7 can be a single crystalline semiconductor surface.

As used herein, a "semiconductor material" refers to a material having electrical conductivity in the range from $1.0\times10^{-6}$ S/cm to $1.0\times10^{5}$ S/cm, and is capable of producing a doped material having electrical resistivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. All measurements for electrical conductivities are made at the standard condition. Optionally, at least one doped well (not expressly shown) can be formed within the semiconductor material layer 10.

At least one semiconductor device (not shown) for a peripheral circuitry can be formed on a portion of the semiconductor material layer 10. The region in which the at least one semiconductor device for the peripheral circuitry is herein referred to as a peripheral device region. The at least one semiconductor device can include, for example, field effect transistors. The least one semiconductor device for the peripheral circuitry can contain a driver circuit for memory devices to be subsequently formed, which can include at least one NAND device.

Optionally, a dielectric pad layer 12 can be formed above the semiconductor material layer 10. The dielectric pad layer 12 can be, for example, silicon oxide layer. The thickness of the dielectric pad layer 12 can be in a range from 3 nm to 30 nm, although lesser and greater thicknesses can also be employed. A dielectric cap layer 31 can be optionally formed. The dielectric cap layer 31 includes a dielectric material such as silicon oxide, a dielectric metal oxide, and silicon nitride (in case the material of second material layers to be subsequently formed is not silicon nitride).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer 42. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42. The first exemplary structure may include a memory device region 100 in which an array of memory devices can be subsequently formed, and a capacitor region 400 in which at least one passive device can be subsequently formed.

Figure 2:
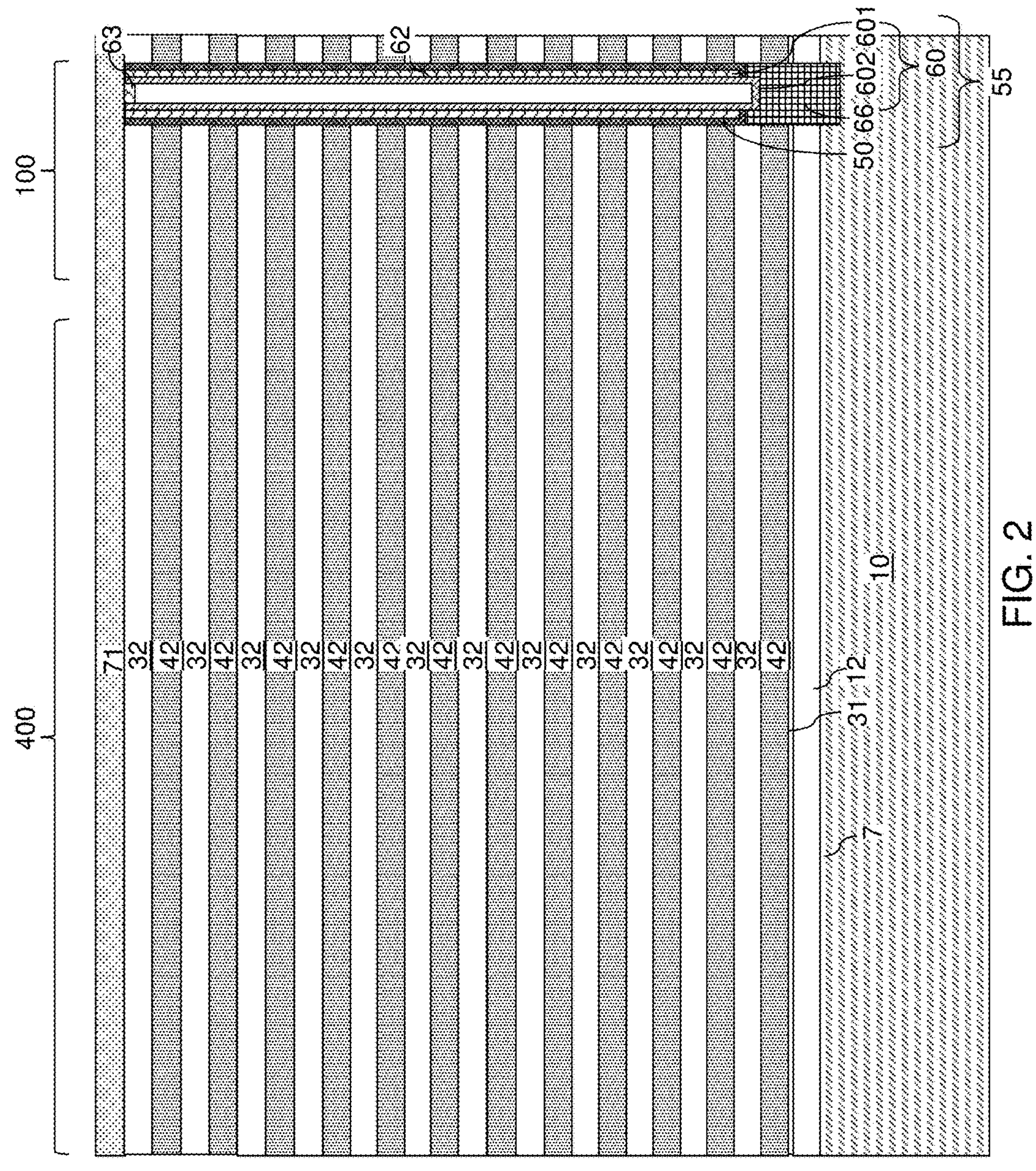
FIG. 2 is a vertical cross-sectional view of the first exemplary structure after formation of memory stack structures and an insulating cap layer according to the first embodiment of the present disclosure.

Referring to FIG. 2, a lithographic material stack (not shown) including at least a photoresist layer can be formed over the alternating stack (32, 42), and can be lithographically patterned to form openings therein. The pattern in the lithographic material stack can be transferred through the entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings. In other words, the transfer of the pattern in the patterned lithographic material stack through the alternating stack (32, 42) forms the memory openings that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings can be substantially vertical, or can be tapered. The patterned lithographic material stack can be subsequently removed, for example, by ashing. The memory openings can be formed in the memory device region 100.

The memory openings are formed through the dielectric cap layer 31 and the dielectric pad layer 12 so that the memory openings extend from the top surface of the alternating stack (32, 42) to the top surface of the semiconductor material layer 10. In one embodiment, an overetch into the semiconductor material layer 10 may be optionally performed after the top surface of the semiconductor material layer 10 is physically exposed at a bottom of each memory openings. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory openings can be coplanar with the topmost surface of the semiconductor material layer 10. Each of the memory openings can include a sidewall (or a plurality of sidewalls) that extends substantially perpendicular to the topmost surface of the substrate. The region in which the array of memory openings is formed is herein referred to as a device region.

A memory stack structure 55 can be formed within each memory opening through the alternating stack (32, 42). The memory stack structures 55 can be formed, for example, by forming an optional epitaxial channel portion 66 at a bottom portion of each memory opening by selectively depositing a semiconductor material that is intrinsic or has a doping of a same conductivity type as the semiconductor material layer 10. Alternatively, portion 66 may be omitted or replaced by a trench in layer 10. A memory film layer is deposited in the memory openings over the alternating stack (32, 42) by a series of conformal deposition processes. The memory film layer can be a stack of contiguous material layers that overlie the entirety of the alternating stack (31, 42,). The memory film layer contacts all sidewall surface(s) and all bottom surface(s) of the memory openings. The memory film layer is a contiguous film stack that provides the functionality of charge storage in the absence of an external electrical bias voltage, while enabling charge transfer in the presence of a suitable external electrical bias voltage.

In one embodiment, the memory film layer can be a stack, in the order of formation, of a blocking dielectric layer, a charge storage layer, and a tunnel dielectric layer. In one embodiment, a plurality of floating gates or a charge storage dielectric can be located between the tunneling dielectric layer and the blocking dielectric layer.

The blocking dielectric layer contacts the sidewalls of the memory openings. Specifically, the blocking dielectric layer can contact the sidewalls of the sacrificial layers 42. The blocking dielectric layer may include one or more dielectric material layers that can function as the control gate dielectrics for control gate electrodes to be subsequently formed. The blocking dielectric layer can include silicon oxide, a dielectric metal oxide, a dielectric metal oxynitride, or a combination thereof. In one embodiment, the blocking dielectric layer can include a stack of at least one silicon oxide layer and at least one dielectric metal oxide layer. The blocking dielectric layer can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer can be in a range from 6 nm to 24 nm, although lesser and greater thicknesses can also be employed. Alternatively, the blocking dielectric layer may be omitted from the memory opening, and instead be formed through the backside contact trench in recesses formed by removal of the sacrificial layers 42 prior to forming the metal control gate electrodes through a backside contact trench.

The charge storage layer includes a dielectric charge trapping material, which can be, for example, silicon nitride, or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles. The charge storage layer can be formed, for example, by chemical vapor deposition (CVD), atomic layer deposition (ALD), physical vapor deposition (PVD), or any suitable deposition technique for the selected material(s) for the charge storage layer. The thickness of the charge storage layer can be in a range from 2 nm to 20 nm, although lesser and greater thicknesses can also be employed.

The tunnel dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunnel dielectric layer can be in a range from 2 nm to 20 nm, although lesser and greater thicknesses can also be employed.

Optionally, a permanent channel material layer (such as a polysilicon layer) and/or a sacrificial layer (such as a dielectric material layer) may be formed on the memory film layer. The memory film layer (and any additional layer such as a permanent channel material layer or a sacrificial layer) can be anisotropically etched so that horizontal portions of the memory film layer (and any additional layer) are removed from above the top surface of the alternating stack (32, 42) and at the bottom of each memory opening. Each remaining vertical portion of the memory film layer that remains within a memory opening after the anisotropic etch constitutes a memory film 50. Each memory film 50 can be homeomorphic to a torus. As used herein, an element is homeomorphic to a geometrical shape if the shape of the element can be mapped to the geometrical shape by continuous deformation without creation or destruction of any hole. If an electrode underlies the memory openings, a top surface of the electrode can be physically exposed within the cavity defined by the inner sidewalls of an overlying memory film 50.

In one embodiment, a first semiconductor channel layer can be deposited directly on the surfaces of the tunnel dielectric layer as a permanent channel material layer by a conformal deposition method such as chemical vapor deposition (CVD). The first semiconductor channel layer and the memory films can be anisotropically etched to form an opening at a bottom portion of each memory opening. A top surface of the substrate semiconductor layer 10 is physically exposed at the bottom of each memory opening. Each remaining portion of the first semiconductor channel layer within a memory opening constitutes a first semiconductor channel portion 601.

After formation of a memory film 50 and a first semiconductor channel portion 601 within each memory opening, a second semiconductor channel layer can be deposited on the sidewalls of the first semiconductor channel portions 601, physically exposed surfaces of the substrate semiconductor layer 10 within the memory openings, and over the alternating stack (32, 42). The semiconductor material of the second semiconductor channel layer can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature.

Optionally, a dielectric core 62 can be formed within a cavity inside each semiconductor channel 60, for example, by deposition of a dielectric material such as silicon oxide, and subsequent planarization of the dielectric material. The planarization of the dielectric material removes the portion of the deposited dielectric material from above the top surface of the horizontal plane including the top surface of the topmost layer of the alternating stack (32, 42), which can be, for example, the top surface of the topmost insulator layer 32. The planarization of the dielectric material can be performed, for example, by chemical mechanical planarization. Each remaining portion of the dielectric material inside a memory opening constitutes a dielectric core 62. The dielectric core 62 is an optional component, and a combination of a memory film 50 and a semiconductor channel 60 may completely fill a memory opening The horizontal portion of the second semiconductor channel layer above the top surface of the topmost layer of the alternating stack (32, 42) can be removed, for example, by a recess etch. Each remaining portion of the second semiconductor channel layer constitutes a second semiconductor channel 602. Each adjoined pair of a first semiconductor channel 601 and a second semiconductor channel 602 vertically extend through the alternating stack (32, 42), and optional pillar collectively constitutes a portion of a semiconductor channel 60 for a memory stack structure 55. A set of a memory film 50 and a semiconductor channel 60 within a same memory opening constitutes a memory stack structure 55.

Drain regions 63 can be formed by recessing a top portion of each dielectric core and depositing a doped semiconductor material. The doped semiconductor material can be, for example, doped polysilicon. The drain regions 63 can have a doping of a second conductivity type, which is the opposite of the first conductivity type (that is the conductivity type of the semiconductor material layer 10). Excess portions of the deposited semiconductor material can be removed from above the top surface of the alternating stack (32, 42), for example, by chemical mechanical planarization (CMP) or a recess etch.

Optionally, an insulating cap layer 71 can be formed over the alternating stack (32, 42) and the array of memory stack structures 55. The insulating cap layer 71 can include a dielectric material such as silicon oxide, a dielectric metal oxide, and/or a nitrogen-doped organosilicate glass. The thickness of the insulating cap layer 71 can be in a range from 5 nm to 100 nm, although lesser and greater thicknesses can also be employed.

Figure 3:
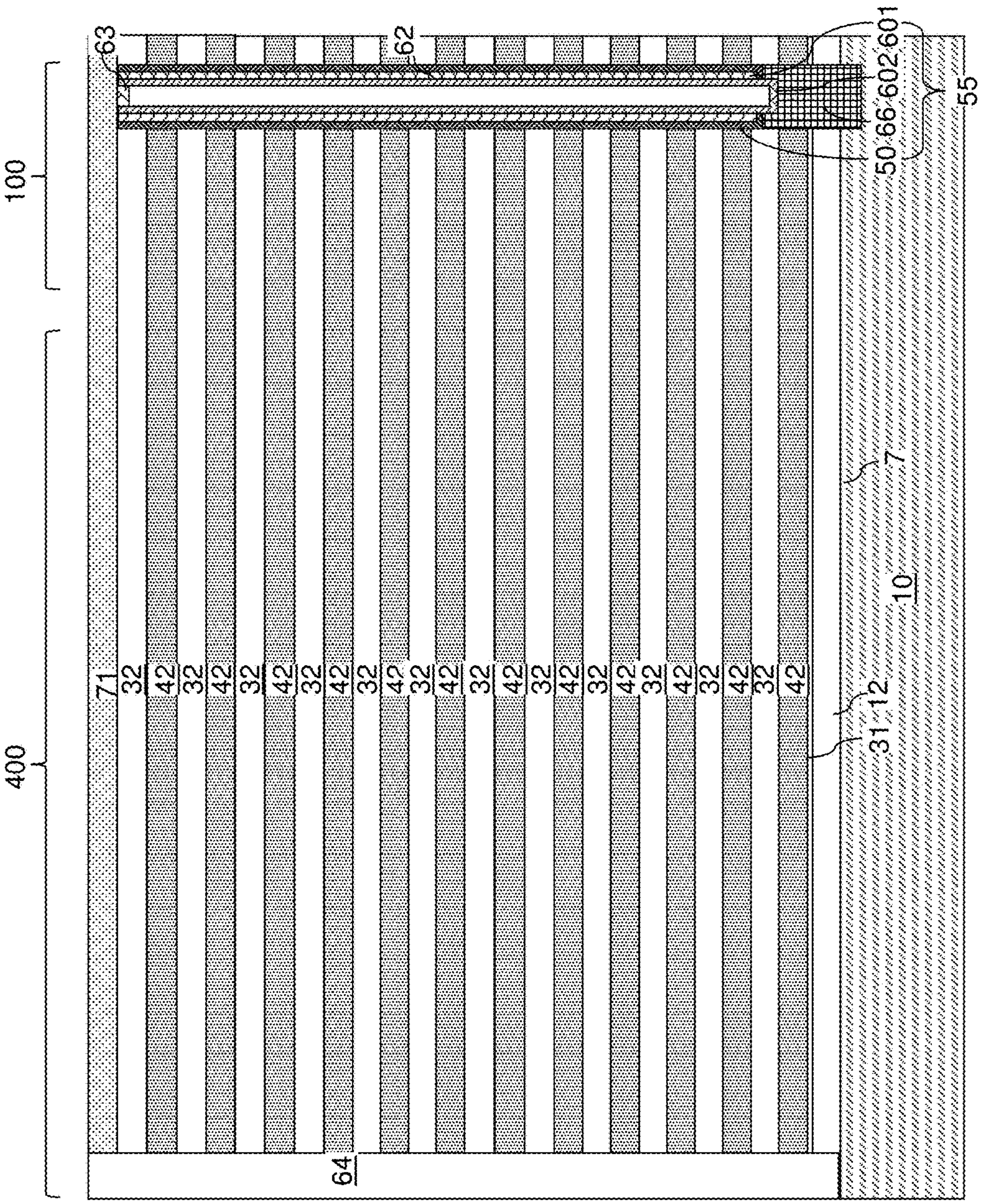
FIG. 3 is a vertical cross-sectional view of the first exemplary structure after formation of an optional dielectric material portion according to the first embodiment of the present disclosure.

Referring to FIG. 3, a portion of the alternating stack (32, 42) can be removed, for example, by applying and patterning a photoresist layer (not shown), and by transferring the pattern of the photoresist layer through the alternating stack (32, 42) employing an etch such as an anisotropic etch. A trench extending through the entire thickness of the alternating stack (32, 42) can be formed. Subsequently, the trench can be filled with an optional dielectric material such as silicon oxide to form a dielectric material portion 64. Excess portions of the dielectric material can be removed from above the top surface of the insulating cap layer 71 by a planarization process such as chemical mechanical planarization and/or a recess etch. The top surfaces of the insulating cap layer 71 can be employed as a stopping surface during the planarization. A top surface of the dielectric material portion 64 can be coplanar with a top surface of the insulating cap layer 71.

Figure 4:
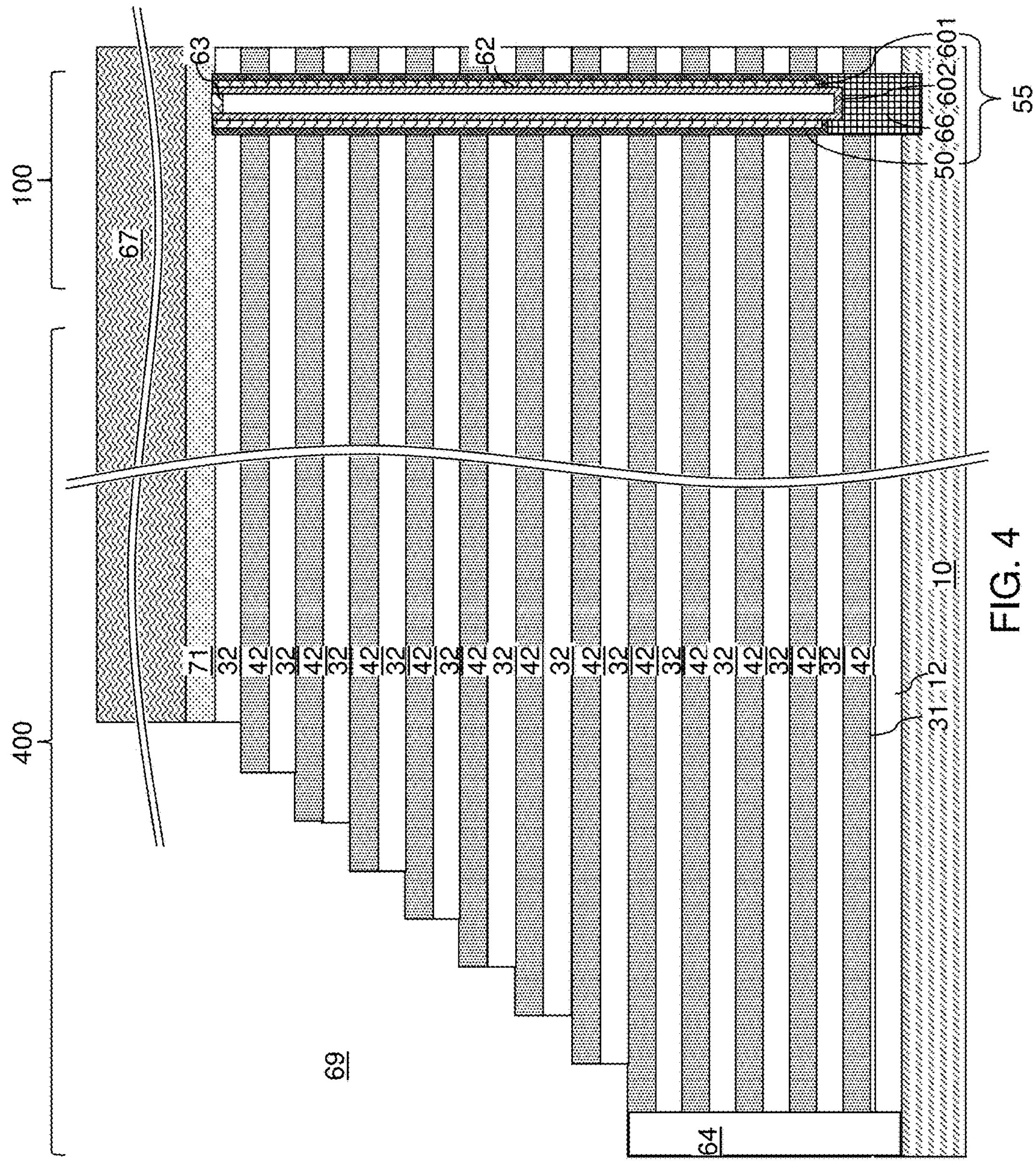
FIG. 4 is a vertical cross-sectional view of the first exemplary structure during formation of stepped surfaces according to the first embodiment of the present disclosure.

Referring to FIG. 4, a trimming material layer 67 is formed and patterned over the insulating cap layer 71. The trimming material layer 67 comprises a material that can be continually trimmed, i.e., a material that can be gradually removed over a time duration from outside to inside at a controlled removal rate. For example, the trimming material layer 67 can be selected from a photoresist material, an organic polymer material, and an inorganic polymer material. Organic polymer materials that can be employed for the trimming material layer 67 can be an organic material made of cross-linked carbon-containing monomers, and can be carbon-based self-planarizing material known in the art. Inorganic polymer material that can be employed for the trimming material layer 67 include silicon-based polymer materials such as silicon-based antireflective coating materials as known in the art. A portion of the trimming material layer 67 remains after repeated trimming that shifts an outer sidewall of the trimming material layer 67 to a periphery of the capacitor region 400 adjoining the memory device region 100.

Portions of the insulating cap layer 71 and a topmost insulator layer 32 within the area of an opening in the trimming material layer 67 can be removed by an anisotropic etch. The last step of the anisotropic etch can be selective to the material of the sacrificial material layer 42 to minimize an overetch into the topmost sacrificial material layer 42. A recess cavity is formed at the levels of the insulating cap layer 71 and the topmost insulator layer 32 within the area of the opening in the trimming material layer 67.

Subsequently, a set of process steps is repeatedly performed to form stepped surfaces in the capacitor region 400. Each set of processing steps can include a first processing step of trimming the trimming material layer 67 to widen the opening in the trimming material layer 67, a second processing step of anisotropically etching the material of the sacrificial material layers 42 (with or without collateral etching of the material of the insulating cap layer 71) within the opening in the trimming material layer 67, a third step of anisotropically etching any remaining portion of the insulating cap layer 71 and the material of the insulator layers 32 within the opening in the trimming material layer 67. In one embodiment, an anisotropic etch process employed in the second processing step can be selective to the material of the insulator layers 32, and the anisotropic etch employed in the third processing step can be selective to the material of the sacrificial material layers 42.

Figure 5A:
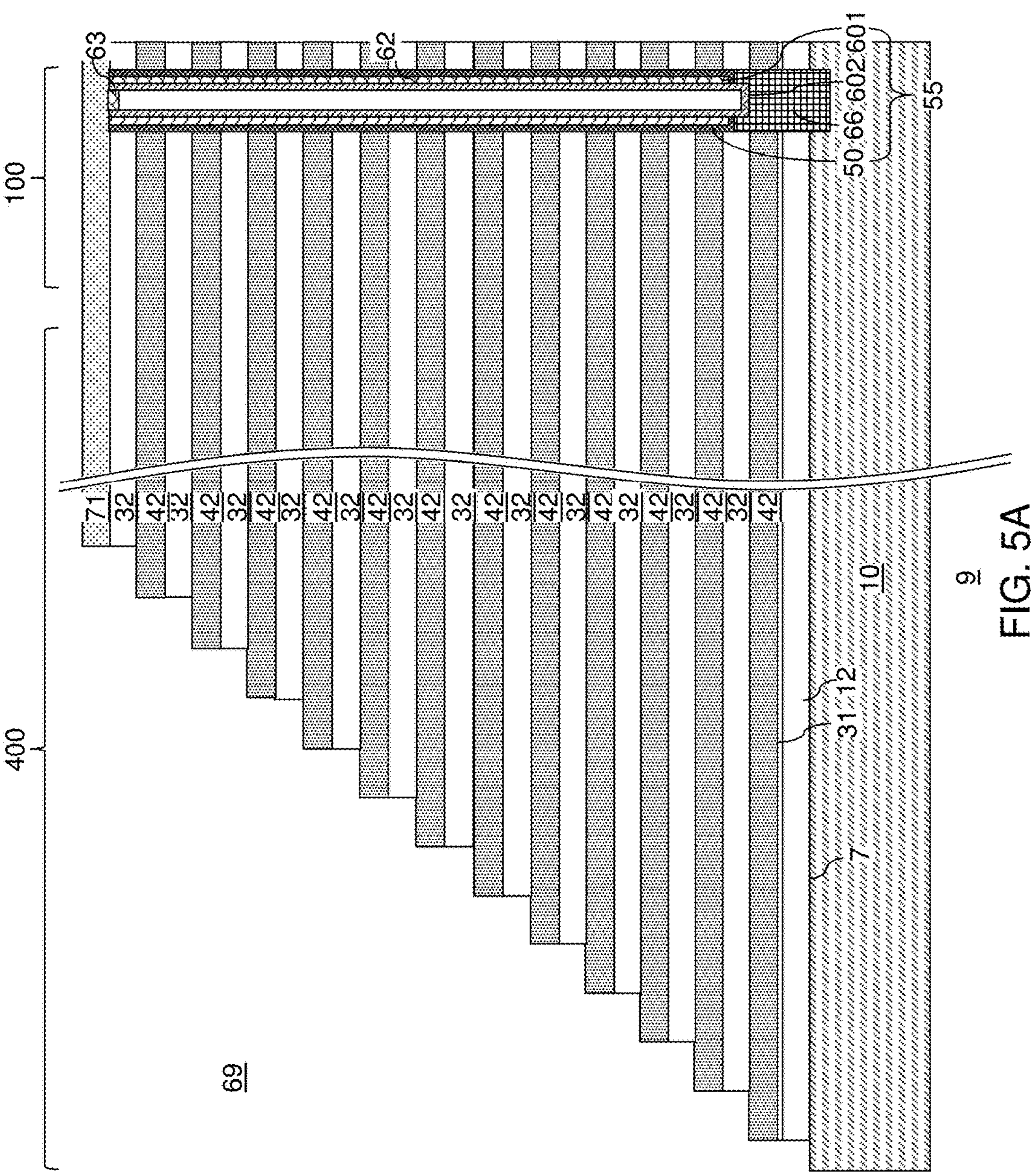
FIG. 5A is a vertical cross-sectional view of the first exemplary structure after formation of stepped surfaces according to the first embodiment of the present disclosure.
Figure 5B:
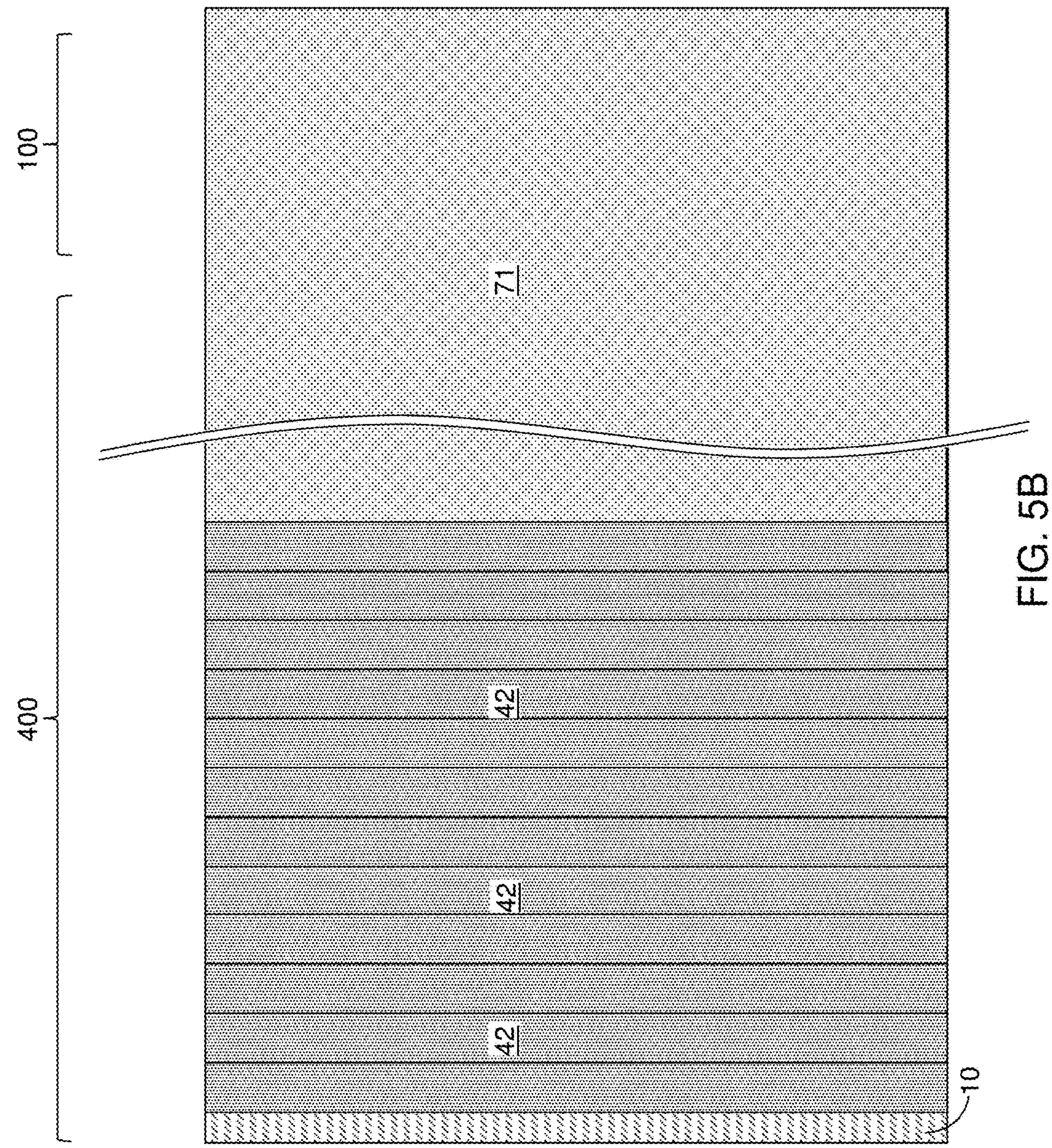
FIG. 5B is a top-down view of the first exemplary structure of FIG. 5A.

Referring to FIGS. 5A and 5B, the set of processing steps is repeated performed until the bottommost sacrificial material layer 42 is patterned. Optionally, the dielectric cap layer 31 and the dielectric pad layer 12 may be patterned with the same pattern as the bottommost sacrificial material layer 42.

The trimming material layer 67 can be subsequently removed, for example, by ashing.

A stepped surface region is formed in the capacitor region 400. As used herein, a "stepped surface region" refers to a region in which stepped surfaces are present. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface.

The cavity overlying the steppes surfaces is a stepped cavity. As used herein, a "stepped cavity" refers to a cavity having stepped surfaces. The stepped cavity 69 can straddle a remaining portion of the dielectric material portion 64 (not shown) and a remaining patterned portion of the alternating stack (32, 42). Within the stepped surface region, each underlying second material layer (such as a sacrificial material layer 42) laterally extends farther than any overlying second material layer, and each underlying first material layer (such as an insulator layer 32) laterally extends farther than any overlying first material layer. A vertically adjoining pair of a first material layer (such as an insulator layer 32) and a second material layer (such as a sacrificial material layer 42) can have vertically coincident sidewalls. As used herein, a first surface and a second surface are vertically coincident with each other if there exists a vertical plane including both the first surface and the second surface.

Figure 6A:
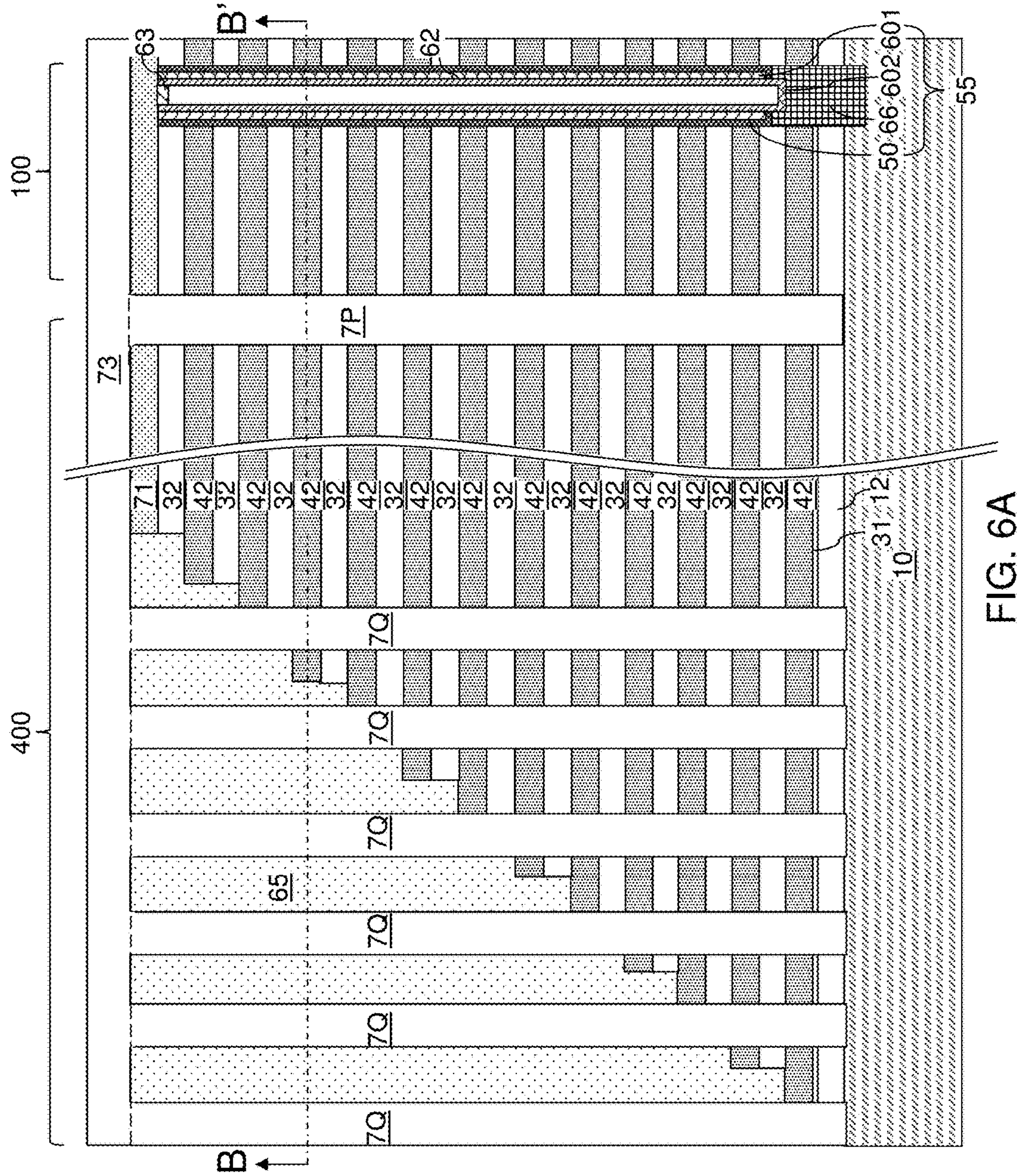
FIG. 6A is a vertical cross-sectional view of the first exemplary structure after formation of a retro-stepped dielectric material portion and dielectric pillar structures according to the first embodiment of the present disclosure.
Figure 6B:
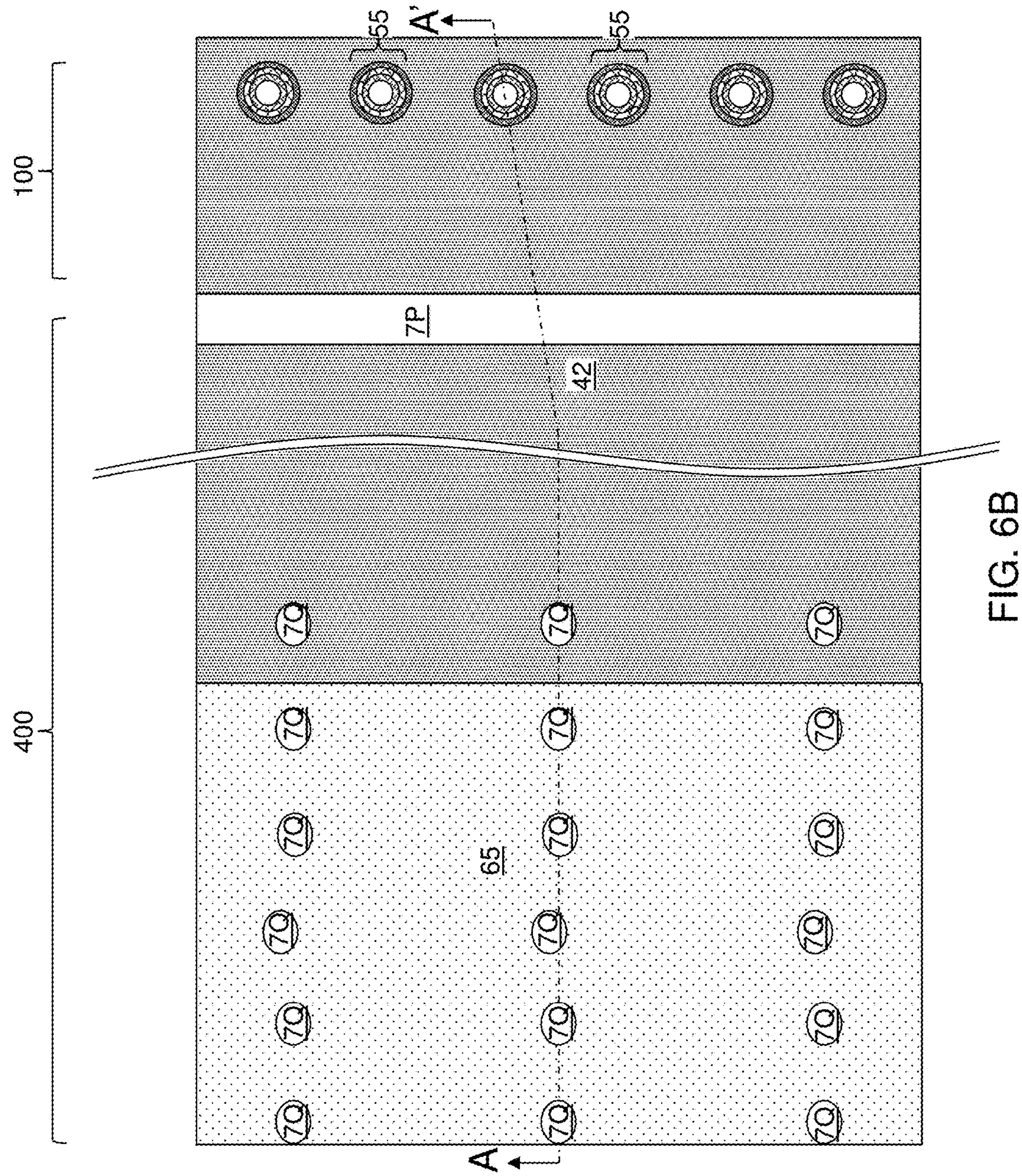
FIG. 6B is a horizontal cross-sectional view of the first exemplary structure of FIG. 6A along the horizontal plane B-B'.
Figure 7A:
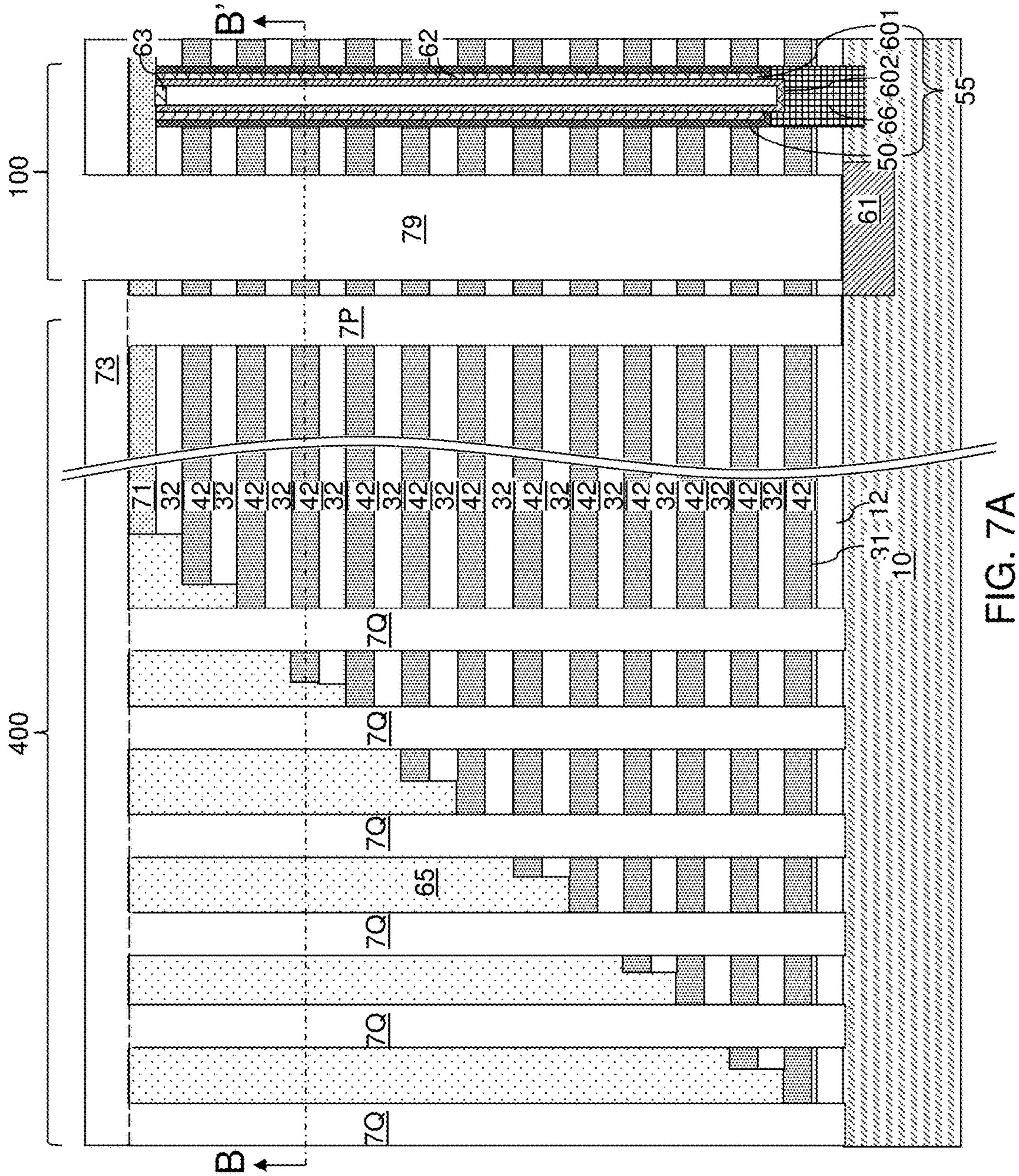
FIG. 7A is a vertical cross-sectional view of the first exemplary structure after formation of a backside contact trench according to the first embodiment of the present disclosure.
Figure 7B:
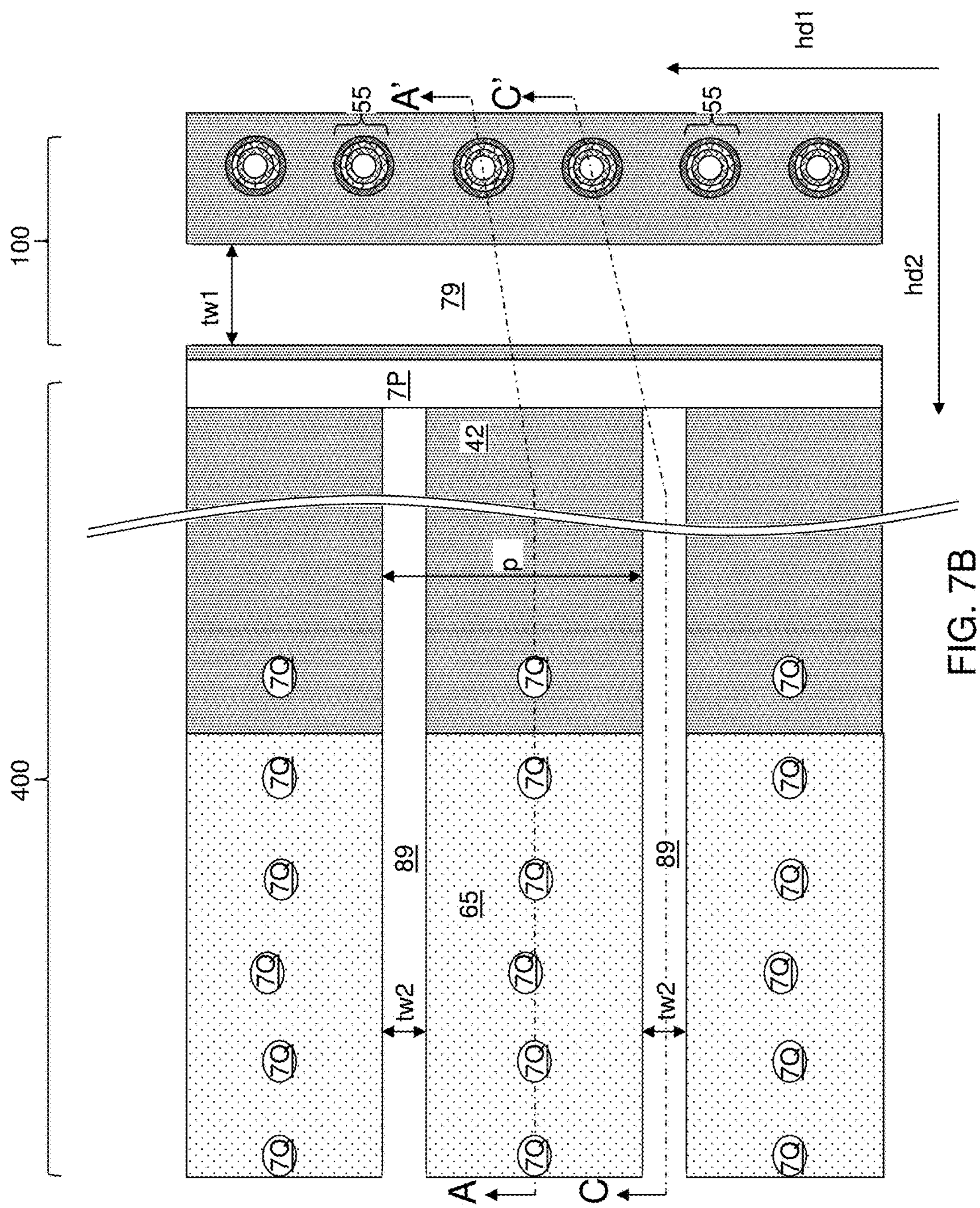
FIG. 7B is a horizontal cross-sectional view of the first exemplary structure of FIG. 7A along the plane B-B'. The vertical plane A-A' is the plane of vertical cross-sectional view of FIG. 7A.
Figure 7C:
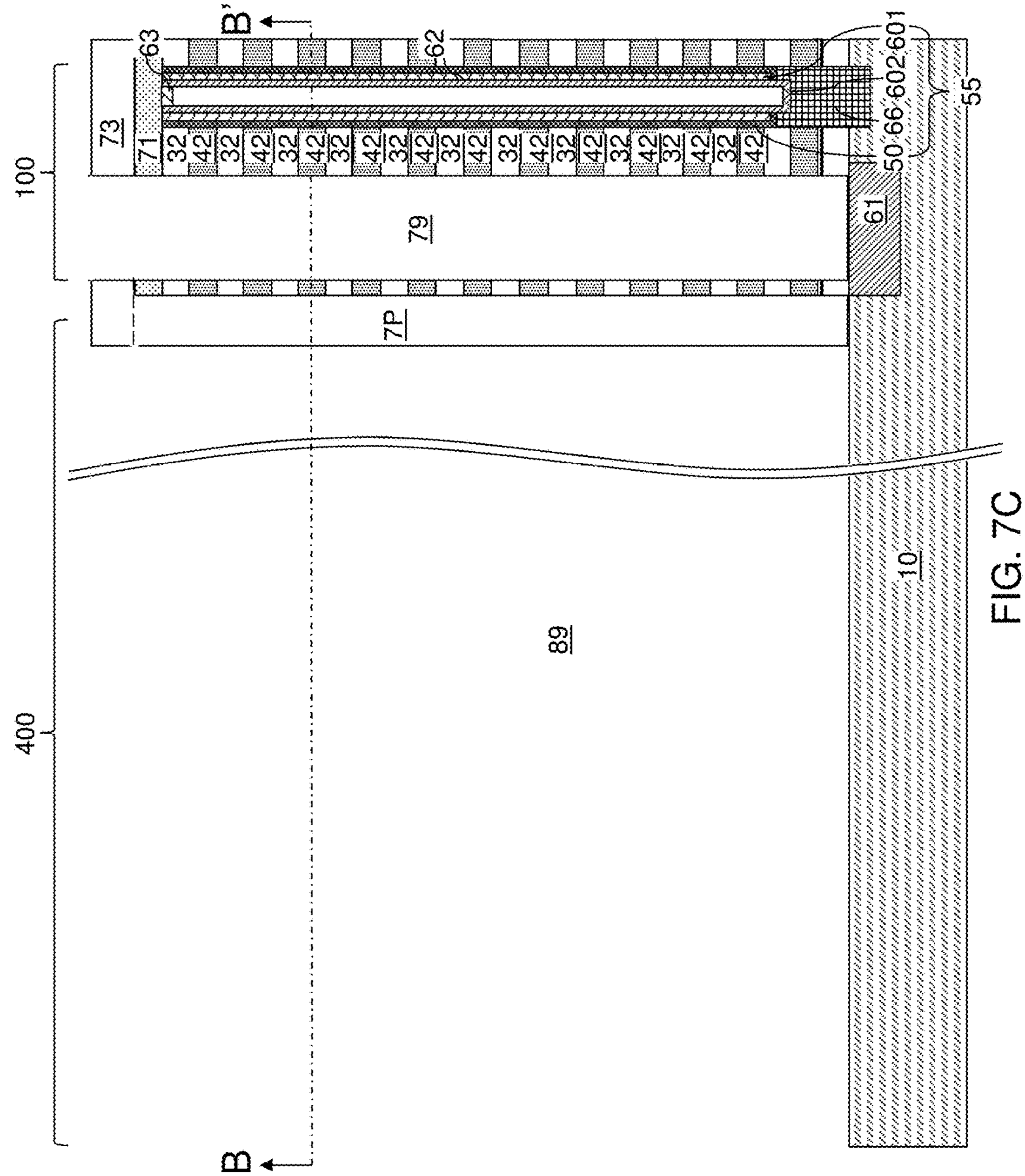
FIG. 7C is a vertical cross-sectional view of the first exemplary structure of FIG. 8B along the vertical plane C-C'.
Figure 7D:
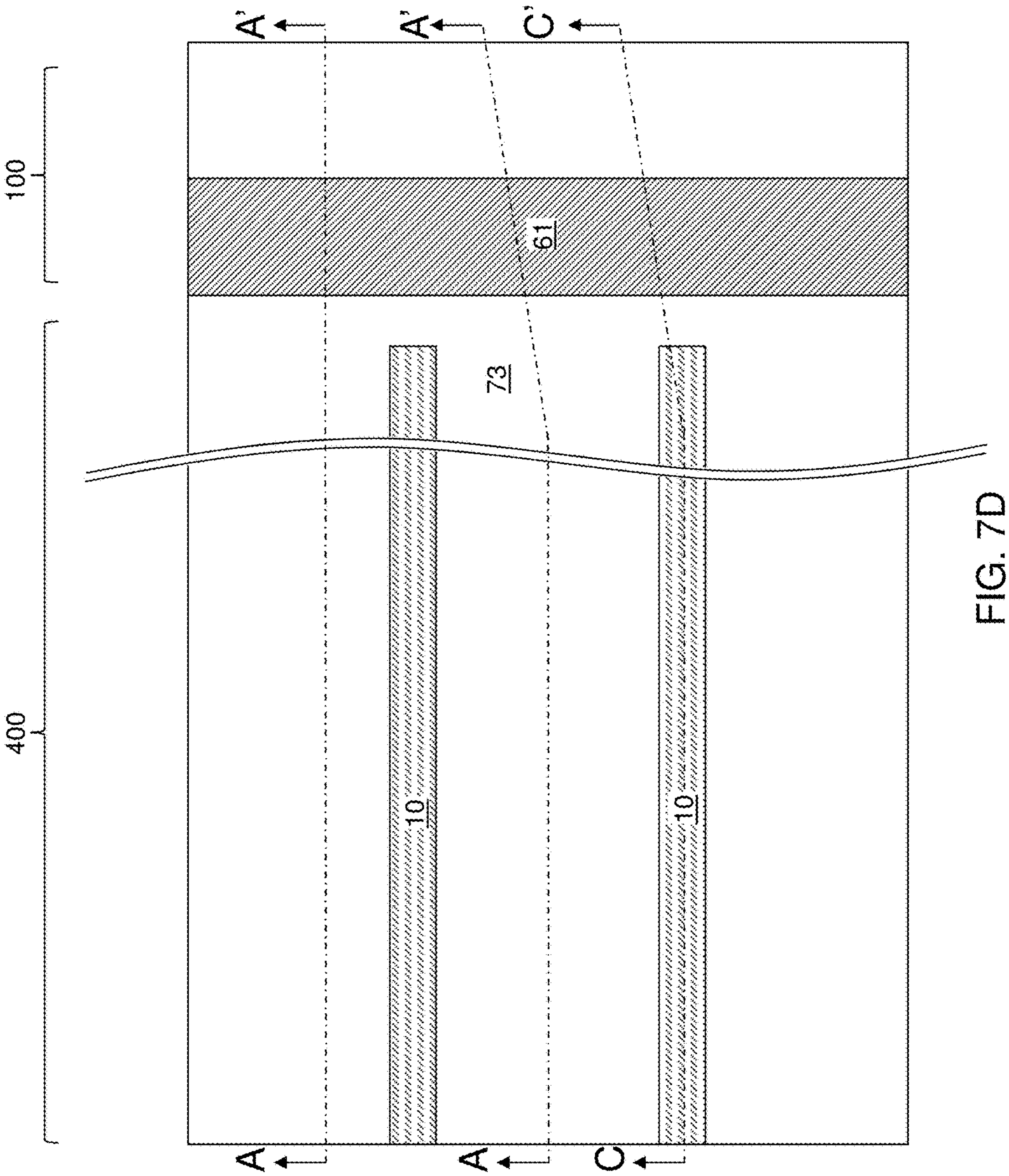
FIG. 7D is a top-down view of the first exemplary structure of FIGS. 7A-7C.

Referring to FIGS. 6A and 6B, a dielectric material portion (i.e., insulating fill material portion) can be formed in the stepped cavity 69 by deposition of a dielectric material such as silicon oxide. Excess portions of the deposited dielectric material can be removed from above the top surface of the insulating cap layer 71, for example, by chemical mechanical planarization (CMP). The remaining portion of the deposited dielectric material filling the stepped cavity 69 constitutes the dielectric material portion.

The dielectric material portion is retro-stepped, and is herein referred to as a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. The retro-stepped dielectric material portion 65 is formed over the stepped structure of the alternating stack (32, 42), and can have a planar top surface. If silicon oxide is employed for the retro-stepped dielectric material portion 65, the silicon oxide of the retro-stepped dielectric material portion 65 may, or may not, be doped with dopants such as B, P, and/or F. The horizontal cross-sectional area of the retro-stepped dielectric material portion 65 at a horizontal plane is not less than the horizontal cross-sectional area of the retro-stepped dielectric material portion 65 at any horizontal plane that is more proximal to the substrate (i.e., the semiconductor material layer 10).

At least one dielectric pillar structure 7P may be optionally formed through the retro-stepped dielectric material portion 65 and/or through the alternating stack (32, 42). Further, dielectric support pillar structures 7Q may be formed in the contact region, which provide support for the insulator layers 32 in subsequent processing steps, and especially, during replacement of sacrificial material layers with conductive material layers. The at least one dielectric pillar structure 7P and the dielectric support pillar structures 7Q can be formed, for example, by forming openings extending through the retro-stepped dielectric material portion 65 and/or through the alternating stack (32, 42) and at least to the top surface of the substrate 10, and by filling the openings with a dielectric fill material that is resistant to the etch chemistry to be employed to remove the sacrificial material layers 42. In one embodiment, the at least one dielectric pillar structure can include silicon oxide and/or a dielectric metal oxide such as aluminum oxide. In one embodiment, the portion of the dielectric material that is deposited over the insulating cap layer 71 concurrently with deposition of the at least one dielectric pillar structure 7P and the dielectric support pillar structures 7Q can be present over insulating cap layer 71 as a dielectric material layer 73. The dielectric material layer 73 and the at least one dielectric pillar structure 7P and the dielectric support pillar structures 7Q can be formed as a single contiguous structure of integral construction, i.e., without any material interface therebetween. In another embodiment, the portion of the dielectric material that is deposited over insulating cap layer 71 concurrently with deposition of the at least one dielectric pillar structure 7P and the dielectric support pillar structures 7Q can be removed, for example, by chemical mechanical planarization or a recess etch. In this case, the dielectric material layer 73 is not present, and the top surface of insulating cap layer 71 can be physically exposed.

In this embodiment, the shape of the at least one dielectric pillar structure 7P can be such that the at least one dielectric pillar structure 7P physically isolates a first portion of the alternating stack (32, 42) located within the memory device region 100 from a second portion of the alternating stack (32, 42) located within the capacitor region 400. In one embodiment, a dielectric pillar structure 7P can be formed at a boundary between the memory device region 100 and the capacitor region 400. However, other pillar 7P shapes, such as cylindrical pillar shapes may be used as described below with respect to FIG. 14A of the alternative embodiment. The dielectric support pillar structures 7Q can be formed as an array of discrete dielectric support pillar structures so as to provide mechanical support to the structures in the contact region during subsequent processing steps.

FIGS. 7A-7D, a photoresist layer (not shown) can be applied over the alternating stack (32, 42) and the retro-stepped dielectric material portion 65 and the optional dielectric material layer 73, and lithographically patterned to form openings therein. The pattern of the openings includes an opening in the memory device region 100 and a plurality of openings in the capacitor region 400. The pattern of the opening in the memory device region 100 is selected such that a lateral distance from the opening in the memory device region 100 to a group of memory stack structures 55 does not exceed a predefined distance, which is the distance of a lateral etch to be subsequently employed to form lateral recesses. The pattern of the openings in the capacitor region 400 is selected such that trenches to be subsequently formed within the area of the openings within the capacitor region 400 can divide the second portion of the alternating stack (32, 42) located within the capacitor region 400 into a plurality of physically disjoined alternating stacks (32, 42).

An anisotropic etch can be performed to etch through portions of the optional dielectric material layer 73, the optional insulating cap layer 71, the retro-stepped dielectric material portion 65, and the alternating stack (32, 42) that underlie the openings within the photoresist layer. A backside contact trench 79 is formed directly underneath the opening in the photoresist layer within the memory device region 100. A lateral separation trench 89 is formed directly underneath each opening in the photoresist layer within the capacitor region 400. The backside contact trench 79 and the lateral separation trenches 89 can extend from the top surface of the dielectric material layer 73 (or the material layer contacting the bottom surface of the photoresist layer in case a dielectric material layer 73 is not employed) at least to the top surface of the semiconductor material layer 10 in the substrate. The lateral separation trenches 89 divides the second portion of the alternating stack (32, 42) in the capacitor region 400 into a plurality of physically disjoined alternating stacks (32, 42) that are laterally spaced apart by the lateral separation trenches 89.

Each of the backside contact trench 79 and the lateral separation trenches 89 can be a line trench, i.e., a trench having a uniform width and extending along a lengthwise direction. The sidewalls of the backside contact trench 79 and the lateral separation trenches 89 may be vertical, or may be tapered. In one embodiment, the backside contact trench 79 may have a first trench width tw1, and the lateral separation trenches 89 may have a second trench width tw2 that is less than the first trench width tw1. In one embodiment, the first trench width tw1 can be in a range from 30 nm to 1,000 nm, and the second trench width w2 can be in a range from 20 nm to 500 nm, although lesser and greater trench widths can be employed for each of the backside contact trench 79 and the lateral separation trenches 89.

In one embodiment, a dielectric pillar structure 7P can extend along a first horizontal direction hd1, and the backside contact trench 79 can extend along the first horizontal direction hd1. The lateral separation trenches 89 can adjoin the dielectric pillar structure 7P such that a sidewall of each lateral separation trench 89 is a sidewall of the dielectric pillar structure 7P. The lateral separation trenches 89 can extend along a horizontal direction that is different from the first horizontal direction hd1, which is herein referred to as a second horizontal direction hd2. In one embodiment, the second horizontal direction hd2 can be perpendicular to the first horizontal direction hd1. In one embodiment, the lateral separation trenches 89 can laterally extend along a lateral direction that is perpendicular to the stepped surfaces within the stepped surface region. As used herein, a lateral direction that is perpendicular to the stepped surfaces refers to the lateral direction that is perpendicular to vertical surfaces within the stepped surfaces. In other words, the second horizontal direction hd2 can be perpendicular to the vertical surfaces (i.e., the sidewalls of the insulator layers 32 and the sacrificial material layers 42) of the stepped surfaces.

Each lateral separation trench 89 extends through the stack of alternating layers (32, 42) as embodied in multiple physically disjoined portions. Sidewalls of patterned portions of the stack of alternating layers (32, 42) are physically exposed within each lateral separation trench 89. The photoresist layer can be removed, for example, by ashing.

Figure 8A:
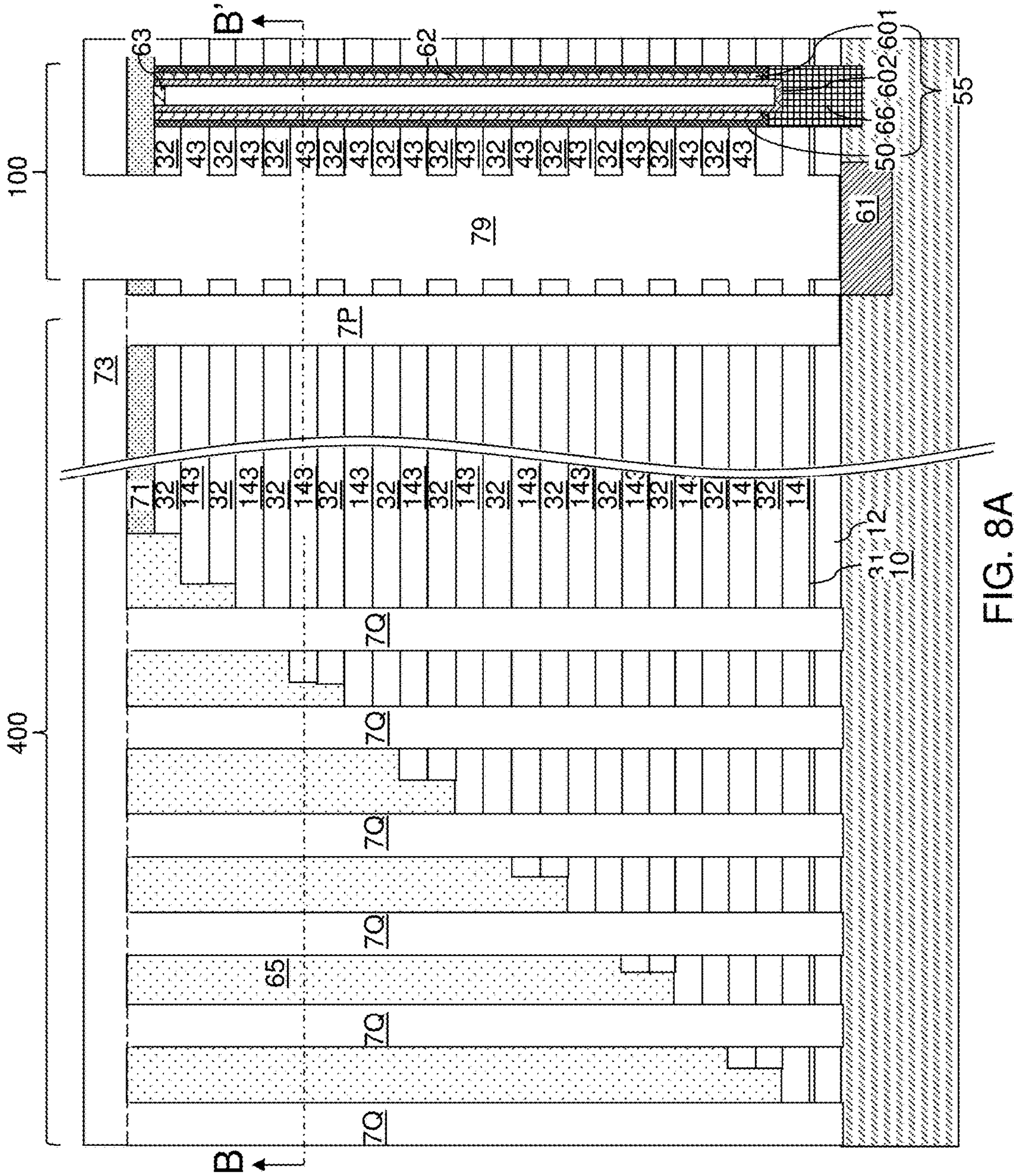
FIG. 8A is a vertical cross-sectional view of the first exemplary structure after formation of lateral recesses according to the first embodiment of the present disclosure.
Figure 8B:
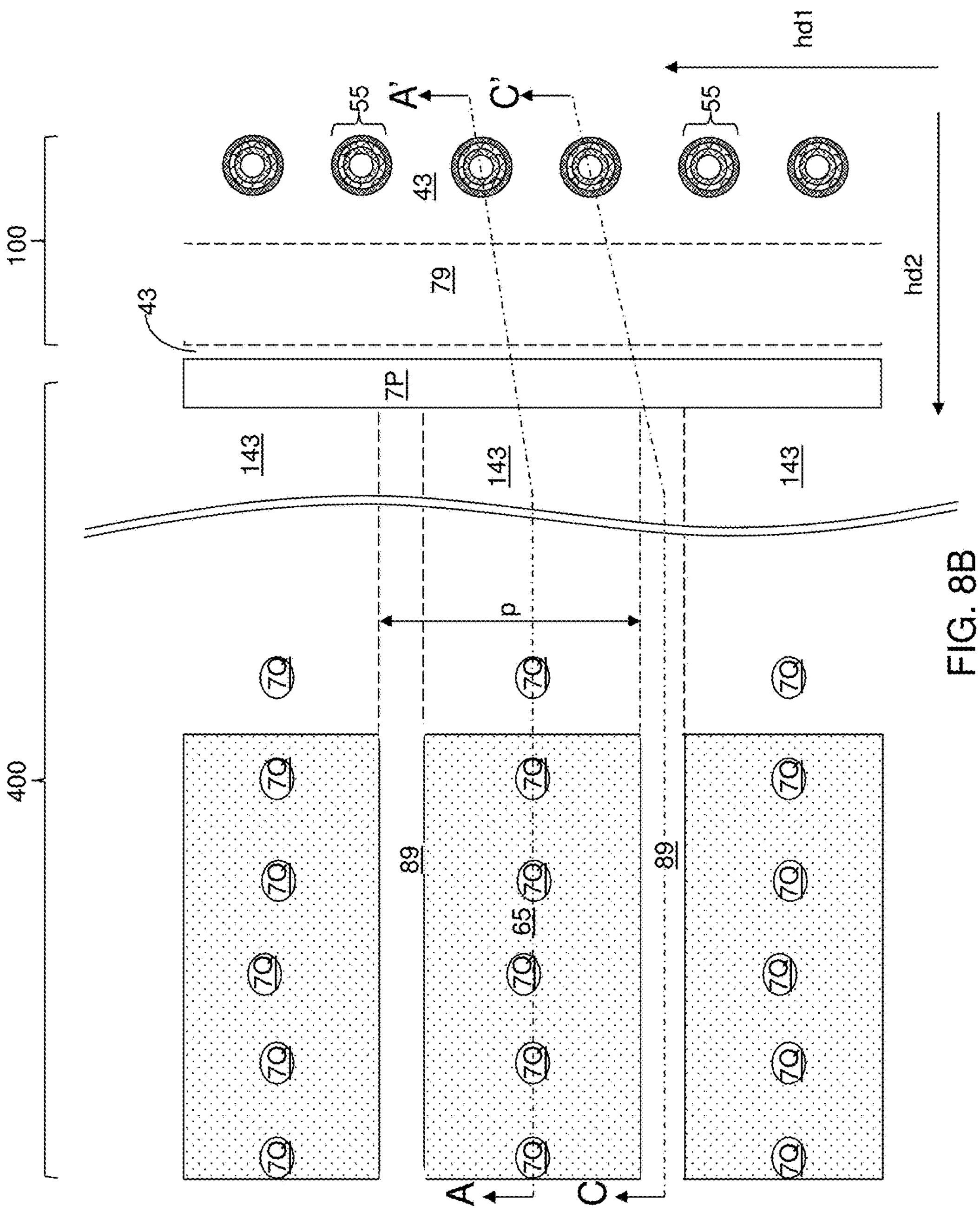
FIG. 8B is a horizontal cross-sectional view of the first exemplary structure of FIG. 8A along the plane B-B'. The vertical plane A-A' is the plane of vertical cross-sectional view of FIG. 8A.
Figure 8C:
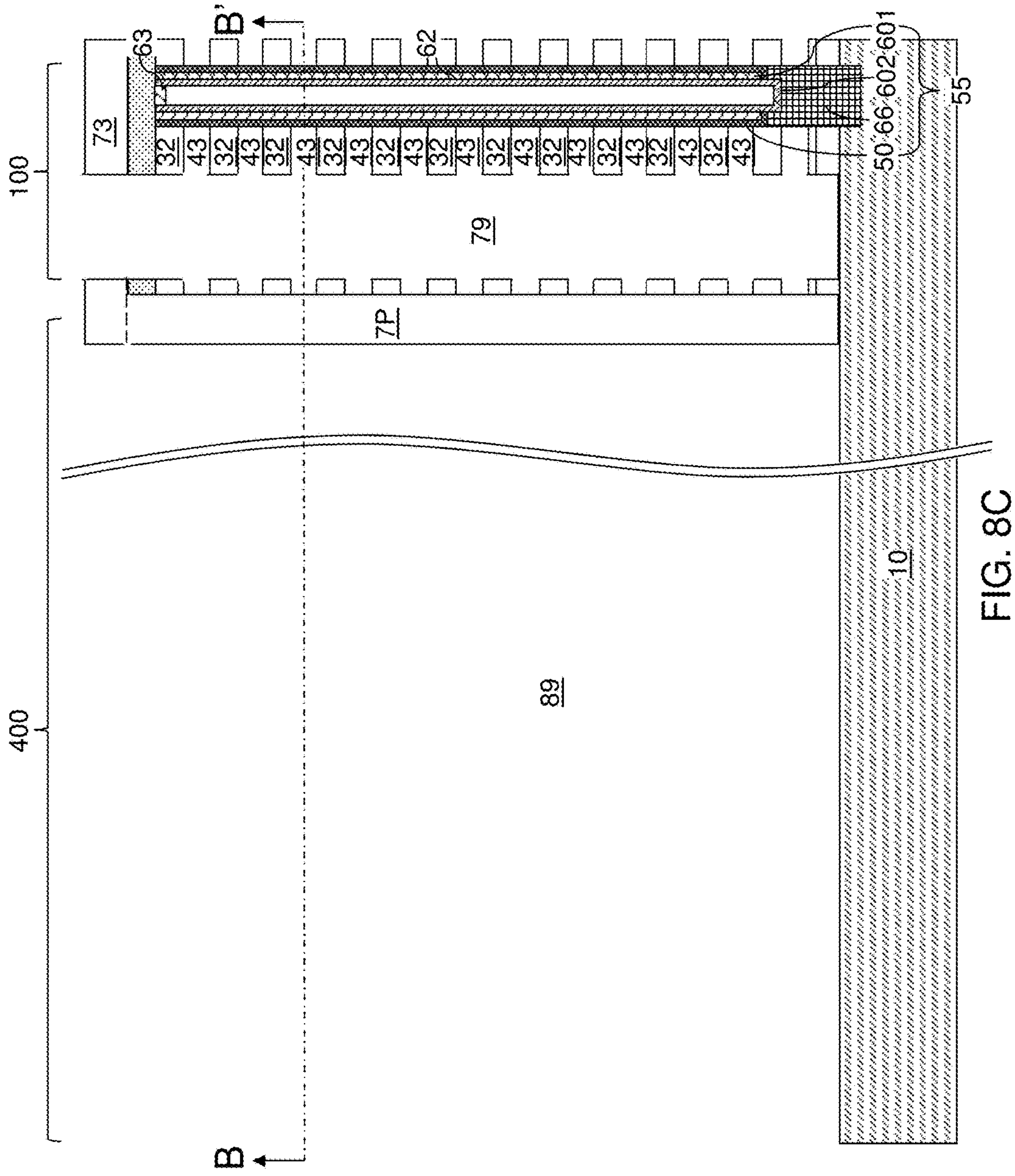
FIG. 8C is a vertical cross-sectional view of the first exemplary structure of FIG. 7B along the vertical plane C-C'.

Referring to FIGS. 8A-8C, an etchant that selectively etches the second material of the sacrificial material layers 42 with respect to the first material of the insulator layers 32 can be introduced into the backside contact trench 79 and the lateral separation trenches 89, for example, employing an isotropic etch process. Backside recesses (43, 143) are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the backside contact trench 79 can be modified so that the bottommost surface of the backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses (43, 143) are present within volumes previously occupied by the sacrificial material layers 42.

Each backside recess (43, 143) can be a laterally-extending cavity having a lateral dimension that is greater than the vertical extent of the cavity. In other words, the lateral dimension of each backside recess (43, 143) can be greater than the height of the backside recess (43, 143). A plurality of backside recesses (43, 143) can be formed in the volumes from which the second material of the sacrificial material layers 42 is removed. The plurality of backside recesses (43, 143) include first backside recesses 43 that are formed within the memory device region 100 by introduction of the etchant through the backside contact trench 79, and second backside recesses that are formed within the capacitor region 400 by introduction of the etchant through the lateral separation trenches 89.

Each of the plurality of first backside recesses (43, 143) can extend substantially parallel to the top surface of the substrate 10. A backside recess (43, 143) can be vertically bounded by a top surface of an underlying insulator layer 32 and a bottom surface of an overlying insulator layer 32. In one embodiment, each backside recess (43, 143) can have a uniform height throughout.

The memory openings in which the memory stack structures 55 are formed are herein referred to as front side recesses or front side cavities in contrast with the first backside recesses 43. In one embodiment, the memory device region 100 comprises an array of monolithic three-dimensional NAND strings having a plurality of device levels disposed above the substrate 10. In this case, each first backside recess 43 can define a space for receiving a respective word line of the array of monolithic three-dimensional NAND strings.

The second lateral recesses 143 can be formed at each level of the sacrificial material layers 42 in the capacitor region 400. Each second lateral recess 143 can be adjoined to at least one of the lateral separation trenches 89. At least one set of second lateral recesses 143 can be laterally adjoined to a neighboring pair of lateral separation trenches 89. Thus, a stacked cavity structure is formed between each neighboring pair of lateral separation trenches 89 such that a set of second backside recesses 143 is interlaced with a set of insulator layers 32. In one embodiment, the lateral separation trenches 89 can be formed with a periodicity p. The lateral distance between neighboring pairs of the lateral separation trenches 89 can be uniform. In this case, the second backside recesses 143 within a stacked cavity structure (143, 32) between a neighboring pair of lateral separation trenches 89 can have the same lateral extent along the first horizontal direction hd1, and can have different lateral extents along the second horizontal direction hd2.

Physically exposed surface portions of epitaxial channel portions 66 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 66 into a dielectric spacer 116, and to convert a surface portion of the semiconductor material layer 10 underneath each backside contact trench 79 and trenches 89 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus.

The dielectric spacers 116 include a dielectric material that includes the same semiconductor element as the epitaxial channel portions 66 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 66. Likewise, each sacrificial dielectric portion 616 includes a dielectric material that includes the same semiconductor element as the semiconductor material layer 10 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the semiconductor material layer 10.

Figure 9A:
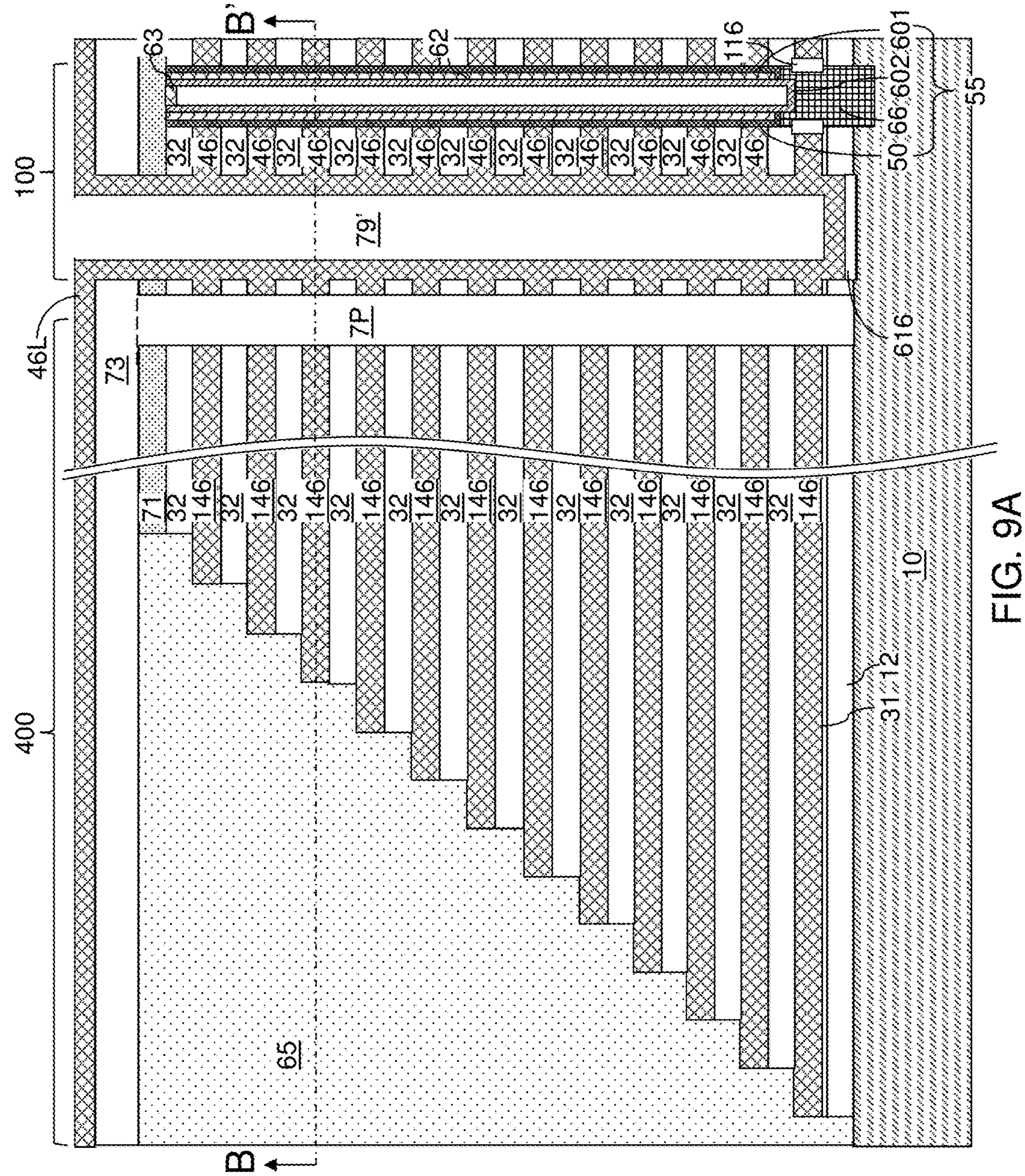
FIG. 9A is a vertical cross-sectional view of the first exemplary structure after formation of electrically conductive layers according to the first embodiment of the present disclosure.
Figure 9B:
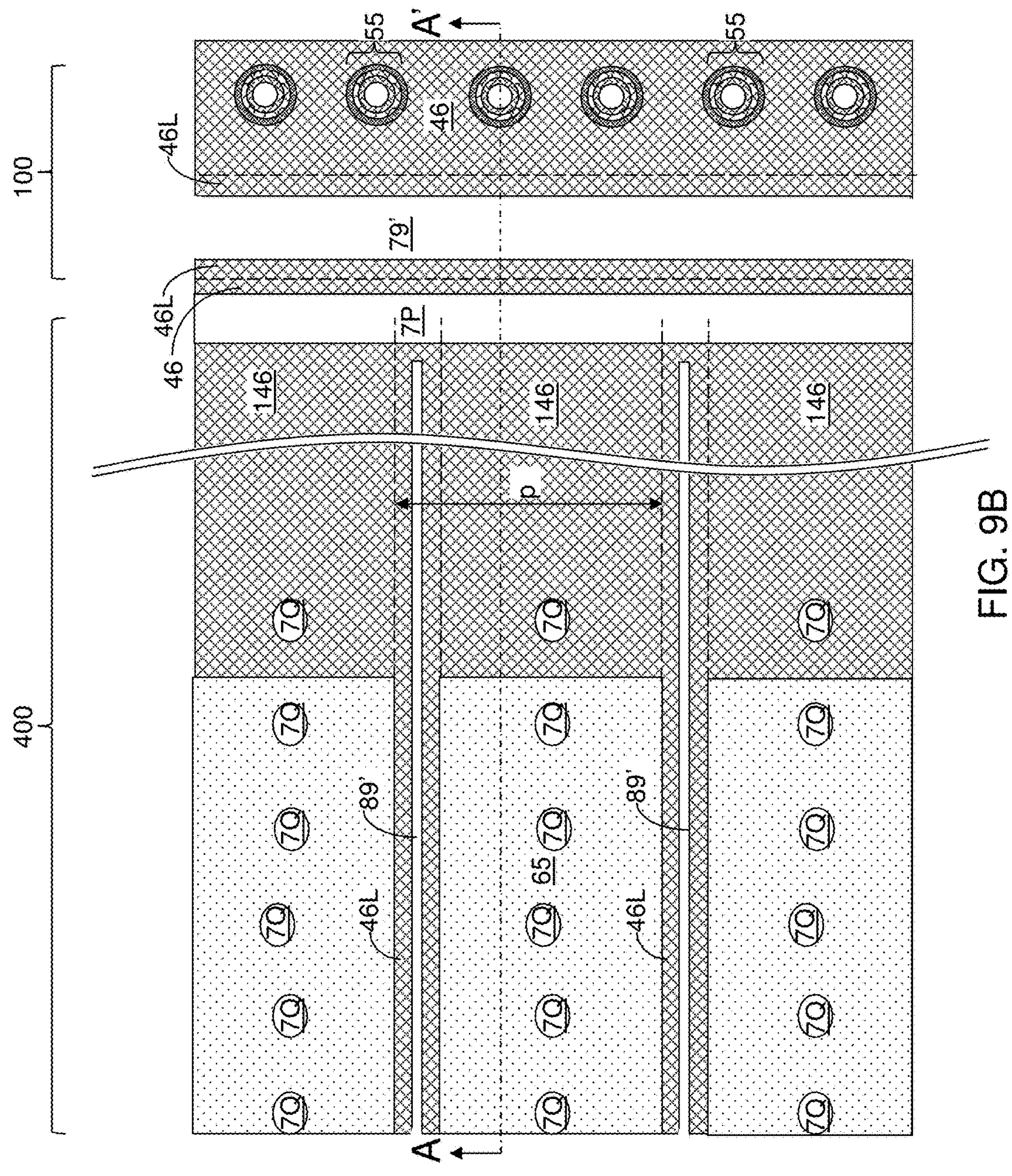
FIG. 9B is a horizontal cross-sectional view of the first exemplary structure of FIG. 9A along the plane B-B'. The vertical plane A-A' is the plane of vertical cross-sectional view of FIG. 9A.

Referring to FIGS. 9A and 9B, a backside blocking dielectric layer (not shown) including a dielectric material (such as aluminum oxide) can be formed in the backside recesses (43, 143) by a conformal deposition. At least one conductive material can be deposited in the plurality of backside recesses (43, 143), on the sidewalls of the backside contact trench 79 and trenches 89, and over the topmost layer of the first exemplary structure. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses (43, 143) include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses (43, 143) can be a combination of titanium nitride and tungsten. In one embodiment, the conductive material can be deposited by chemical vapor deposition. The second material layers 42 are replaced with conductive material portions.

A plurality of first electrically conductive layers 46 can be formed in the plurality of first backside recesses 43 in the memory device region. A plurality of second electrically conductive layers 146 can be formed in the plurality of second backside recesses 143. A contiguous conductive material layer 46L can be formed on the sidewalls of the backside contact trench 79 and over the topmost layer of the first exemplary structure. Thus, each sacrificial material layer 42 can be replaced with a first electrically conductive layer 46 in the memory device region 100 and a second electrically conductive layer 146 in the capacitor region 400. A backside cavity 79' is present in the portion of each backside contact trench 79 that is not filled with the contiguous conductive material layer 46L. A lateral separation cavity 89' is present in the portion of each lateral separation trench 89 that is not filled with the contiguous conductive material layer 46L.

In one embodiment, the thickness of the deposited conductive material can be selected that the lateral separation trenches 89 and the backside contact trench 79 are not completely filled with the contiguous conductive material layer 46L. In this case, a cavity (79', 89') is present within each of the lateral separation trenches 89 and the backside contact trench 79 after deposition of the conductive material. The contiguous conductive material layer 46L, the first electrically conductive layers 46, and the second electrically conductive layers 146 are formed as a single contiguous structure.

Figure 10A:
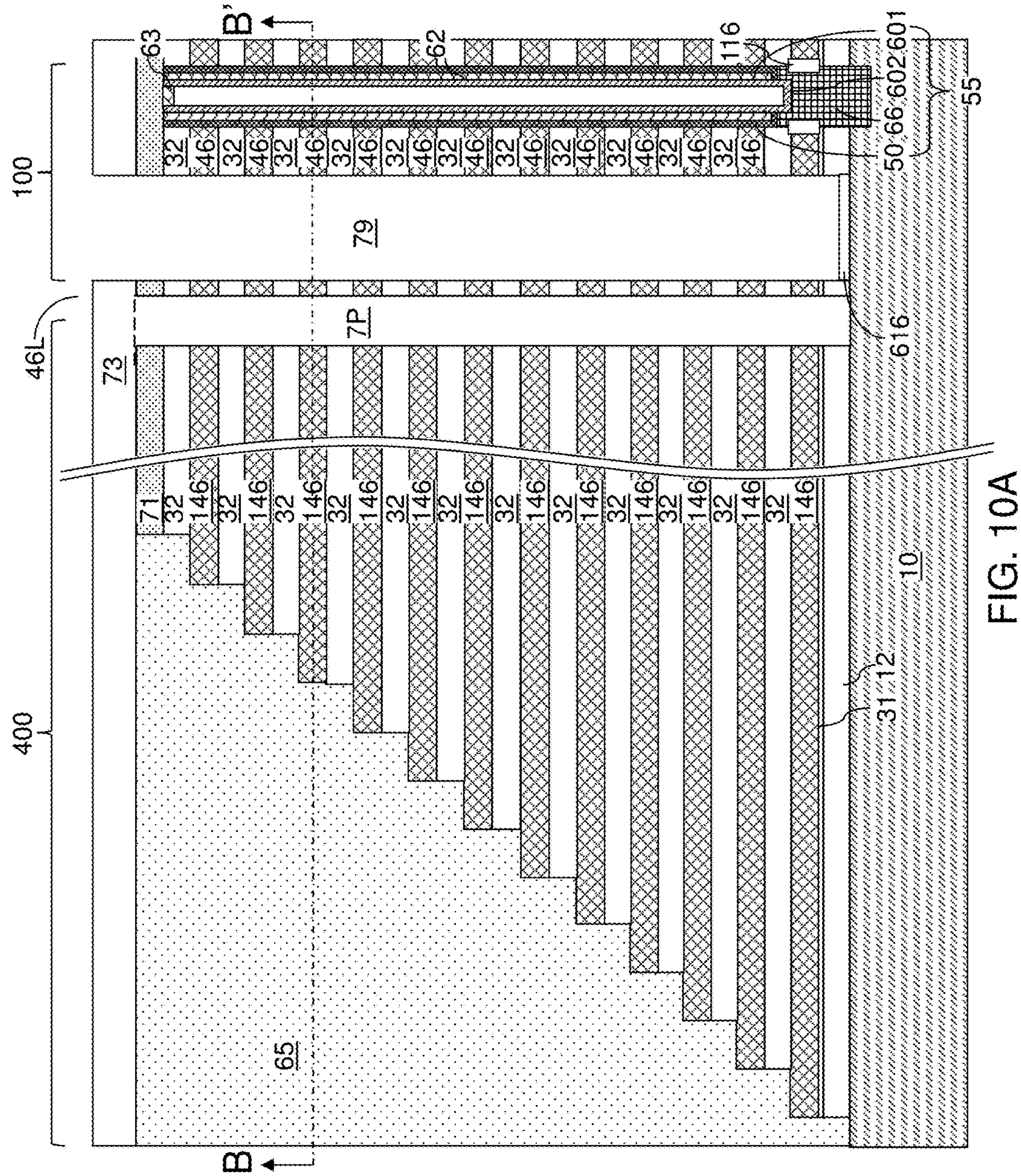
FIG. 10A is a vertical cross-sectional view of the first exemplary structure after removal of a metallic material from trenches according to the first embodiment of the present disclosure.
Figure 10B:
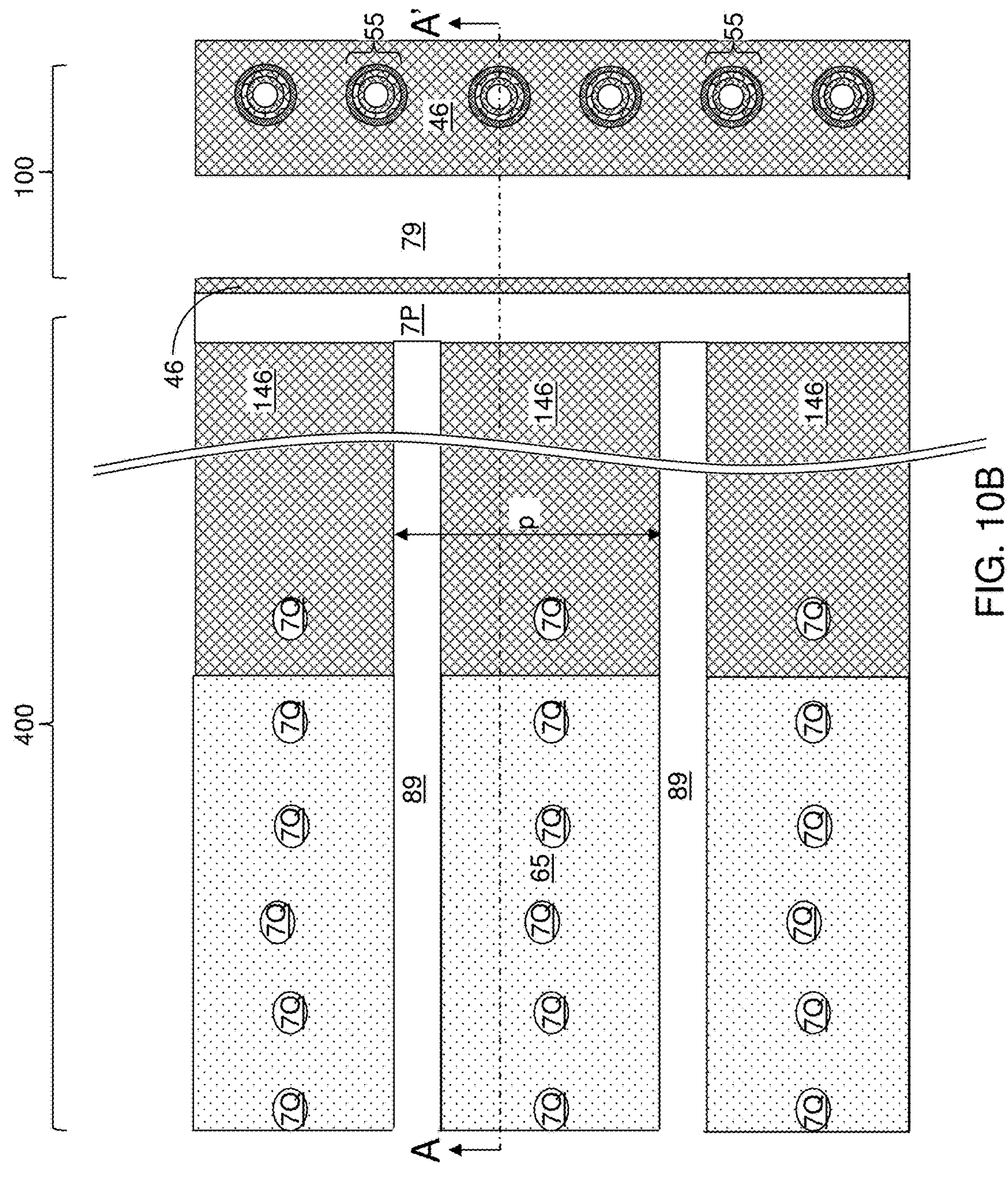
FIG. 10B is a horizontal cross-sectional view of the first exemplary structure of FIG. 10A along the plane B-B'. The vertical plane A-A' is the plane of vertical cross-sectional view of FIG. 10A.

Referring to FIGS. 10A and 10B, the deposited conductive material of the contiguous conductive material layer 46L is etched back from the sidewalls of each backside contact trench 79, from the sidewalls of each lateral separation trench 89, and from the dielectric material layer 73, for example, by an isotropic etch. Each remaining portion of the deposited conductive material in the first backside recesses 43 constitutes a first electrically conductive layer 46. Each remaining portion of the deposited conductive material in the second backside recesses 143 constitutes a second electrically conductive layer 146. Each electrically conductive layer (46, 146) can be a conductive line structure.

Each first electrically conductive layer 46 can function as a combination of a plurality of control gate electrodes and a word line electrically connecting, i.e., electrically shorting, the plurality of control gate electrodes. The plurality of control gate electrodes within each first electrically conductive layer 46 can include control gate electrodes located at the same level for the vertical memory devices including the memory stack structures 55. In other words, each first electrically conductive layer 46 can be a word line that functions as a common control gate electrode for the plurality of vertical memory devices.

A patterned stack comprising an alternating plurality of the first material layers (i.e., the insulator layers 32) and second electrically conductive layers 146 is formed in the capacitor region 400. The second electrically conductive layers 146 in the patterned stack (32, 146) are formed at each level of the second material layers (i.e., the sacrificial material layers 42).

Figure 11A:
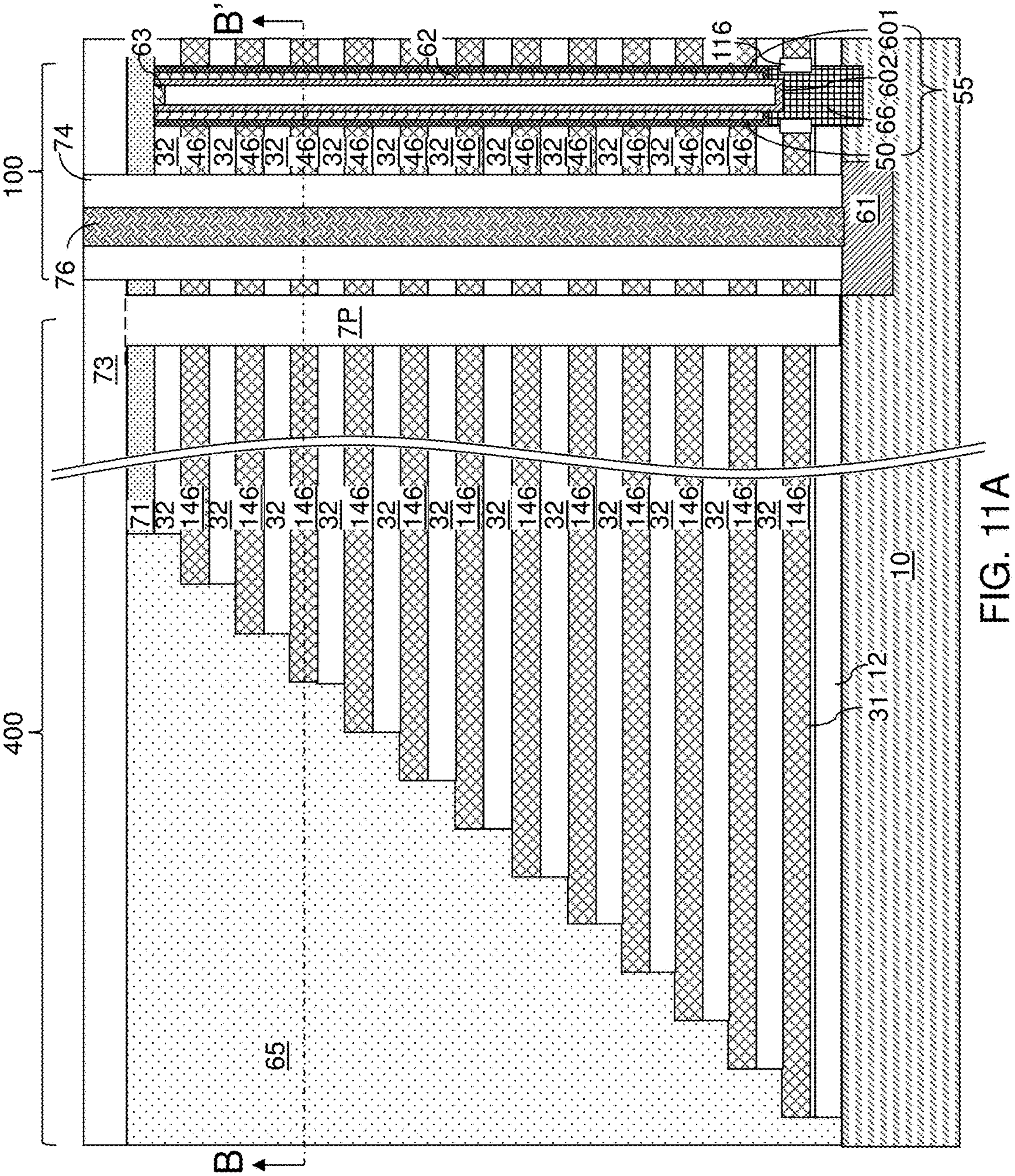
FIG. 11A is a vertical cross-sectional view of the first exemplary structure after formation of dielectric fill material portions and a backside contact via structure according to the first embodiment of the present disclosure.
Figure 11B:
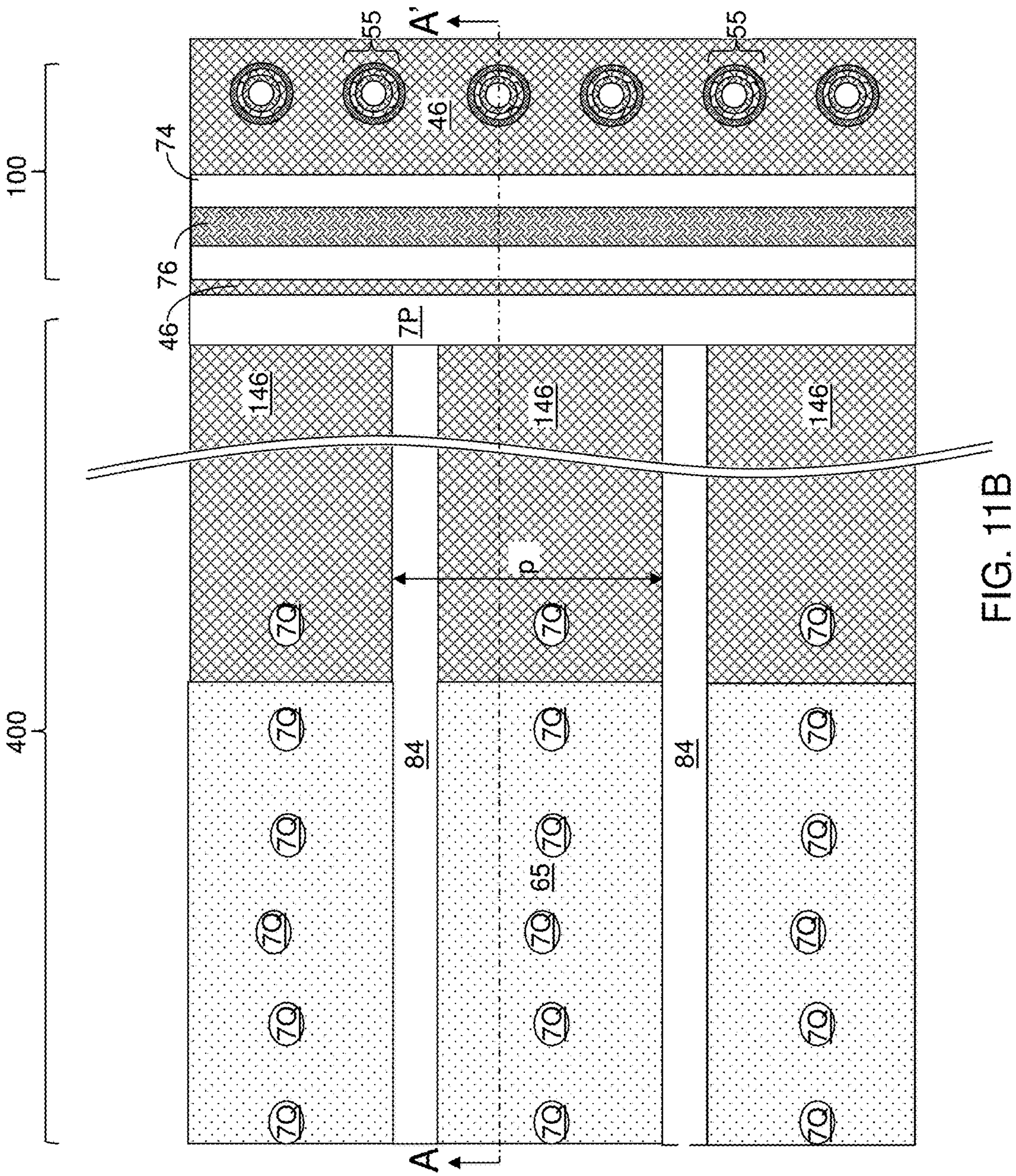
FIG. 11B is a horizontal cross-sectional view of the first exemplary structure of FIG. 11A along the plane B-B'. The vertical plane A-A' is the plane of vertical cross-sectional view of FIG. 11A.
Figure 12A:
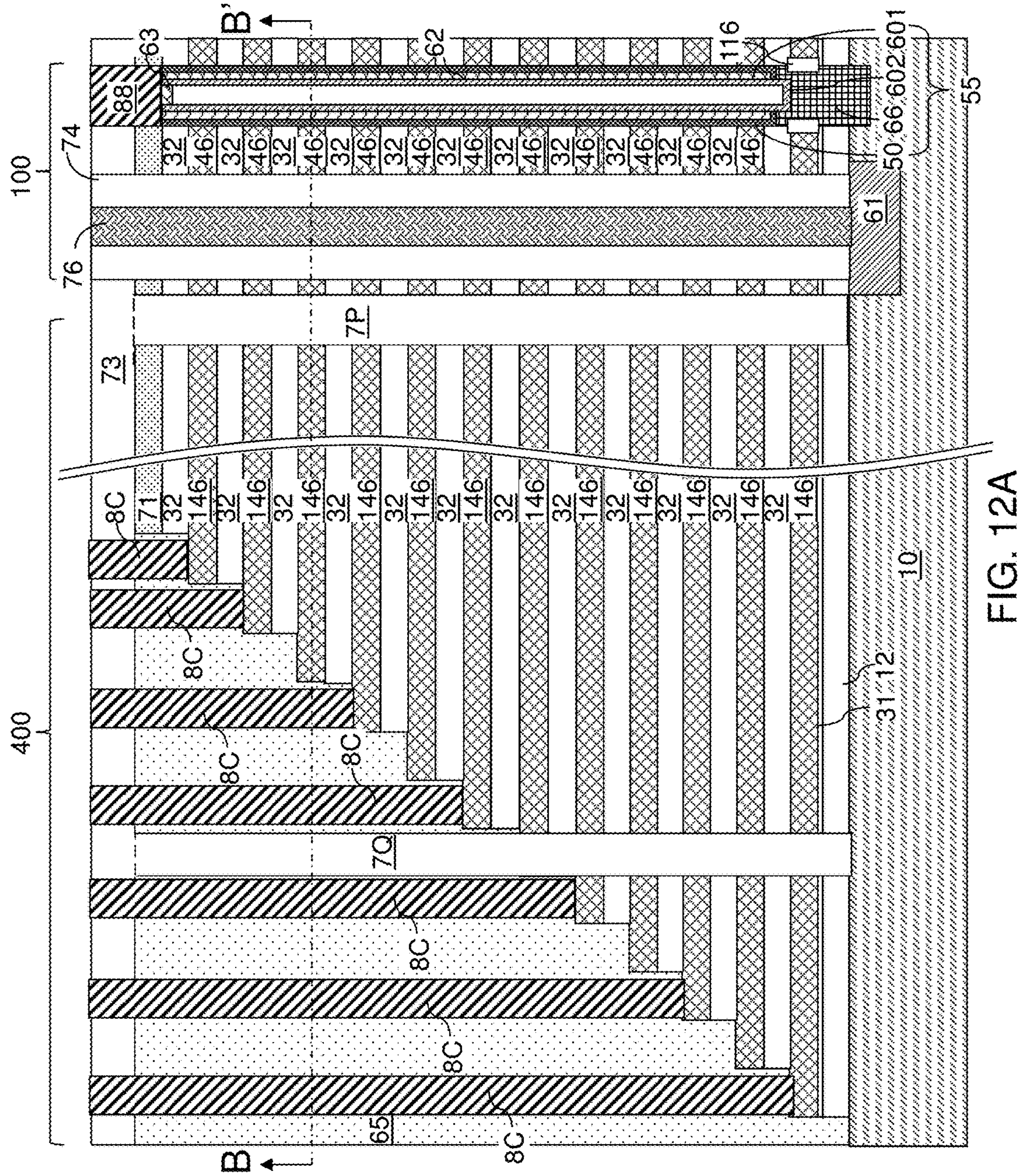
FIG. 12A is a vertical cross-sectional view of the first exemplary structure after formation of capacitor plate contact via structures and drain contact via structures according to the first embodiment of the present disclosure.
Figure 12B:
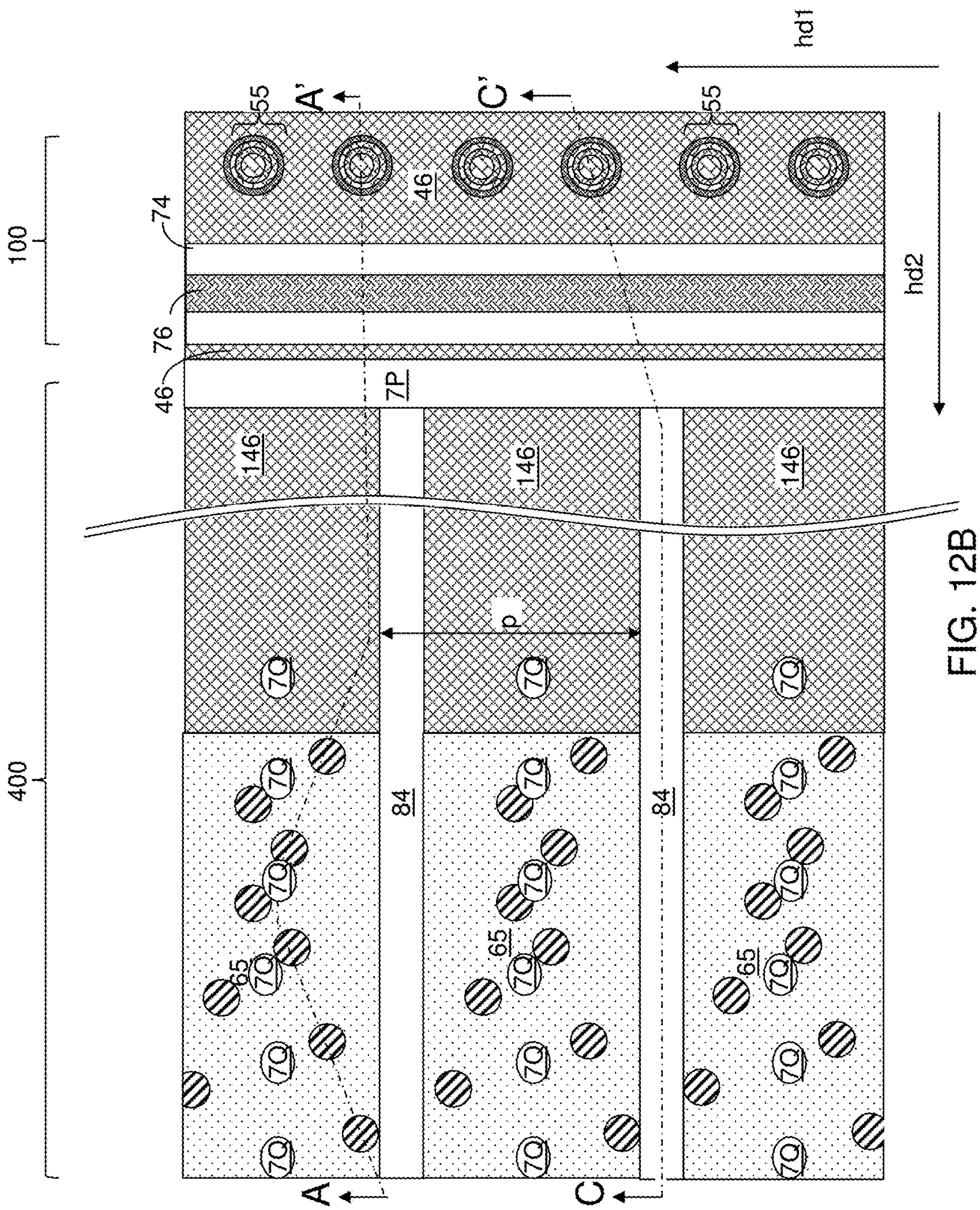
FIG. 12B is a horizontal cross-sectional view of the first exemplary structure of FIG. 12A along the plane B-B'. The vertical plane A-A' is the plane of vertical cross-sectional view of FIG. 12A.
Figure 12C:
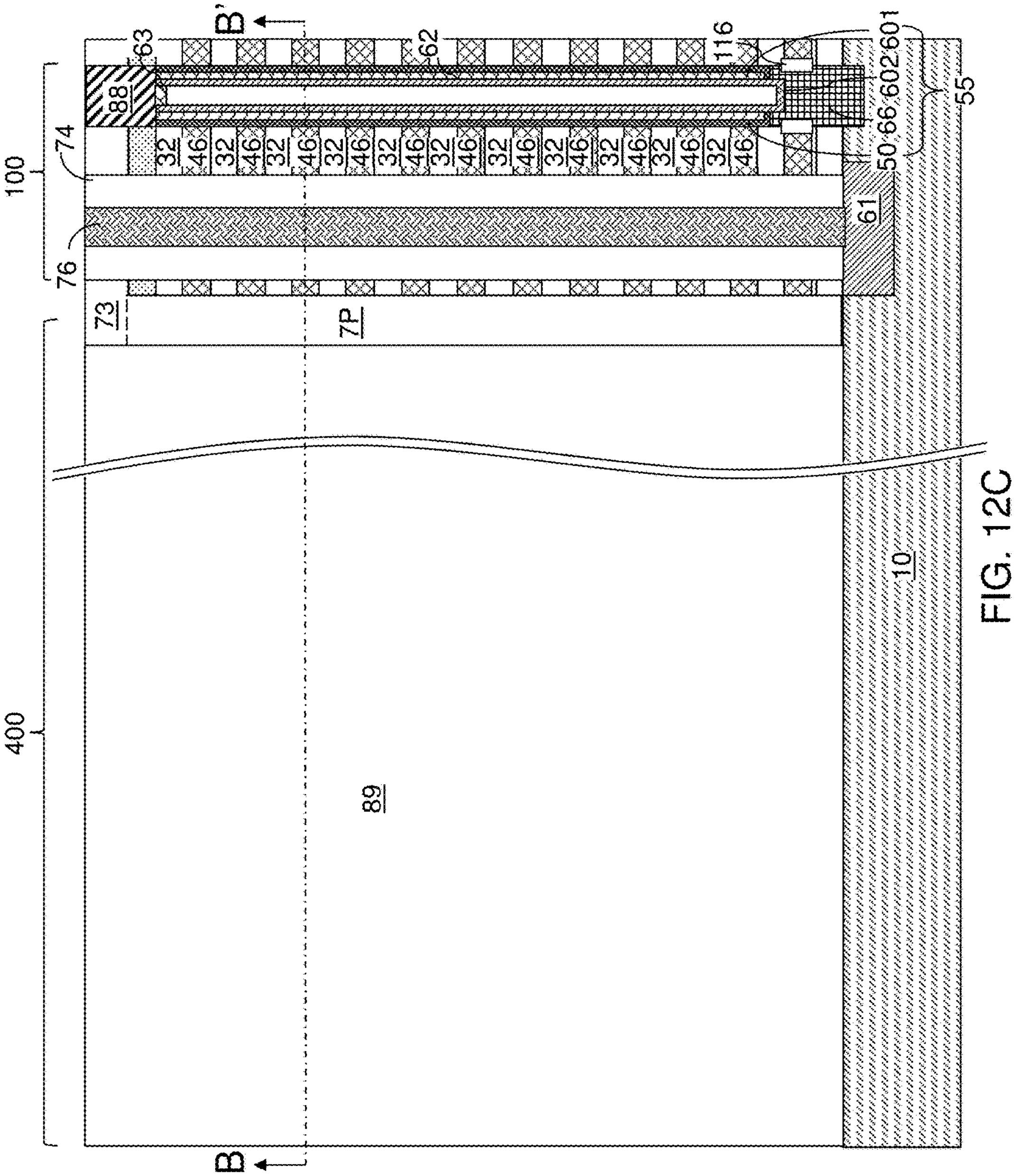
FIG. 12C is a vertical cross-sectional view of the first exemplary structure of FIG. 12B along the vertical plane C-C'.
Figure 12D:
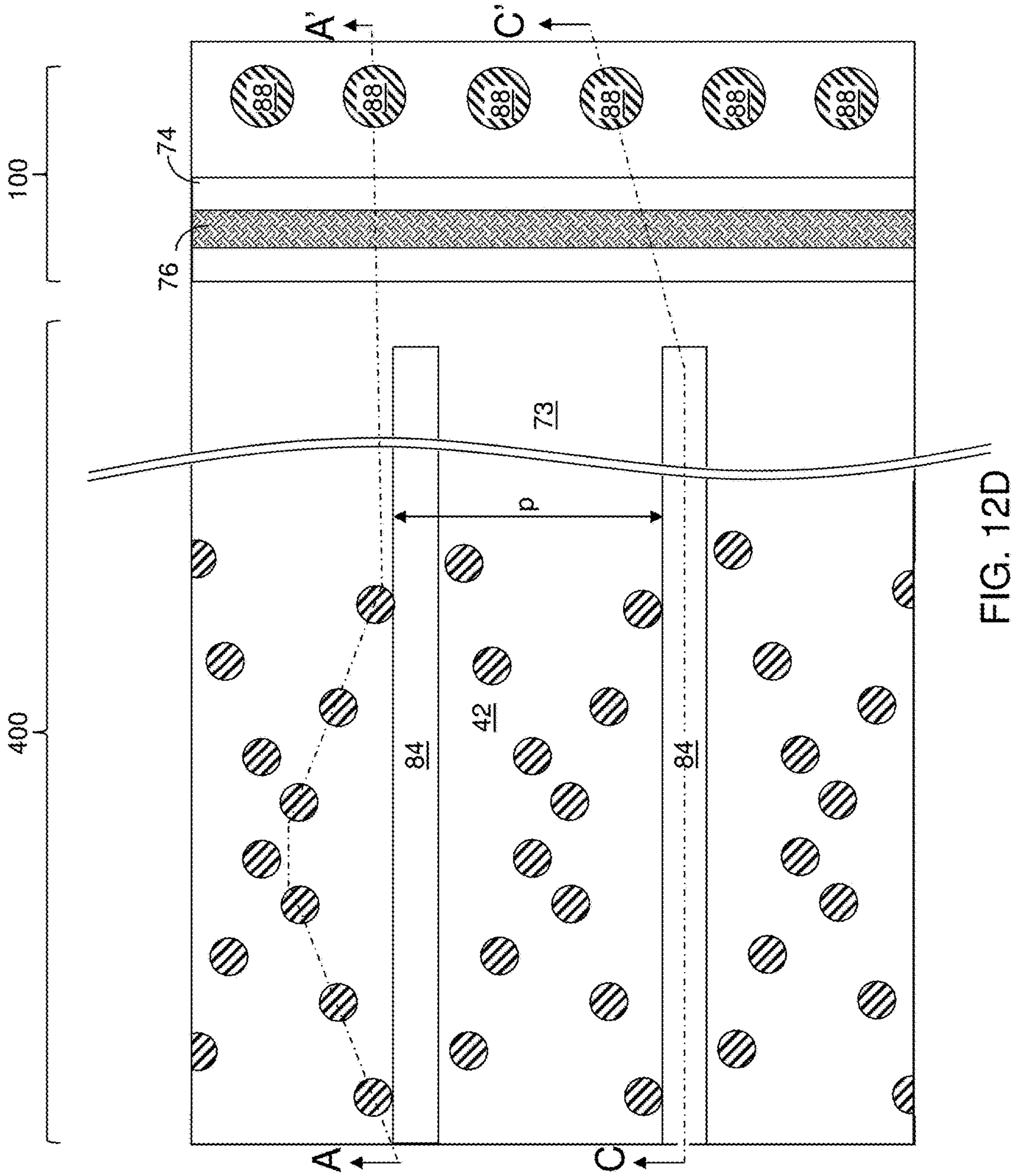
FIG. 12D is a top-down view of the first exemplary structure of FIGS. 12A-12C.
Figure 13A:
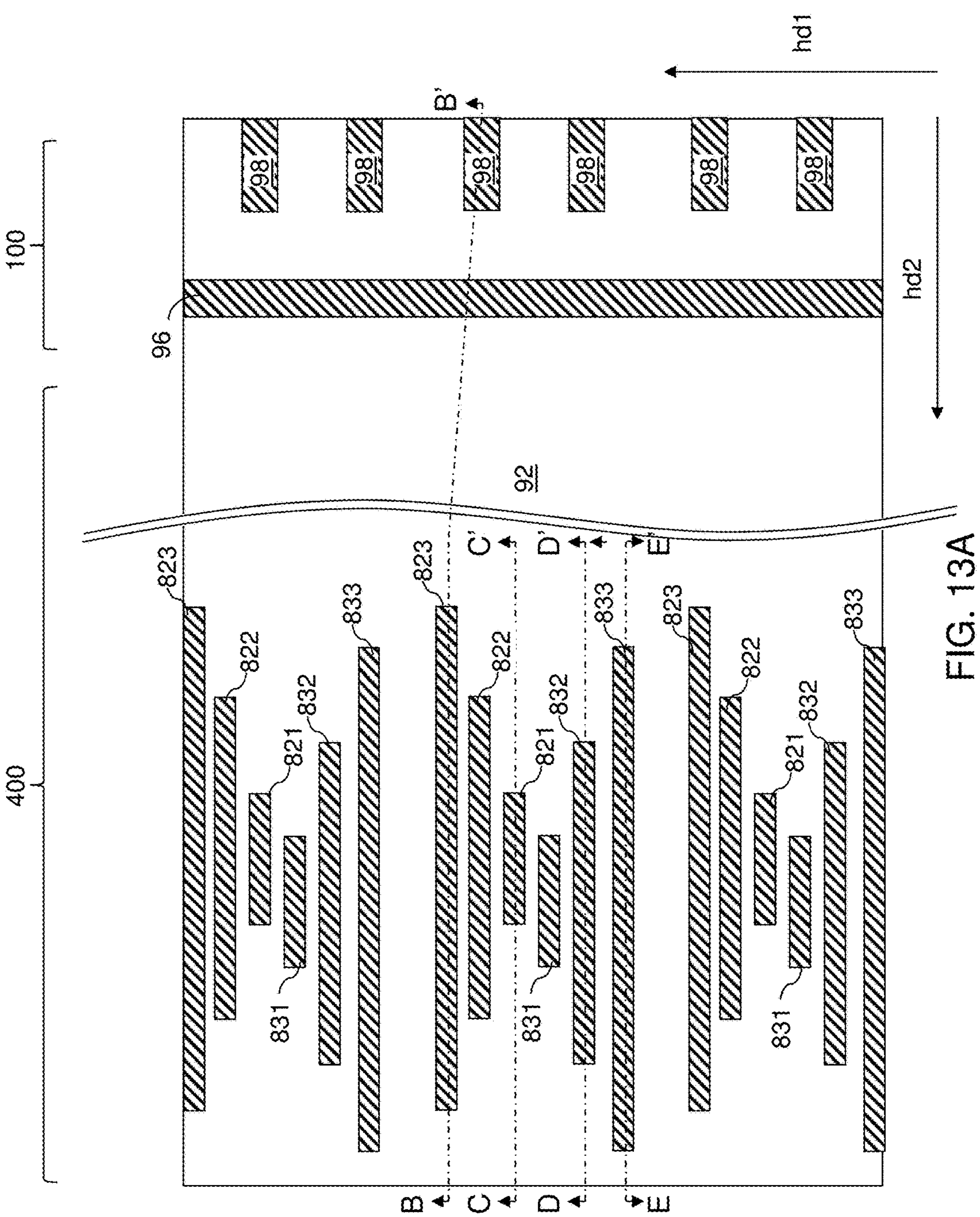
FIG. 13A is a top-down view of the first exemplary structure after formation of a line level dielectric material layer and interconnect line structures according to the first embodiment of the present disclosure.
Figure 13B:
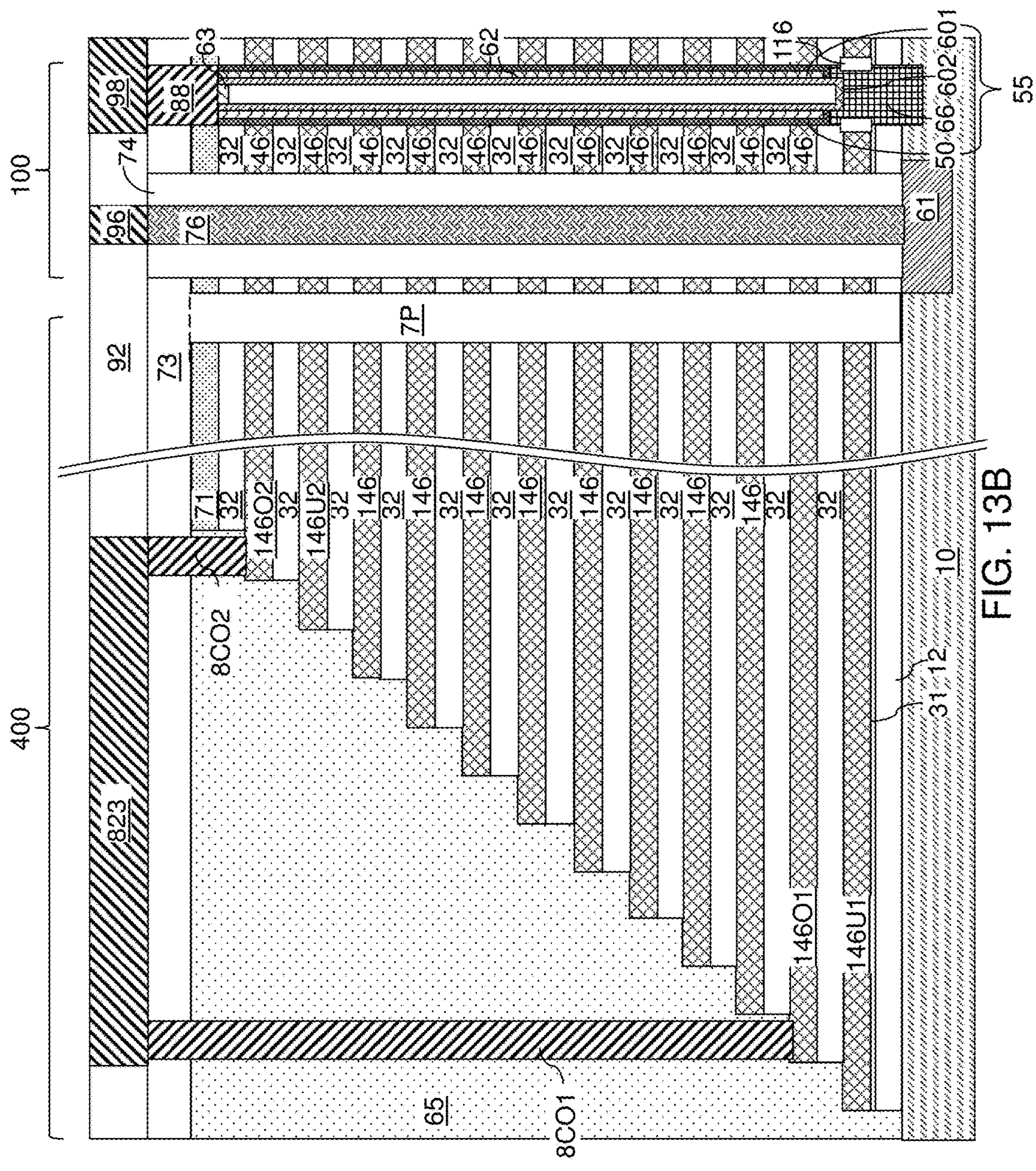
FIG. 13B is a vertical cross-sectional view of the first exemplary structure of FIG. 13A along the vertical plane B-B'.
Figure 13C:
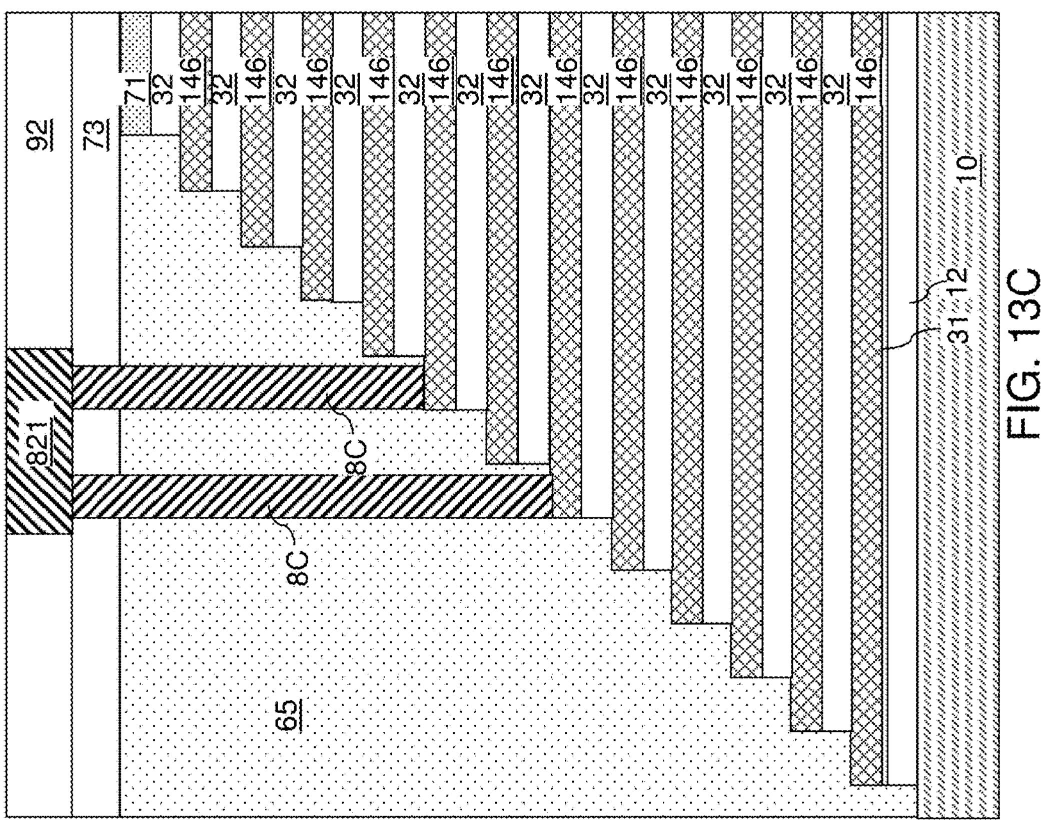
FIG. 13C is a vertical cross-sectional view of the first exemplary structure of FIG. 13A along the vertical plane C-C'.
Figure 13D:
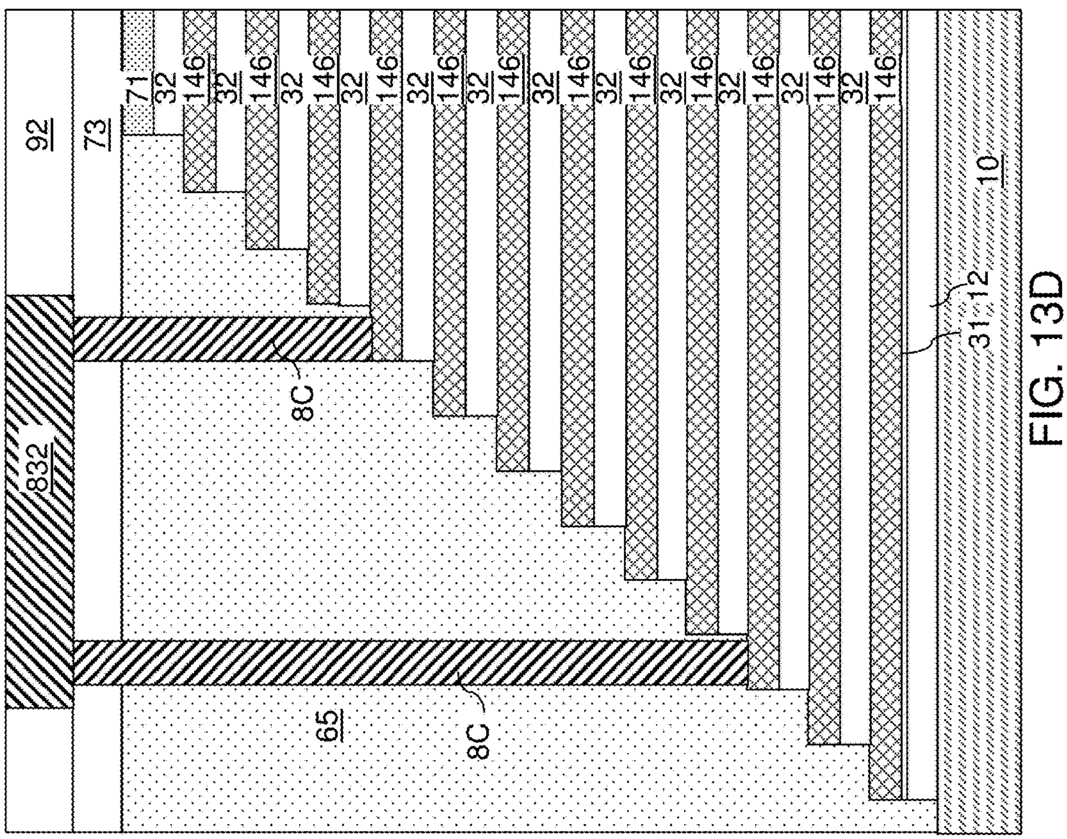
FIG. 13D is a vertical cross-sectional view of the first exemplary structure of FIG. 13A along the vertical plane D-D'.
Figure 13E:
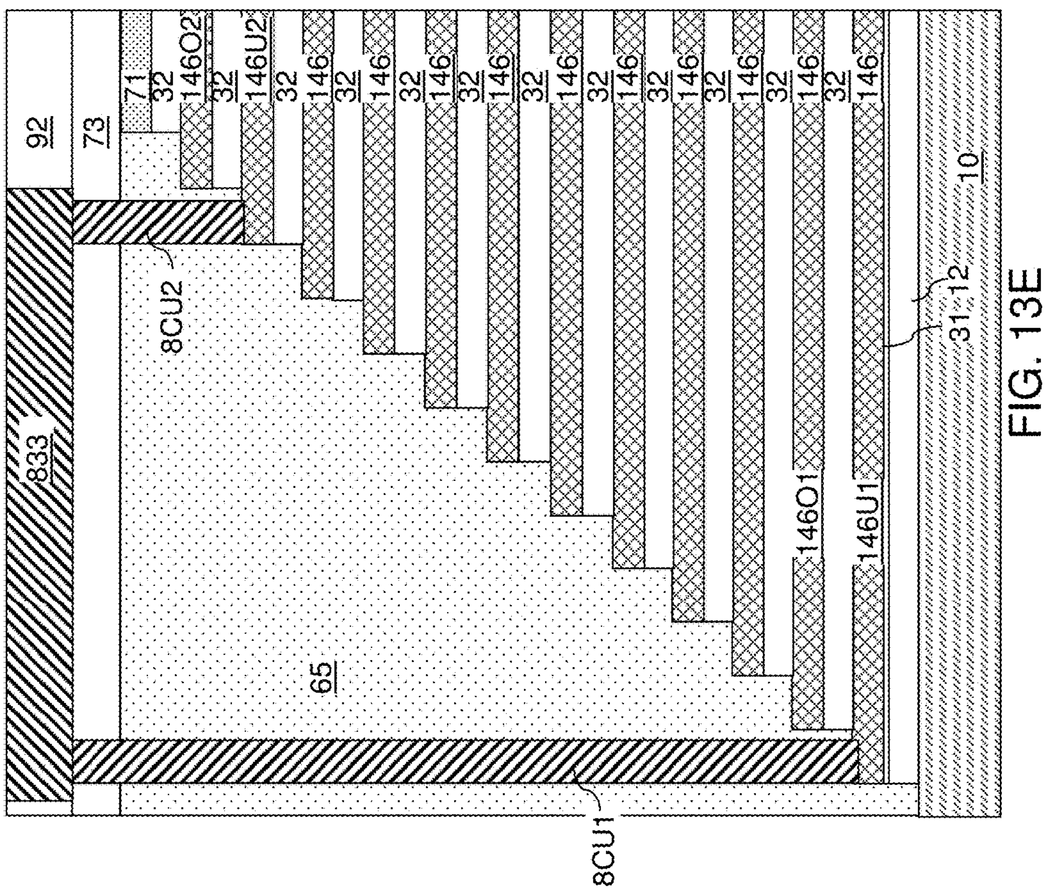
FIG. 13E is a vertical cross-sectional view of the first exemplary structure of FIG. 13A along the vertical plane E-E'.

Referring to FIGS. 11A-11B, a dielectric material can be conformally deposited within the backside contact trench 79 and the lateral separation trenches 89. The dielectric material can include, for example, silicon oxide, silicon nitride, a dielectric metal oxide, or a combination thereof. In one embodiment, the dielectric material can comprise silicon oxide.

In one embodiment, the lateral separation trenches 89 can be completely filled with the dielectric material to form trench fill dielectric material portions 84, while the backside contact trench 79 is not completely filled with the dielectric material. In other words, a backside cavity can be present within the portions of the deposited dielectric material within the backside contact trench 79.

An anisotropic etch can be performed to remove horizontal portions of the deposited dielectric material from above the dielectric material layer 73. A contiguous remaining vertical portion of the deposited dielectric material within the backside contact trench 79 constitutes an insulating spacer 74. The insulating spacer 74 comprises the same dielectric material as the form trench fill dielectric material portions 84. In one embodiment, the trench fill dielectric material portions 84 can have a same width throughout, and the insulating spacer 74 has a lateral thickness, as measured on the sidewalls of the backside contact trench 79, that is greater than one half of the width of the trench fill dielectric material portions 84. A remaining annular portion of the sacrificial dielectric portions 616 can be incorporated into a bottom portion of the insulating spacer 74.

Electrical dopants (p-type dopants or n-type dopants) can be implanted into portions of the semiconductor material layer 10 that underlies the backside cavity within the backside contact trench 79. In one embodiment, the conductivity type of the implanted dopants can be the opposite of the conductivity type of the semiconductor material layer 10. The implanted portion of the semiconductor material layer 10 can function as a source region 61 for the memory stack structures 55, and a surface portion of the semiconductor material layer 10 between the source region 61 and the epitaxial channel portions 66 can be a horizontal channel portion. In one embodiment, the semiconductor material layer 10 can have a doping of a first conductivity type, and the source region 61 can have a doping of a second conductivity type that is the opposite of the first conductivity type.

The backside cavity surrounded by an insulating spacer 74 can be filled with a conductive material to form a backside contact via structure 76. The backside contact via structure 76 can be electrically shorted to a portion of the substrate (10, 61), which can be the source region 61. The backside contact via strcuture 76 extends through, and is laterally surrounded by, the insulating spacer 74.

The patterned stack comprising an alternating plurality of the first material layers (i.e., the insulator layers 32) and second electrically conductive layers 146 in the capacitor region 400 is laterally contacted by dielectric material fill portions on all sides. Specifically, the patterned stack (32, 146) is laterally contacted by a set of dielectric fill material portions (7P, 84, 65) formed within trenches. In one embodiment, each trench laterally surrounding an alternating stack of insulator layers 32 and the second electrically conductive layers 146 can be filled with a dielectric fill material. The trench including a dielectric pillar structure 7P and contacting a sidewall of the alternating stack (32, 146) can be filled with a first dielectric fill material. Two lateral separation trenches 89 including the trench fill dielectric material portions 84 and contacting a pair of sidewalls of the alternating stack (32, 146) can be filled with a second dielectric material. The pair of sidewalls of the alternating stack (32, 146) can be substantially parallel to each other. The retro-stepped cavity including the retro-stepped dielectric material portion 65 and contacting stepped surfaces of the alternating stack (32, 146) includes another dielectric fill material.

Referring to FIGS. 12A-12D, a photoresist layer (not shown) is applied over the dielectric material layer 73, and is lithographically patterned to form openings in regions in which formation of additional contact via structures is desired. The pattern in the photoresist layer is transferred through the dielectric material layer 73, the insulating cap layer 71, and the retro-stepped dielectric material portion 65 to form various vertically-extending cavities. The anisotropic etch can be selective to the materials of the electrically conductive layers (46, 146) and the drain region 63, and optionally to additional materials within the memory stack structures 55. A first subset of the vertically-extending cavities (not shown) can extend to stepped surfaces (not shown) of the first electrically conductive layers 46 adjacent to the memory device region 100. A second subset of the vertically-extending cavities (subsequently filled with capacitor contact via structures 8C) can extend to stepped surfaces of the second electrically conductive layers 146 in the capacitor region 400. Another subset of the vertically-extending cavities (subsequently filled with drain contact via structures 88) can extend to top surfaces of the drain regions 63. The photoresist layer can be removed, for example, by ashing.

At least one conductive material is deposited in the vertically-extending cavities to fill each of the vertically-extending cavities. Excess portions of the at least one conductive material can be removed from above a horizontal plane including a top surface of the dielectric material layer 73, for example, by chemical mechanical planarization (CMP). Each remaining portion of the at least one conductive material constitutes a contact via structure (8C, 88), which include capacitor contact via structures 8C formed in the capacitor region 400, drain contact via structures 88 formed in the memory device region 100, and control gate contact via structures (not shown) that are formed in a stepped surface region (not shown) adjacent to the memory device region 100.

A plurality of contact via structures (i.e., the capacitor contact via structures 8C) is formed on the second electrically conductive layers 146 in the capacitor region 400. An additional plurality of contact via structures (i.e., the control gate contact via structures) is formed on the first electrically conductive layers 46 adjacent to the memory device region 100, as will be described below with respect to FIG. 14X.

In one embodiment, the capacitor contact via structures 8C can be arranged to facilitate pairwise connection between upper second electrically conductive layers 146 (i.e., second electrically conductive layers 146 located within an upper half of the alternating stack (32, 146)) and lower second electrically conductive layers 146 (i.e., second electrically conductive layers 146 located within a lower half of the alternating stack (32, 146)) through line level interconnect structures to be subsequently formed over the dielectric material layer 73. For example, capacitor contact via structures 8C to be electrically shorted by overlying interconnect line structures (such as metal line structures) can be formed along the second horizontal direction hd2, which is parallel to the lengthwise direction of the trench fill dielectric material portions 84.

As shown in FIGS. 13A-13E, a line level dielectric material layer 92 including a dielectric material can be formed over the top surface of the dielectric material layer 73. The dielectric material of the line level dielectric material layer 92 can be, for example, silicon oxide, silicon nitride, organosilicate glass, or a combination thereof. Interconnect line structures can be formed in the line level dielectric material layer 92, for example, by forming line trenches in the line level dielectric material layer 92 and filling the line trenches with at least one conductive material. Excess portions of the at least one conductive material can be removed from above the top surface of the line level dielectric material layer 92, for example, by chemical mechanical planarization.

Node-tying metal lines (821, 822, 823, 831, 832, 833), source metal line 96, and bit lines 98 (only portions of the word lines are shown for clarity) can be formed in the line level dielectric material layer 92. The node-tying metal lines (821, 822, 823, 831, 832, 833) tie, i.e., electrically short, the same node of capacitor structures. The node-tying metal lines (821, 822, 823, 831, 832, 833) can include first node-tying metal lines (821, 822, 823) that tie the first node of a respective capacitor, and second node-tying metal lines (831, 832, 833) that tie the second node of a respective capacitor. The source metal line 96 provides electrical connection to the backside contact via structure 76 and the source region 61. The bit lines 98 provide electrical connection to the drain contact via structures 88 and the drain regions 63.

The second electrically conductive layers 146 constitute capacitor electrodes (e.g., plates) of a set of capacitors. Each capacitor plate is a conductive component of the set of capacitors. A subset of the electrically insulating layers 32 within the capacitor region 400 constitutes node dielectrics of the set of capacitors. Each capacitor in the set comprises a first node that includes an underlying second electrically conductive layer (146U1 or 146U2) (which is one of the second electrically conductive layers 146) of a respective vertically neighboring pair and a respective contact via structure (8CU1 or 8CU2) that extends upward from the underlying second electrically conductive layer (146U1 or 146U2) and through the retro-stepped dielectric material portion 65. Each capacitor in the set further comprises a second node that includes an overlying second electrically conductive layer (146O1 or 146O2) (which is one of the second electrically conductive layers 146) of the respective vertically neighboring pair and a respective contact via structure (8CO1 or 8CO2) that extends upward from the overlying electrically conductive layer (146O1 or 146O2) and through the retro-stepped dielectric material portion 65.

In one embodiment, each capacitor within the set of capacitors can comprises two pairs of vertically neighboring electrically conductive layers (146U1, 146O1) and (146U2, 146O2) such that the first node of the capacitor includes an underlying electrically conductive layer 146U1 of a first vertically neighboring pair (146U1, 146O1) and an electrically conductive layer 146U2 of a second vertically neighboring pair (146U2, 146O2); and the second node of the capacitor includes an overlying electrically conductive layer 146O1 of the vertically neighboring pair (146U1, 146O1) and another electrically conductive layer 146O2 of the second vertically neighboring pair (146U2, 146O2).

In case the horizontal steps (i.e., the horizontal surface portions) of the stepped surfaces of the alternating stack (32, 146) has a uniform width, upper vertically neighboring pairs of second electrically conductive layers 146 (located in the upper half of the alternating stack (32, 146)) and lower vertically neighboring pairs (located in the lower half of the alternating stack (32, 146)) of second electrically conductive layers 146 can be matches such that each set of an upper vertically neighboring pair of second electrically conductive layers 146 and a lower vertically neighboring pair of the second electrically conductive layers 146 has a same total overlap area between neighboring pairs of second electrically conductive layers 146. If the insulator layers 32 have the same thickness throughout, the capacitance of each capacitor can be the same. If the alternating stack (32, 146) in the capacitor region includes a total of N second electrically conductive layers 146, the total number of capacitors including an upper vertically neighboring pair of second electrically conductive layers 146 and a lower vertically neighboring pair of the second electrically conductive layers 146 can be a positive integer that does not exceed N/4.

Alternatively, tying of the nodes of two pairs of vertically neighboring second electrically conductive layers 146 can be omitted. In this case, each capacitor can consist of a single vertically neighboring pair of second electrically conductive layers 146.

The first exemplary structure can include a device comprising a set of capacitors. The set of capacitors can comprise: a stack of alternating layers (32, 146) including electrically insulating layers 32 and electrically conductive layers 146 and located over a substrate 10. Each electrically conductive layer 146 that is located within the stack (32, 146), and has at least one overlying electrically conductive layer 146 which laterally extends farther than any overlying electrically conductive layer 146. The set of capacitors includes a dielectric material portion 65 located over the stepped surface region of the stack (32, 146). An interface between the dielectric material portion 65 and the stack (32, 146) includes a contiguous set of horizontal surfaces and vertical surfaces to provide the stepped surface region. The device comprises a set of dielectric fill material portions (84, 7P) are located within trenches that vertically extend through the stack (32, 146) of alternating layers and laterally contacts sidewalls of the stack (32, 146) of alternating layers. The device comprises a plurality of capacitor contact via structures 8C in contact with respective electrically conductive layers 146 within the stack (32, 146) of alternating layers. The electrically conductive layers 146 constitute conductive components of a set of capacitors and a subset of the electrically insulating layers 32 constitutes node dielectrics of the set of capacitors. Only the electrically insulating layers 32 located between a first node and a second node of a capacitor constitutes the node dielectrics. Each capacitor in the set comprises: a first node that includes an underlying electrically conductive layer 146U1 (or alternatively 146U2) of a respective vertically neighboring pair and a respective capacitor contact via structure 8CU1 (or alternatively 8CU2) that extends upward from the underlying electrically conductive layer 146U1 and through the dielectric material portion 65; and a second node that includes an overlying electrically conductive layer 146O1 (or alternatively 146O2) of the respective vertically neighboring pair and a respective capacitor contact via structure 8CO1 (or alternatively 8CO2) that extends upward from the overlying electrically conductive layer 146O1 and through the dielectric material portion 65.

In one embodiment, each of the trenches (i.e., the lateral separation trenches 89 and optionally the trench in which the dielectric pillar structure 7P is present, or trenches 89A, 89B described below with respect to FIGS. 14A-14X) can be entirely filled with a dielectric material of a respective dielectric fill material portion (84, and optionally 7P). In one embodiment, all sidewall surfaces of the electrically conductive layers 146 within the stack of alternating layers (32, 146) can be in contact with a surface selected from sidewall surfaces of the set of dielectric fill material portions (84, and optionally 7P) and sidewall surfaces of the dielectric material portion 65.

In one embodiment, the entire interface between an electrically conductive layer 146 within the stack (32, 146) of alternating layers and the set of dielectric fill material portions (84, and optionally 7P) can be a contiguous interface, and can be vertical or tapered. In one embodiment, the contiguous interface can be substantially vertical throughout an entirety thereof. As used herein, a surface is substantially vertical if the surface is vertical or a taper angle of the surface with respect to a vertical direction does not exceed 3 degrees. In one embodiment, the interface between the electrically conductive layer 146 and the set of dielectric fill material portions (84, and optionally 7P) adjoins an interface between the electrically conductive layer 146 and the dielectric material portion 65 (which is located within a subset of the stepped surfaces in the stepped surface region). In one embodiment, the combination of the interface between the electrically conductive layer 146 and the set of dielectric fill material portions (84, and optionally 7P) and the interface between the electrically conductive layer 146 and the dielectric material portion 65 includes all sidewall surfaces of the electrically conductive layer 146.

In one embodiment, the set of dielectric fill material portions (84, and optionally 7P) can be a contiguous (i.e., physically adjoined) set of material portions and contact the dielectric material portion 65. In one embodiment, the dielectric material portion 65 can be a retro-stepped dielectric material portion in which a horizontal cross-sectional area of the dielectric material portion 65 at a horizontal plane is not less than a horizontal cross-sectional area of the dielectric material portion at any horizontal plane that is more proximal to the substrate 10.

In one embodiment, each capacitor within the set of capacitors comprises two pairs of vertically neighboring electrically conductive layers (146U1, 146O1) and (146U2, 146O2). The first node of the capacitor includes an underlying electrically conductive layer 146U1 of a first vertically neighboring pair (146U1, 146O1) and an electrically conductive layer (146U2 or 146O2) of a second vertically neighboring pair (146U2, 146O2). The second node of the capacitor includes an overlying electrically conductive layer 146O1 of the first vertically neighboring pair (146U1, 146O1) and another electrically conductive layer (146U2 or 146O2) of the second vertically neighboring pair (146U2, 146O2).

In one embodiment, the underlying electrically conductive layer 146U1 of the first vertically neighboring pair (146U1, 146O1) and the electrically conductive layer (146U2 or 146O2) of the second vertically neighboring pair (146U2, 146O2) are electrically shorted through two contact via structures (for example, 8CU1 and 8CU2) and a first conductive line structure (for example, 833). The overlying electrically conductive layer 146O1 of the first vertically neighboring pair (146U1, 146O1) and the other electrically conductive layer of the second vertically neighboring pair (146U2, 146O2) are electrically shorted through two additional contact via structures (for example, 8CO1 and 8CO2) and a second conductive line structure (for example, 823).

In one embodiment, the set of capacitors comprise at least a first capacitor and a second capacitor. In this case, the first capacitor can comprise a first upper pair of vertically neighboring electrically conductive layers (e.g., 146U2 and 146O2) and a first lower pair of vertically neighboring electrically conductive layers (e.g., 146U1 and 146O1). The second capacitor can comprise a second upper pair of vertically neighboring electrically conductive layers (located within an upper half of the alternating stack and at different levels than the first upper pair of vertically neighboring electrically conductive layers) and a second lower pair of vertically neighboring electrically conductive layers (located within a lower half of the alternating stack and at different levels than the first lower pair of vertically neighboring electrically conductive layers). In one embodiment, the second upper pair of vertically neighboring electrically conductive layers 146 overlies the first upper pair of vertically neighboring electrically conductive layers 146; the first upper pair of vertically neighboring electrically conductive layers 146 overlies the first lower pair of vertically neighboring electrically conductive layers 146; and the first lower pair of vertically neighboring electrically conductive layers 146 overlies the second lower pair of vertically neighboring electrically conductive layers 146.

In one embodiment, the capacitors can be configured to provide the same capacitance for each capacitor. Such a configuration can be obtained by forming pairs of vertically neighboring electrically conductive layers 146, and providing parallel connection for a pair of component capacitors. The first component capacitor is formed by a node dielectric employing an insulator layer 32 within the lower half of the alternating stack (32, 146) and two neighboring electrically conductive layers 146. The second component capacitor is formed by a node dielectric employing an insulator layer within the upper half of the alternating stack (32, 146) and two neighboring electrically conductive layers 146. The two component capacitors are connected in parallel such that the total capacitance is the same as the target capacitance for the capacitor formed by the parallel connection of the two component capacitors. By selecting the pairs of component capacitors for parallel connection, multiple capacitors having the same total capacitance can be formed.

In one embodiment, the thickness of the insulator layers 32 can be the same throughout, and the sum of an upper overlap area between the vertically neighboring electrically conductive layers (146U2, 146O2) within the first upper pair (of a first capacitor) and a lower overlap area between the vertically neighboring electrically conductive layers (146U1, 146O2) within the first lower pair (of the first capacitor) can be substantially the same as the sum of an upper overlap area between the vertically neighboring electrically conductive layers within the second upper pair (of the second capacitor) and a lower overlap area between the vertically neighboring electrically conductive layers within the second lower pair (of the second capacitor). In this case, the first capacitor and the second capacitor can have the same total capacitance. In one embodiment, each capacitor within the set of capacitors can have a substantially same total overlap area between vertically neighboring electrically conductive layers contained therein.

In one embodiment, the device can further comprise a monolithic three-dimensional memory device located on the substrate 10 and in the memory device region 100. The monolithic three-dimensional memory device can comprise a memory opening 49 extending through the stack (32, 46); a memory film 55 located within the memory opening 49;

and a semiconductor channel (601, 602 and optionally 66) located within the memory film 55.

In one embodiment, the set of capacitors can be a component of a peripheral device of the monolithic three-dimensional memory device; the monolithic three-dimensional memory device can be a vertical NAND memory device; the electrically conductive layers 46 comprise, or are electrically connected to, a respective word line of the vertical NAND memory device; and the substrate comprises a silicon substrate. In one embodiment, the vertical NAND memory device can comprise an array of monolithic three-dimensional NAND strings over the silicon substrate; at least one memory cell in the first device level of the three-dimensional array of NAND strings can be located over another memory cell in the second device level of the three-dimensional array of NAND strings; and the silicon substrate can contain an integrated circuit comprising a driver circuit for the memory device located thereon. The three-dimensional array of NAND strings can comprise: a plurality of semiconductor channels (601, 602, and optionally 66, and portions of 10), wherein at least one end portion of each of the plurality of semiconductor channels extends substantially perpendicular to a top surface of the silicon substrate; a plurality of charge storage elements, each charge storage element located adjacent to a respective one of the plurality of semiconductor channels; and a plurality of control gate electrodes having a strip shape extending substantially parallel to the top surface of the silicon substrate. The plurality of control gate electrodes comprise at least a first control gate electrode located in the first device level and a second control gate electrode located in the second device level.

Figure 14A:
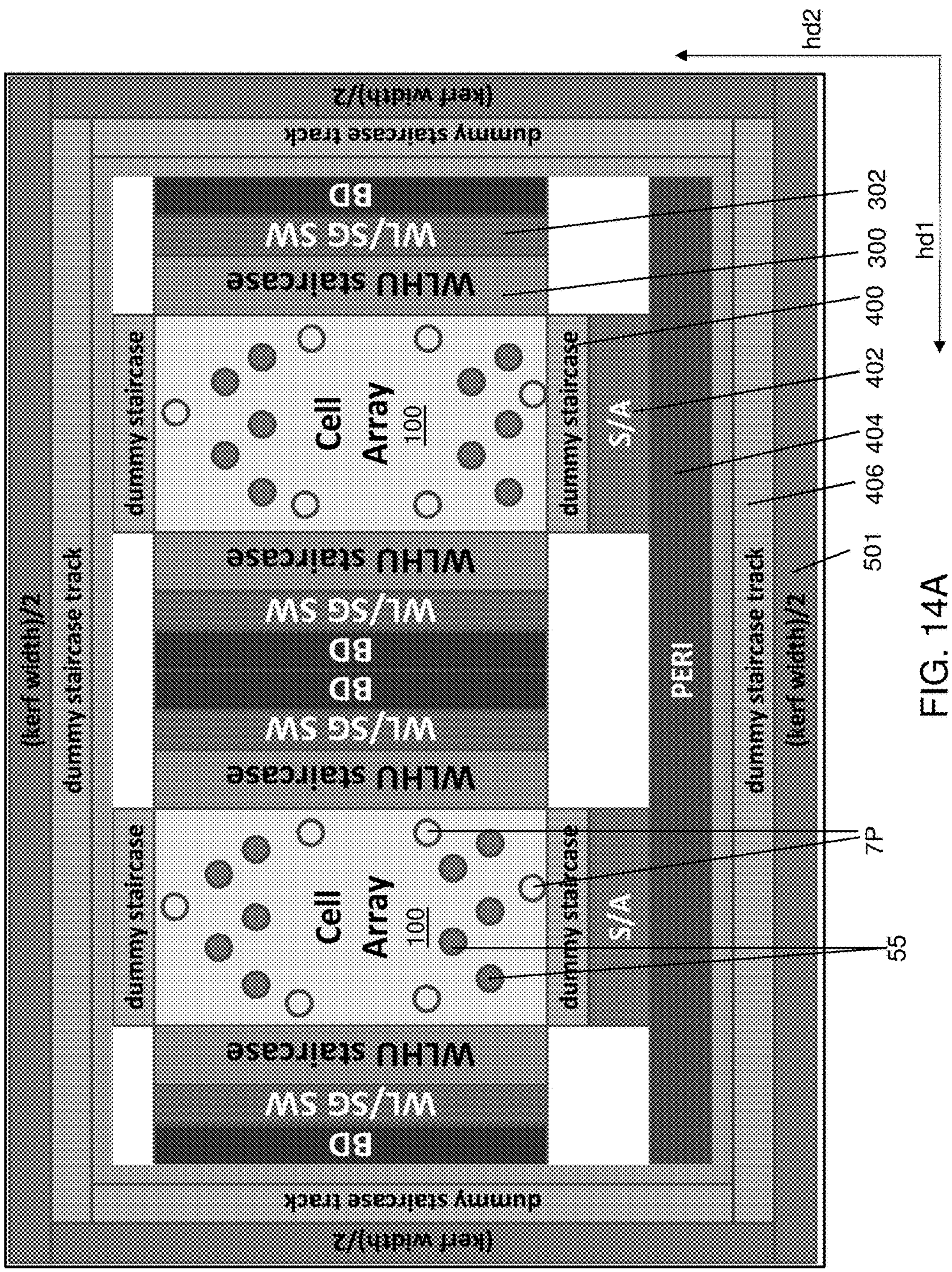
FIGS. 14A and 14X are schematic top down views of devices of embodiments of the invention.

FIG. 14A illustrates a schematic top down view of a device of embodiments of the invention. As shown in FIG. 14A, the capacitor region 400 is located in the stepped surface region of the stack between the sense amplifiers 402 and other bit line peripheral devices 404 (e.g., devices of the driver circuit, such as charge pump circuit devices, reference voltage and current circuit, and/pr power-on circuit, etc.) and the memory device region 100 (also referred to as the cell array) in direction hd2 (i.e., the bit line direction). The capacitor region 400 is also referred to as a dummy staircase region because it includes the stepped surface without word line contact vias (i.e., control gate interconnects). The dummy staircase region is formed at the same time during the same etching steps as the word line stepped surface regions 300 (labeled WLHU staircase) in which the word line contact vias (i.e., control gate interconnects) will be formed during a subsequent step. In other words, the stepped surface regions are formed on plural (e.g., all) sides of the elevated memory device region. For a rectangular memory device region 100, the word line stepped surface regions 300 are formed on two opposing sides of the memory device region 100 such that word lines will eventually extend in the word line direction hd1 between opposing regions 300. The word line and select gate switching transistors are located in row decoder regions 302 (labeled WL/SG SW) adjacent to regions 300 in direction hd1.

The remaining two sides of the memory device region 100 contain the dummy staircase regions. The capacitors are formed in the dummy staircase capacitor region 400 located adjacent to the sense amplifier region 402. Thus, the size of the sense amplifier region 402 may be reduced by over 10%, such as about 20% by omitting the capacitors from region 402 and instead forming the capacitors in region 400 which is an unused dummy region in prior art devices.

The memory device region 100 contains the memory stack structures 55 and the support pillars (e.g., dielectric pillar structures) 7P, similar to that shown in FIG. 5A. However, in the embodiment of FIG. 14A, the support pillars 7P comprise cylindrical pillars instead of or in addition to the elongated dielectric pillar structures 7P shown in FIG. 6B. It should be understood that only a few of the memory stack structures 55 and the support pillars 7P are shown for clarity. If desired, the dielectric support pillar structures 7Q (not shown for clarity) as described and illustrated above may also be present in the device of the embodiment of FIG. 14A.

The periphery of the device (e.g., the periphery of the substrate, such as portion of a semiconductor wafer or a diced chip) contains a dummy staircase track 406 and a kerf region 501 (e.g., having half width of the original dicing region if the substrate is diced into chips). The dummy staircase track 406 surrounds the device and contains a stepped surface region which is a mirror image of the stepped surface region of the dummy staircases 400. The track 406 is formed during the same patterning (e.g., etching) steps as the other stepped regions 300 and 400 in the device.

Figure 14D:
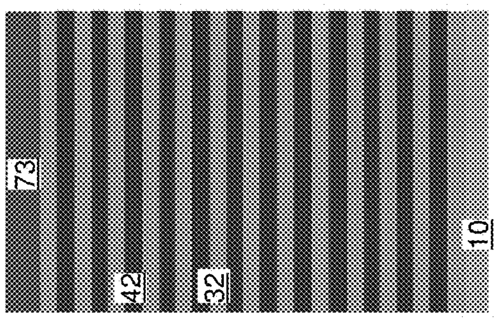
Figure 14B:
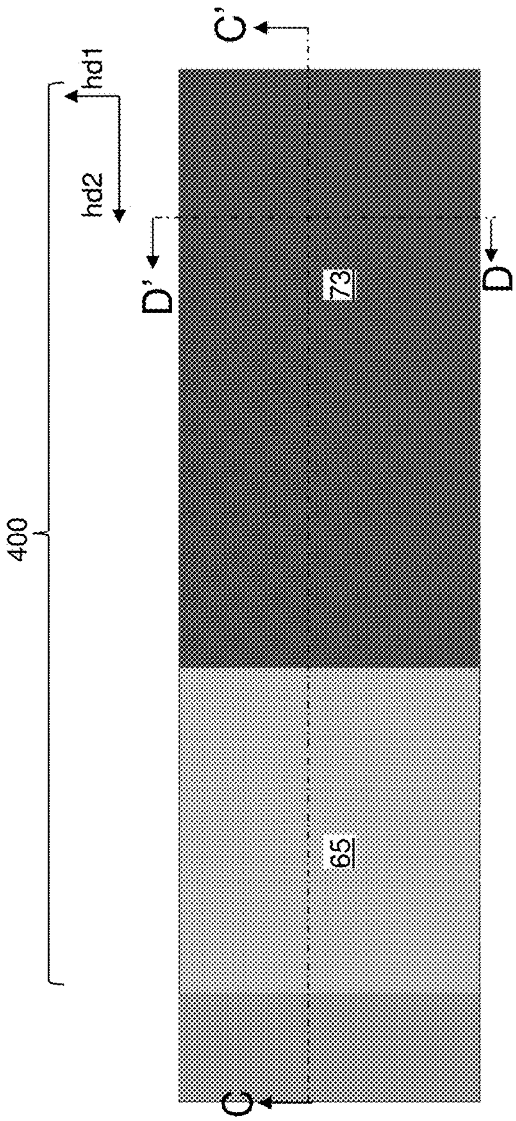
Figure 14C:
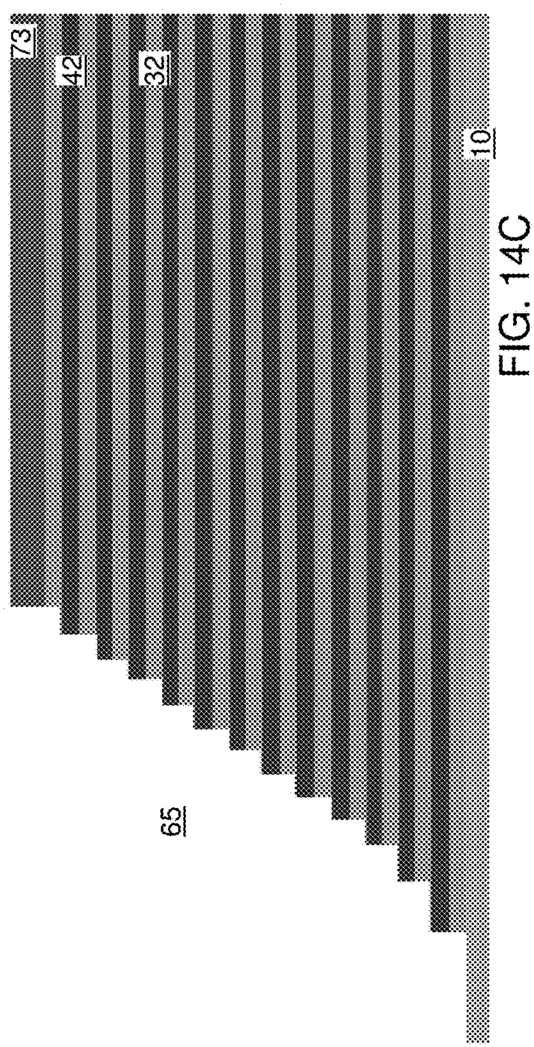

FIGS. 14B-14D illustrate an exemplary structure according to an alternative of the first embodiment. The structure is similar to the structure shown in FIGS. 6A-6B, except that the support pillars 7P comprise cylindrical pillars (shown in FIG. 14A) located in region 100. The structure of FIGS. 14B-14D contains the alternating stack (32, 42), the dielectric material layer 73 and the retro-stepped dielectric material portion 65 described above with respect to FIG. 6A.

Figure 14G:
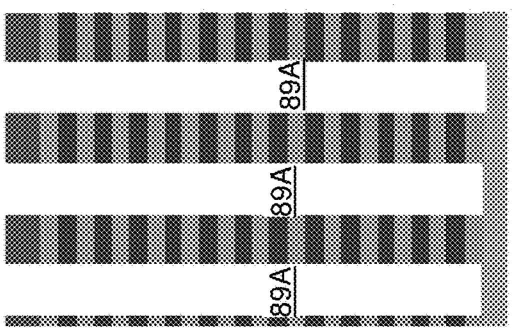
Figure 14E:
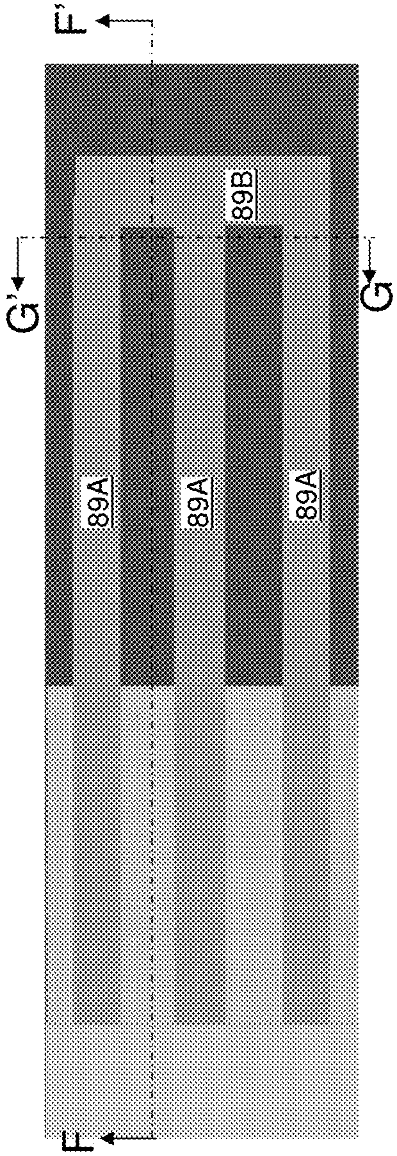
Figure 14F:
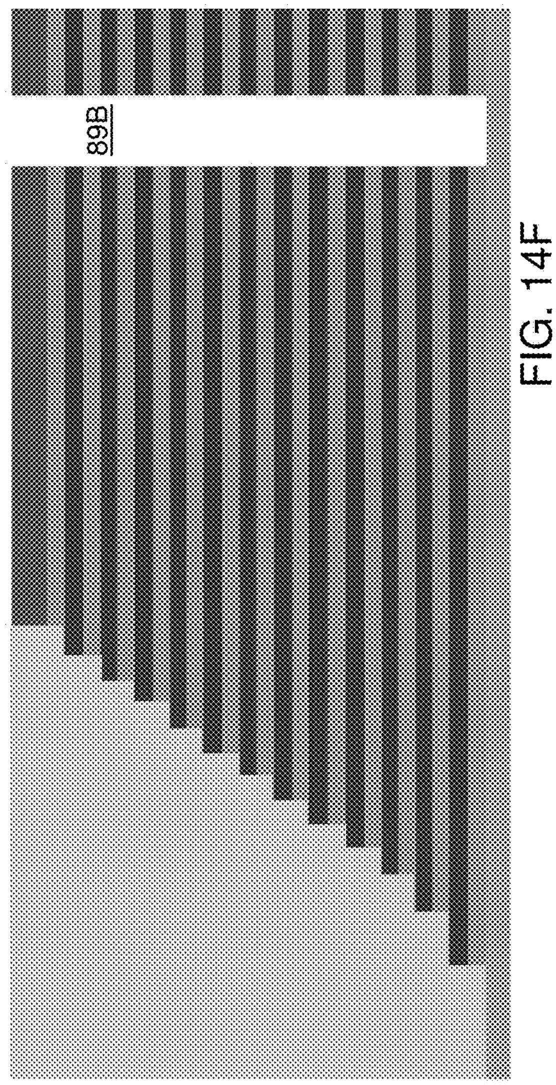

FIGS. 14E-14G illustrate the next step in the process in which the lateral separation trenches 89A, 89B are formed in the stack (32, 42) at the same time as the backside contact trenches 79, similar to that shown in FIGS. 7A-7D (the backside contact trenches are not shown in FIGS. 14E-14G for compactness). As shown in FIG. 14E, the lateral separation trenches include first trenches 89A which extends in the bit line direction hd2, similar to trenches 89 shown in FIG. 7B. However, in this embodiment, the lateral separation trenches also include at least one second trench 89B which extend in the word line direction hd1, similar to the pillar 7P shown in FIG. 7B. The second trench 89B connects the end portions of the first trenches 89A near the end of the capacitor region 400 closest to the memory device region 100 and farthest from the stepped surface in region 400.

Figure 14J:
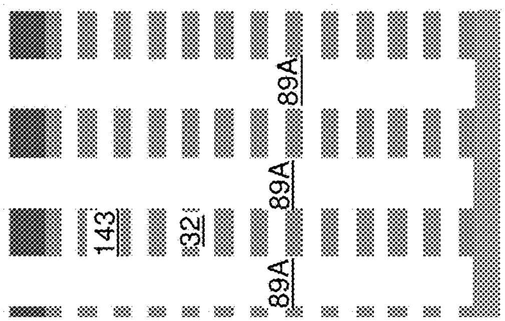
Figure 14H:
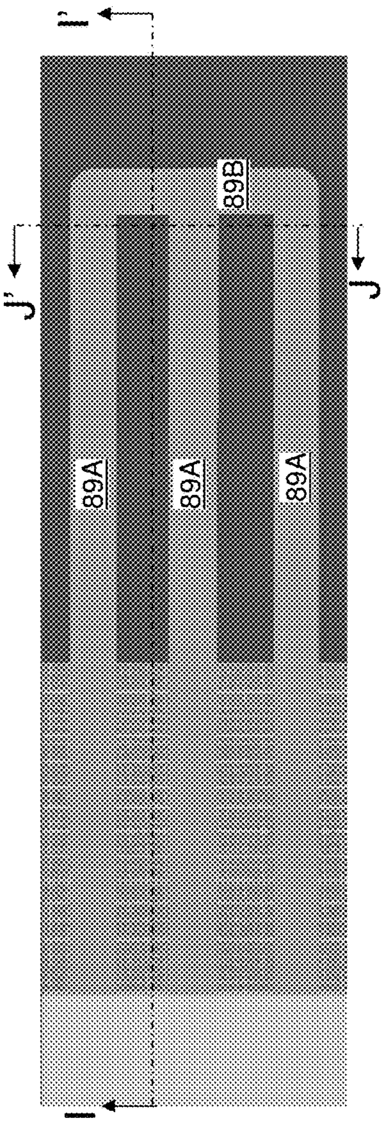
Figure 14I:
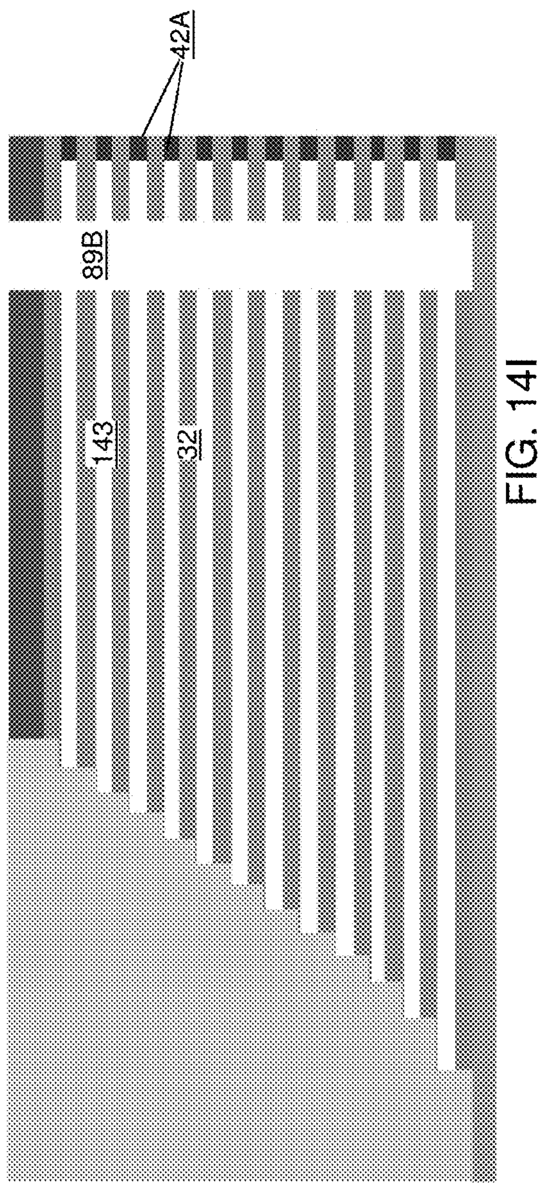

As shown in FIGS. 14H-14J, portions of sacrificial material layers 42 are selectively removed from the alternating stack in regions 100, 300 and 400 through the trenches 89A, 89B and the backside contact trenches 79, similar to that shown in FIGS. 8A-8C. However, unlike the prior embodiment shown in FIGS. 8A-8C, portions 42A of the sacrificial material layers 42 remain in the alternating stack near the end of the capacitor region 400 closest to the memory device region 100 and farthest from the stepped surface in region 400. Thus, each backside recess 143 abuts a portion 42A of the sacrificial material layers 42. These portions 42A (instead of the elongated pillar 7P in the prior embodiment) electrically insulate region 400 from region 100.

Figure 14M:
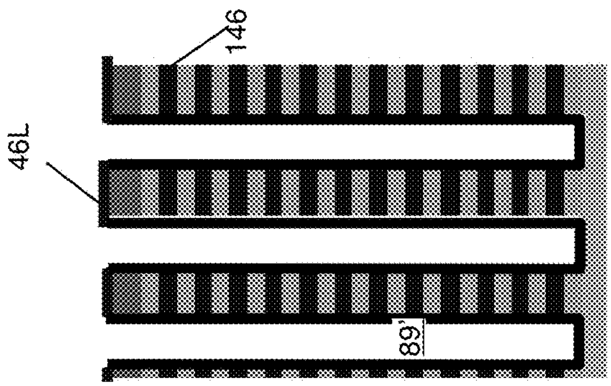
Figure 14K:
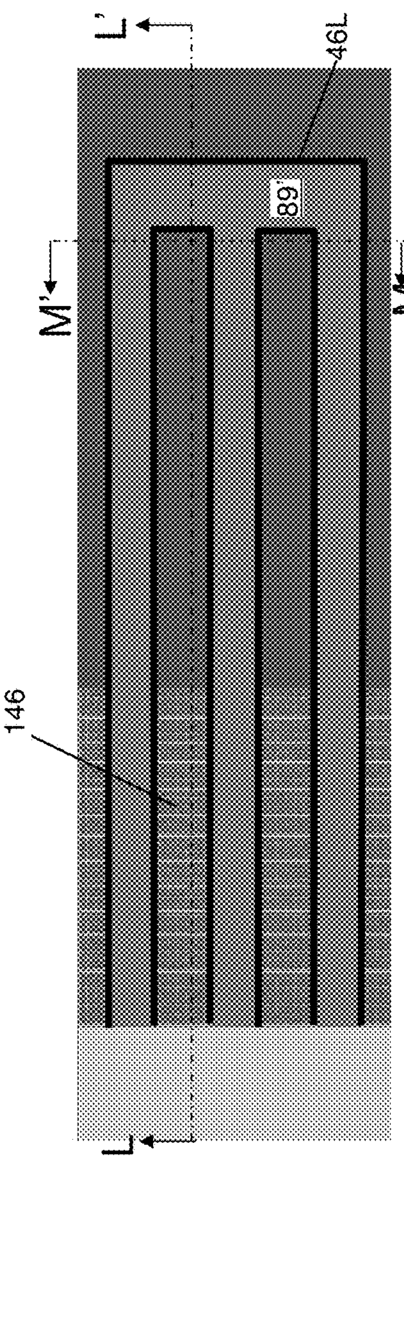
Figure 14L:
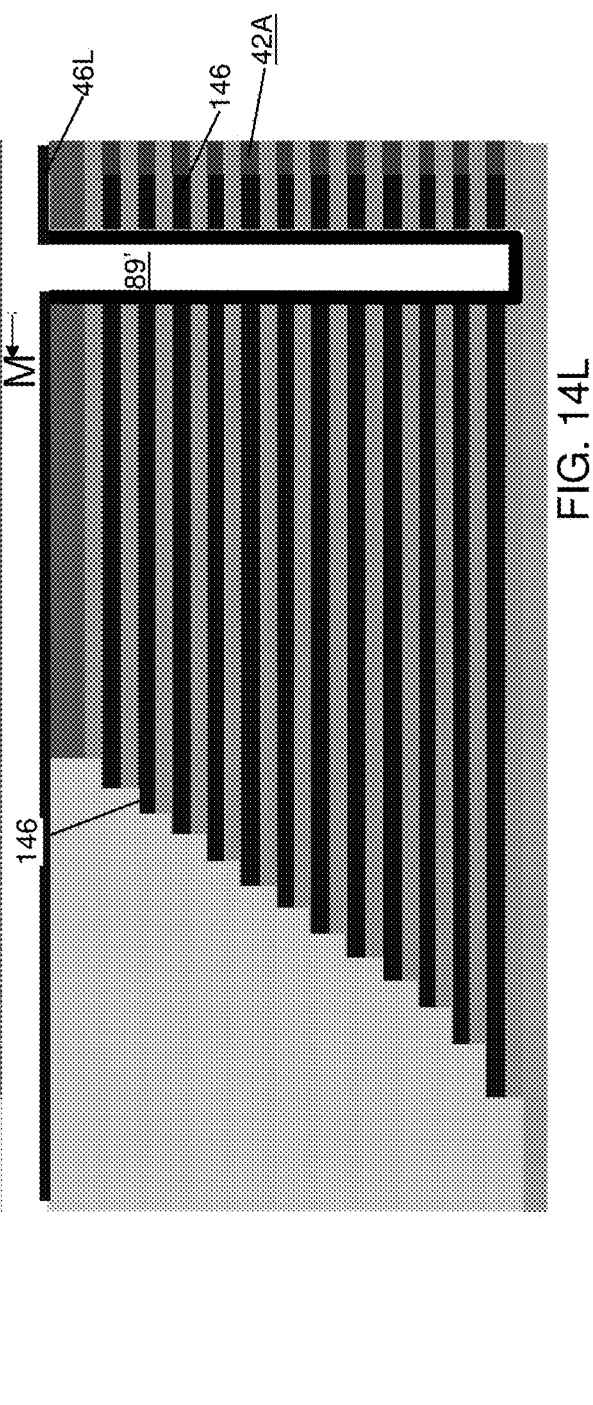

A plurality of first electrically conductive layers 46 (e.g., word lines/control gates which extend in the word line direction hd1) can be formed in the plurality of first backside recesses 43 in the memory device region 100 and in region 300, as described above with respect to FIGS. 9A-9B. As shown in FIGS. 14K-14M, a plurality of second electrically conductive layers 146 can be formed in the plurality of second backside recesses 143 at the same time as layers 46.

A contiguous conductive material layer 46L can be formed on the sidewalls of the trenches 89A, 89B, the backside contact trenches 79 (as described above) and over the topmost layer of the structure. The layer 46L partially fills the trenches 89A, 89B to leave remaining trenches 89'.

Referring to FIGS. 14N-14P, the deposited conductive material of the contiguous conductive material layer 46L is etched back from the sidewalls of each backside contact trench 79, from the sidewalls of each lateral separation trenches 89', and from the dielectric material layer 73, similar to that described above with respect to FIGS. 10A-10B. This leaves electrically conductive layers 146 which function as capacitor electrodes in region 400 separated from each other by trenches 89A and 89B. The electrically conductive layers 146 between trench 89B in region 400 and region 100 are separated from electrically conductive layers 46 in region 100 by the remaining portions 42A (e.g., silicon nitride or other insulating material layer portions) of layers 42.

Figure 14S:
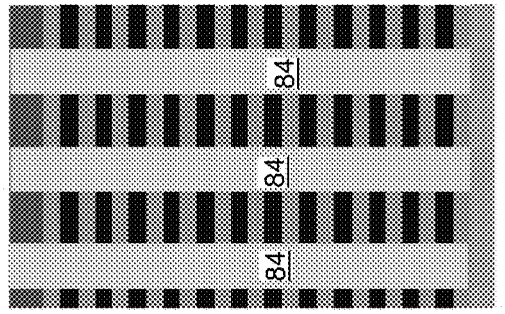
Figure 14Q:
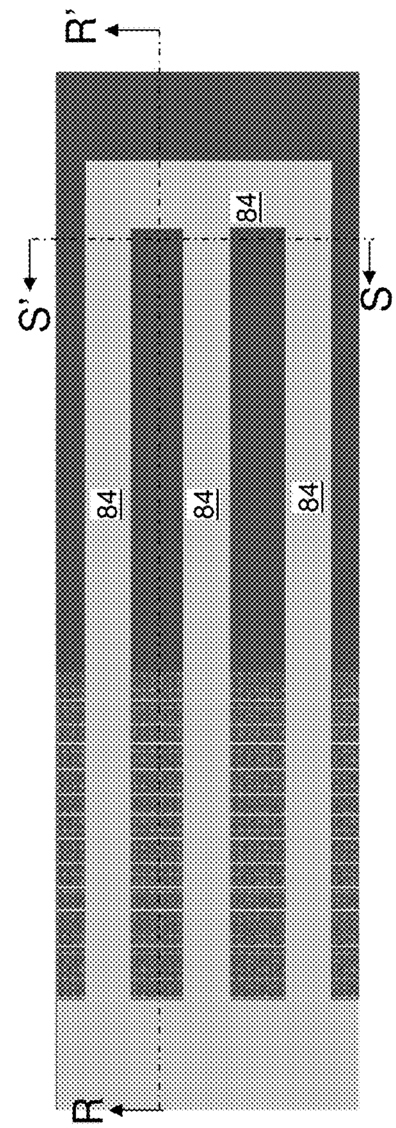
Figure 14R:
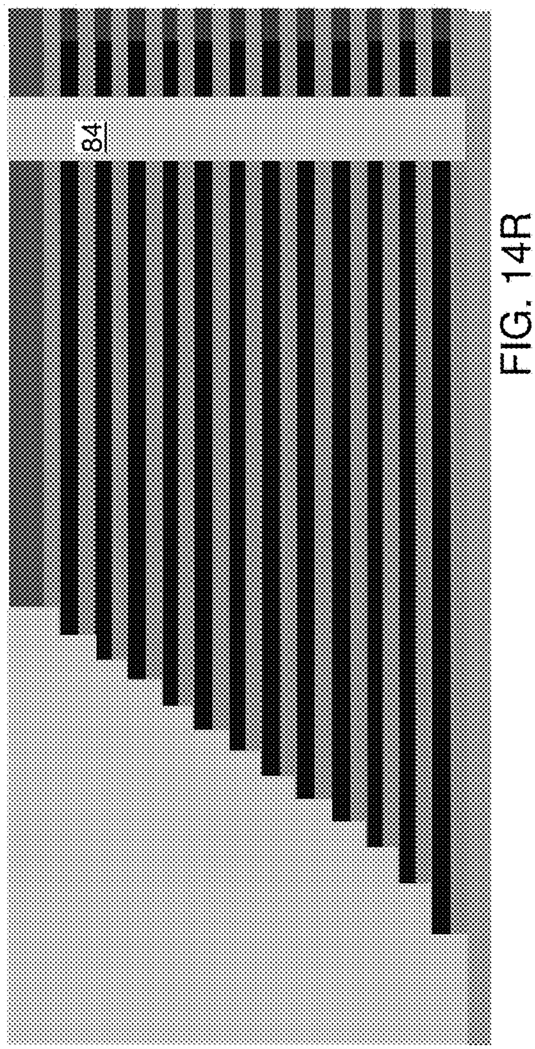
Figure 14V:
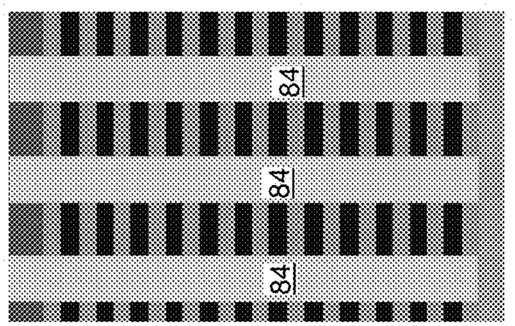

Referring to FIGS. 14Q-14S, the lateral separation trenches 89A, 89B can be completely filled with the dielectric material to form trench fill dielectric material portions 84, while the backside contact trenches 79 are not completely filled with the dielectric material, as described above with respect to FIGS. 11A-11B. The insulating spacer 74 can be formed in the backside contact trenches and filled with a conductive material to form a backside contact via structure 76 which extends in the word line direction hd1, as shown in FIG. 14X and as described above with respect to FIGS. 11A-11B.

As described above with respect to FIGS. 12A-12D, first subset of the vertically-extending cavities can extend to stepped surfaces of the first electrically conductive layers 46 in region 300 adjacent to the memory device region 100. A second subset of the vertically-extending cavities (subsequently filled with capacitor contact via structures 8C) can extend to stepped surfaces of the second electrically conductive layers 146 in the capacitor region 400. Another subset of the vertically-extending cavities (subsequently filled with drain contact via structures 88) can extend to top surfaces of the drain regions 63.

Referring to FIGS. 14T-14X, at least one conductive material is deposited in the vertically-extending cavities to fill each of the vertically-extending cavities with capacitor contact via structures 8C formed in the capacitor region 400, drain contact via structures 88 formed in the memory device region 100, and control gate contact via structures 304 that are formed in a stepped surface region 300 adjacent to the memory device region 100.

The portions 146A of the electrically conductive layers 146 that are electrically insulated from layers 46 by the trench fill dielectric material portions 84 and which are contacted by via structures 8C comprise capacitor electrodes. The portions 32A of the electrically insulating layers 32 in region 400 located between the capacitor electrodes 146A comprise capacitor dielectrics.

Figure 14W:
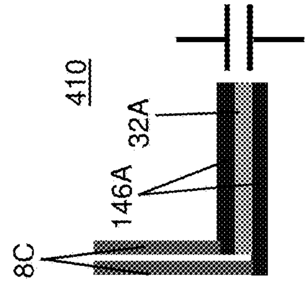
FIG. 14W is a schematic of a resulting capacitor that includes adjacent electrode plates separated by an insulating layer, and respective electrical contacts (e.g., capacitor contact via structures) to the electrode plates.
Figure 14T:
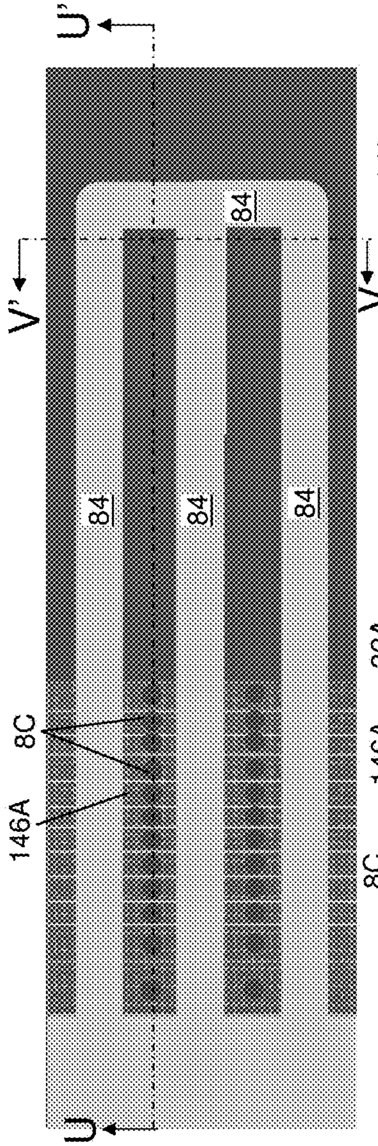
Figure 14U:
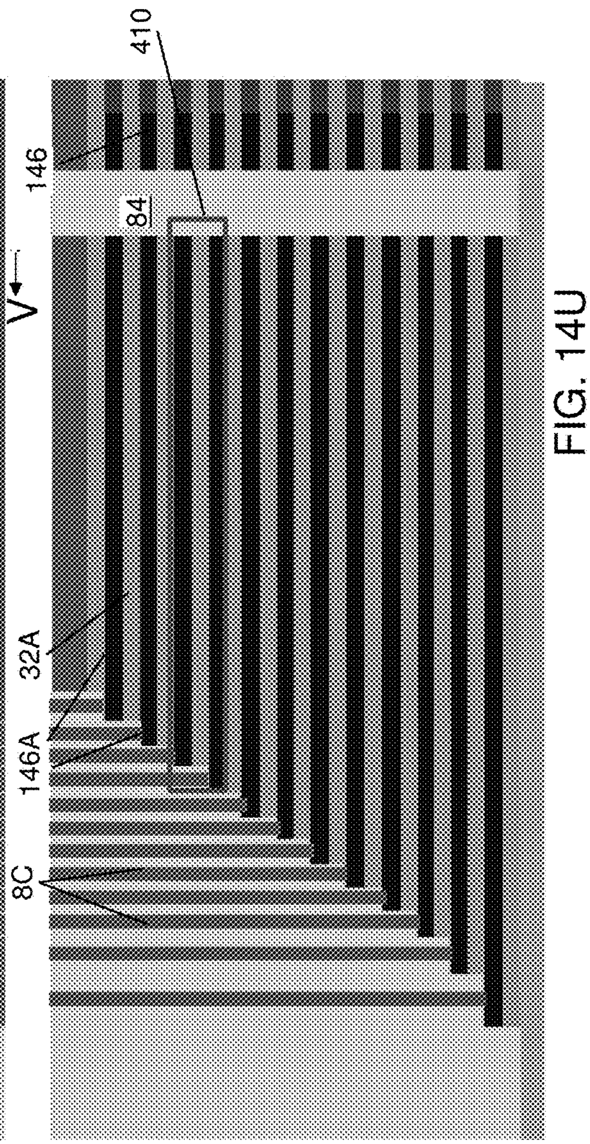

As shown in FIGS. 14U and 14W, a resulting capacitor 410 includes adjacent electrode plates 146A separated by an insulating layer 32A, and respective electrical contacts (e.g., capacitor contact via structures 8C) to the electrode plates 146A.

Figure 14X:
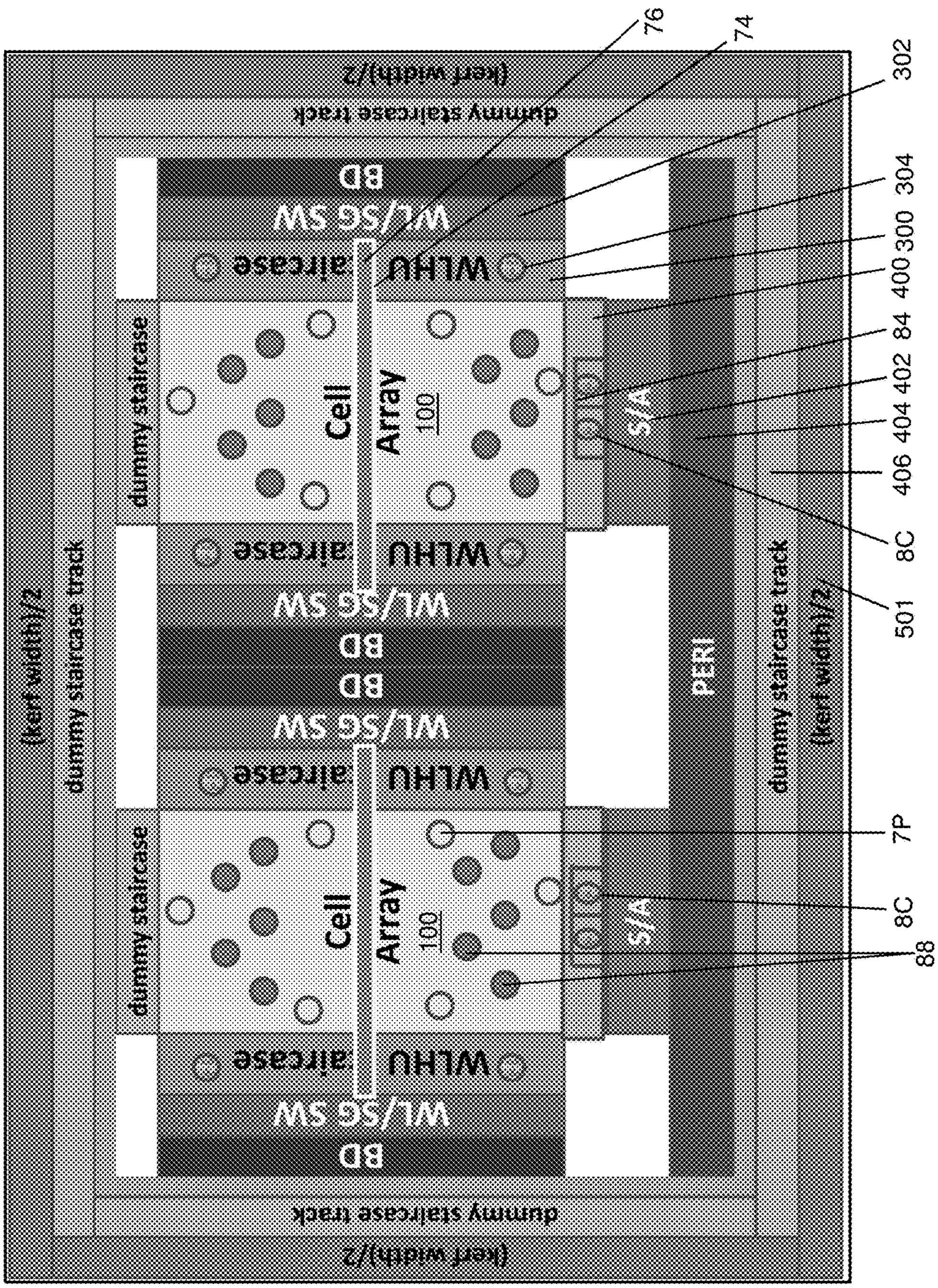

Thus, as shown in FIG. 14X, in the first embodiment and in the alternative embodiment described above, a three dimensional memory device (e.g., such as the NAND device) includes the memory device region 100 containing a plurality of non-volatile memory devices (e.g., the NAND strings), a peripheral device region 402/404 containing active driver circuit devices (e.g., transistors), and first stepped surface region 400 located between the peripheral device region 402/404 and the memory device region 100, and containing a plurality of passive driver circuit devices, such as capacitors 410 or resistors as will be described with respect to additional embodiments below. In should be noted that the peripheral device region 402/404, the dummy staircase track 406 and the kerf region 501 may also contain additional passive devices (e.g., capacitors or resistors) or it may contain no passive devices. Thus, the capacitors 410 may be located in dummy staircase track 406 if desired. Likewise, region 400 may also contain additional active devices (e.g., transistors) or it may contain no active devices.

As described above, the stack of alternating layers including electrically insulating layers 32 and electrically conductive layers (46, 146) located over the substrate 10. The first stepped surface region 400 contains first portions of the electrically insulating layers 32 and first portions of the electrically conductive layers 146, and the first stepped region 400 is located on a first side of the stack facing the peripheral region. The second stepped surface region 300 contains second portions of the electrically insulating layers 32 and second portions of the electrically conductive layers 46 located on a second side of the stack (e.g. at a side perpendicular to the first side).

As described above, a plurality of semiconductor channels 60 are located in the memory device region 100 in the stack, such that at least one end portion of each of the plurality of semiconductor channels extends substantially perpendicular to a top surface of the substrate 10. A plurality of charge storage elements (i.e., portions of the memory films 50) are located adjacent to a respective one of the plurality of semiconductor channels 60. A plurality of passive device contact via structures (e.g., capacitor via structures 8C) extend extending substantially perpendicular to the top surface 7 of the substrate 10 to the respective first portions of the electrically conductive layers 146 in the first stepped surface region 400. A plurality of control gate contact via structures 304 extend substantially perpendicular to the top surface 7 of the substrate 10 to the respective second portions of the electrically conductive layers 46 in the second stepped surface region 300.

The peripheral device region contains sense amplifiers in region 402. The second stepped surface region 300 comprises a word line stepped surface region 300. The second portions of the electrically conductive layers 46 comprise a plurality of control gate electrodes extending substantially parallel to the top surface of the substrate, and the plurality of control gate electrodes comprise at least a first control gate electrode located in the first device level and a second control gate electrode located in the second device level.

In the above embodiments, the passive driver circuit devices comprise capacitors 410, and the first portions 146A of the electrically conductive layers 146 comprise a plurality of capacitor electrodes. The first portions of the electrically insulating layers 32 in region 400 comprise capacitor dielectrics located between the capacitor electrodes 146A. The respective first 146A and second 46 portions of each of the electrically conductive layer are located at the same level above the substrate and are electrically insulated from each other (e.g., by material 84 and/or optionally by pillar 7P).

Figure 14Y:
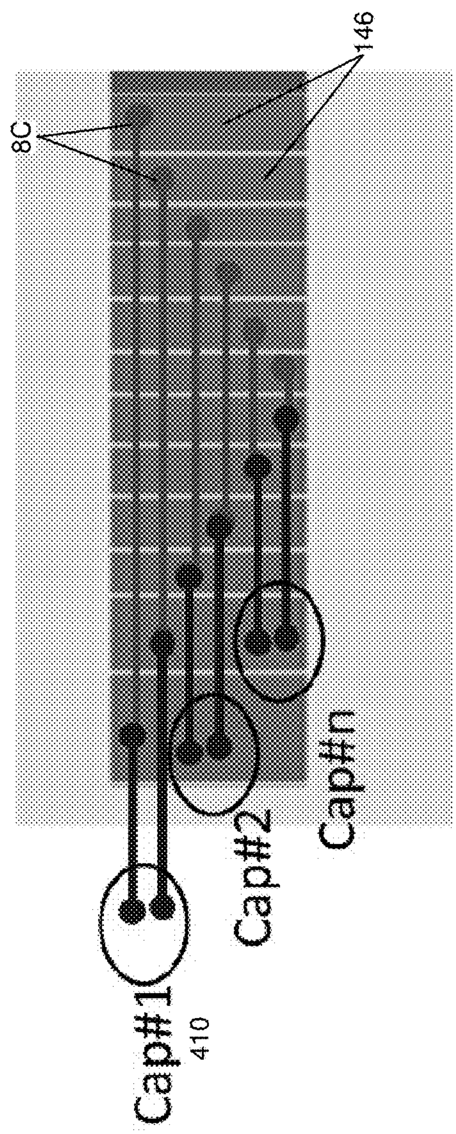
FIGS. 14Y and 14Z are schematic top down views of capacitor interconnection schemes of embodiments of the invention.

As shown in FIG. 14Y, N/2 capacitors 410 may be formed from N layers 146 in the stack, where N is any integer greater than 1. However, as described above with respect to FIGS. 13A-13D, layers 146 at the top of the stack are shorter than layers 146 at the bottom of the stack. This causes the capacitors to be of unequal size.

Figure 14Z:
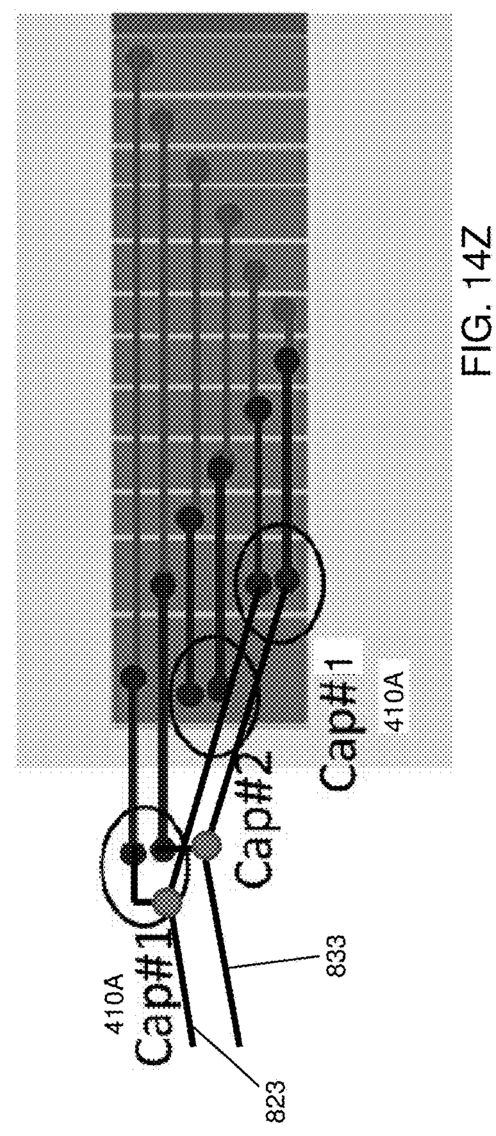

FIG. 14Z illustrates a capacitor interconnection configuration similar to that of FIGS. 13A-13D, where the longest layer 146 is electrically connected by interconnect (e.g., metal line) 833 to the second shortest layer 146 in the stack to form one capacitor electrode. The next longest layer 146 in the stack is electrically connected by interconnect (e.g., metal line 823) to the shortest layer 146 in the stack to form another capacitor electrode. The remaining layers 146 in the stack may be connected in a similar way. This results in a capacitor 410A having two overlying layers 146 of different length connected to each other to form an overlying electrode and two underlying layers 146 of different length connected to each other to form an underlying electrode, where the average electrode length of all capacitors in the stack is about the same. This results in N/4 capacitors in a stack containing N layers 146.

Figure 15A:
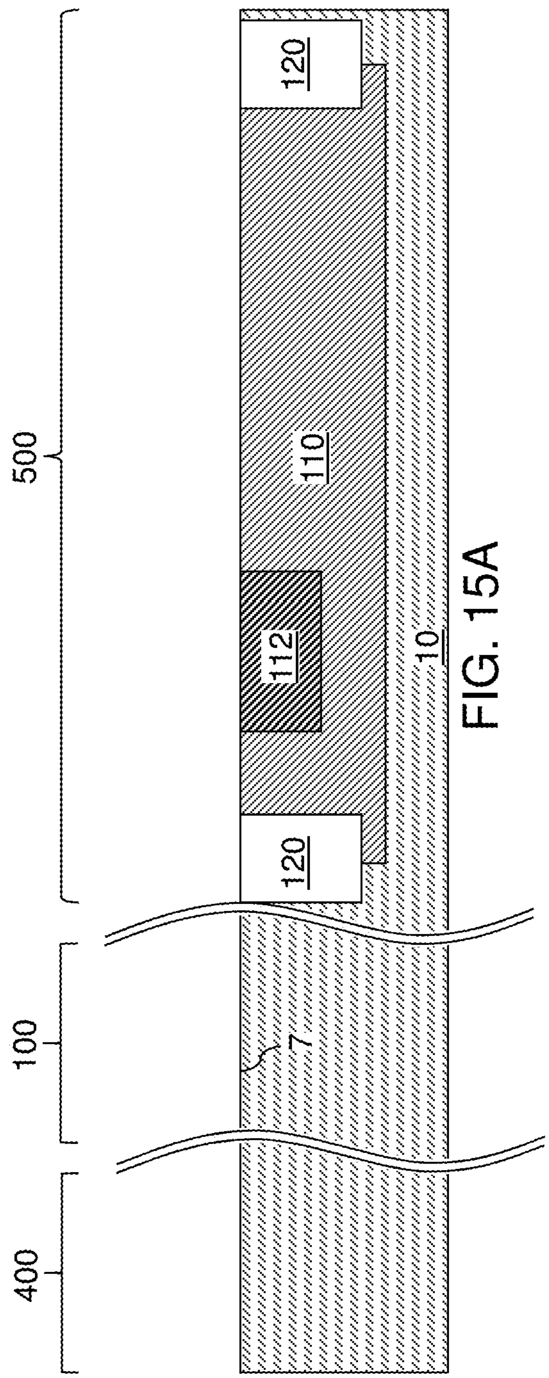
FIG. 15A is a vertical cross-sectional view of a second exemplary structure after formation of a doped semiconductor well and an optional doped contact region according to a second embodiment of the present disclosure.
Figure 37:
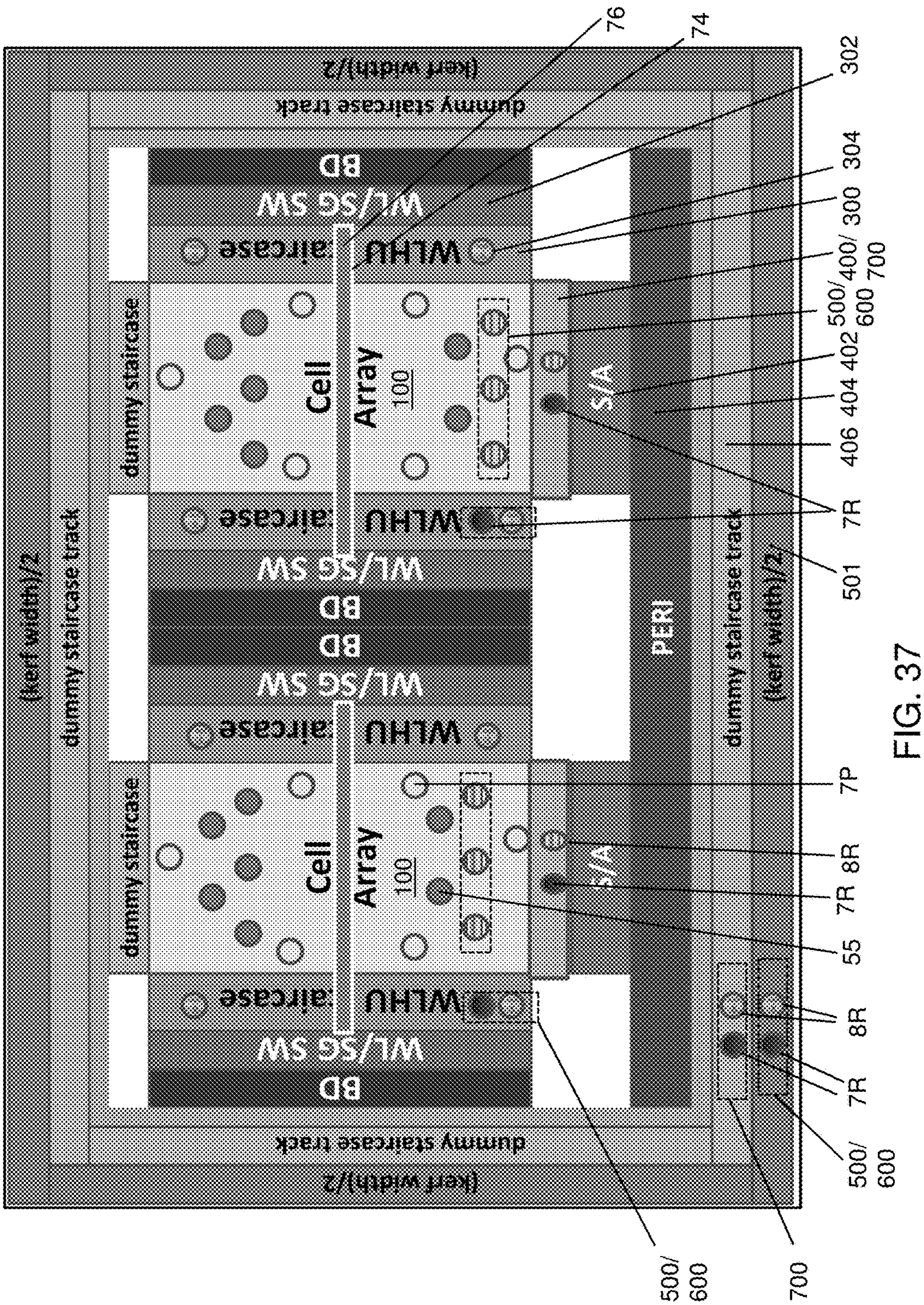
FIG. 37 is a schematic top down view of devices of embodiments of the invention.

In a second exemplary structure according to a second embodiment of the present disclosure the passive device of the driver circuit comprises a pillar shaped resistor. Referring to FIG. 15A, a substrate includes a semiconductor material layer 10 having a major surface 7. A doped semiconductor well 110 can be formed in a device region, which is herein referred to as a resistor region 500. The resistor region 500 may be located in a portion of the memory device region 100, as shown in FIG. 37. A memory device region 100 and a capacitor region 400 can be provided for formation of the devices illustrated in the first embodiment. The semiconductor material layer 10 can have a doping of a first conductivity type (which can be p-type or n-type), and the doped semiconductor well 110 can have a doping of a second conductivity type which is the opposite of the first conductivity type. In one embodiment, the concentration of electrical dopants (which can be p-type dopants or n-type dopants) in the doped semiconductor well 110 can be in a range from $1.0\times10^{17}/cm^3$ to $2.0\times10^{21}/cm^3$, although lesser and greater dopant concentrations can also be employed. In one embodiment, the doped semiconductor well 110 can include a conductive (e.g., degenerately doped semiconductor or metallic) material rather than a semiconductor material, i.e., a material having electrical conductivity greater than $1.0\times10^5$ S/cm. The doped semiconductor well 110 is a laterally-extending semiconductor or conductive structure, and can consist of at least one single crystalline semiconductor material portion having a doping of the second conductivity type (e.g., n-type well) and located in the substrate 10 (e.g., p-type substrate or substrate well). Optionally, a doped contact region 112 can be formed, which has a doping of the same conductivity type (e.g., n-type) as the doped semiconductor well 110 and has a greater dopant concentration than the doped semiconductor well 110 (e.g., N+ well). Optionally, shallow trench isolation structures 120 including at least one dielectric material can be formed at a periphery of the doped semiconductor well 110 for device isolation.

Figure 15B:
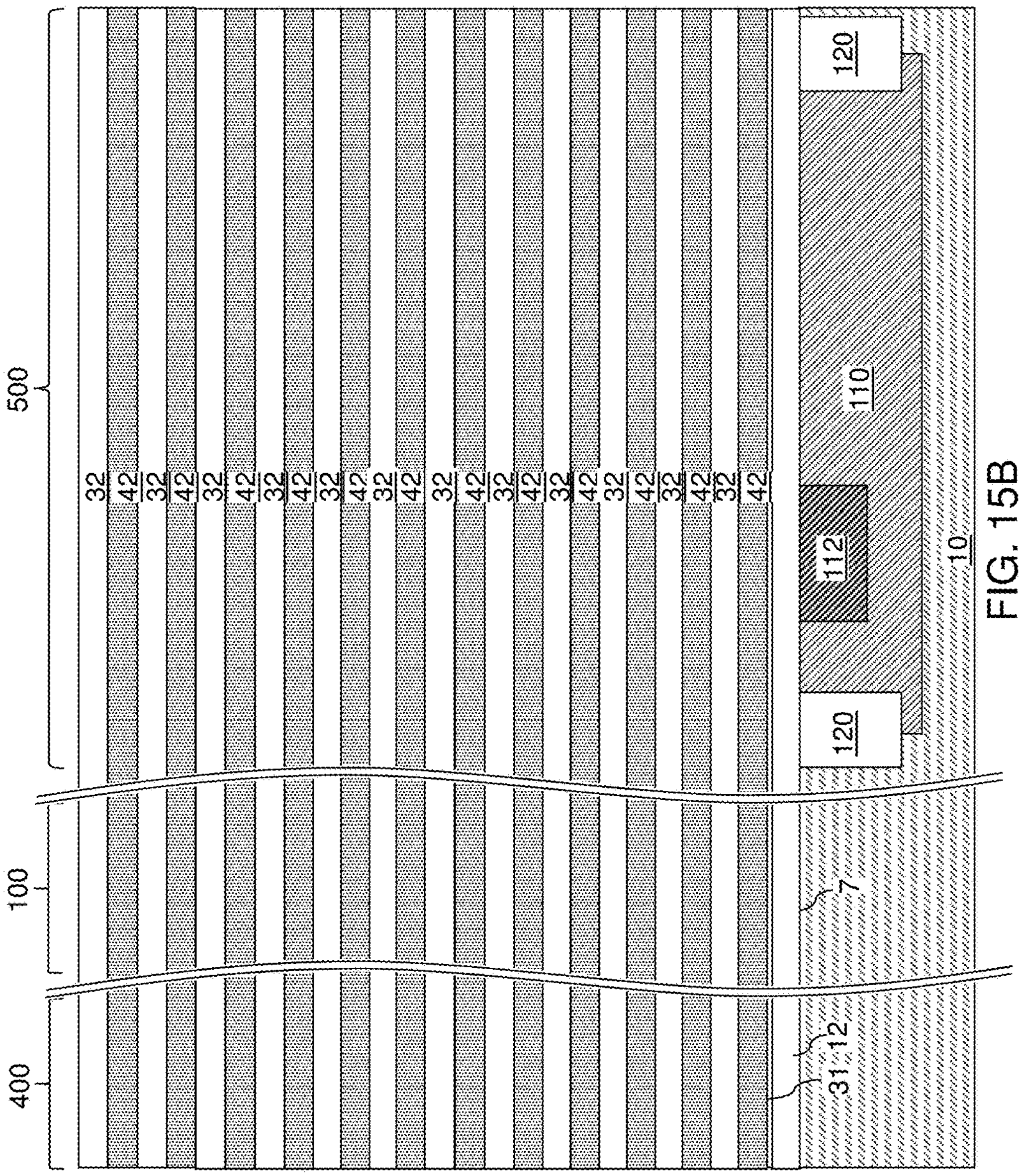
FIG. 15B is a vertical cross-sectional view of the second exemplary structure after formation of an alternating stack of first material layers and second material layers according to the second embodiment of the present disclosure.

Referring to FIG. 15B, the processing steps of FIG. 1 are performed to form a stack (32, 42) of alternating layers including the first material layers 32 and the second material layers 42.

Figure 16:
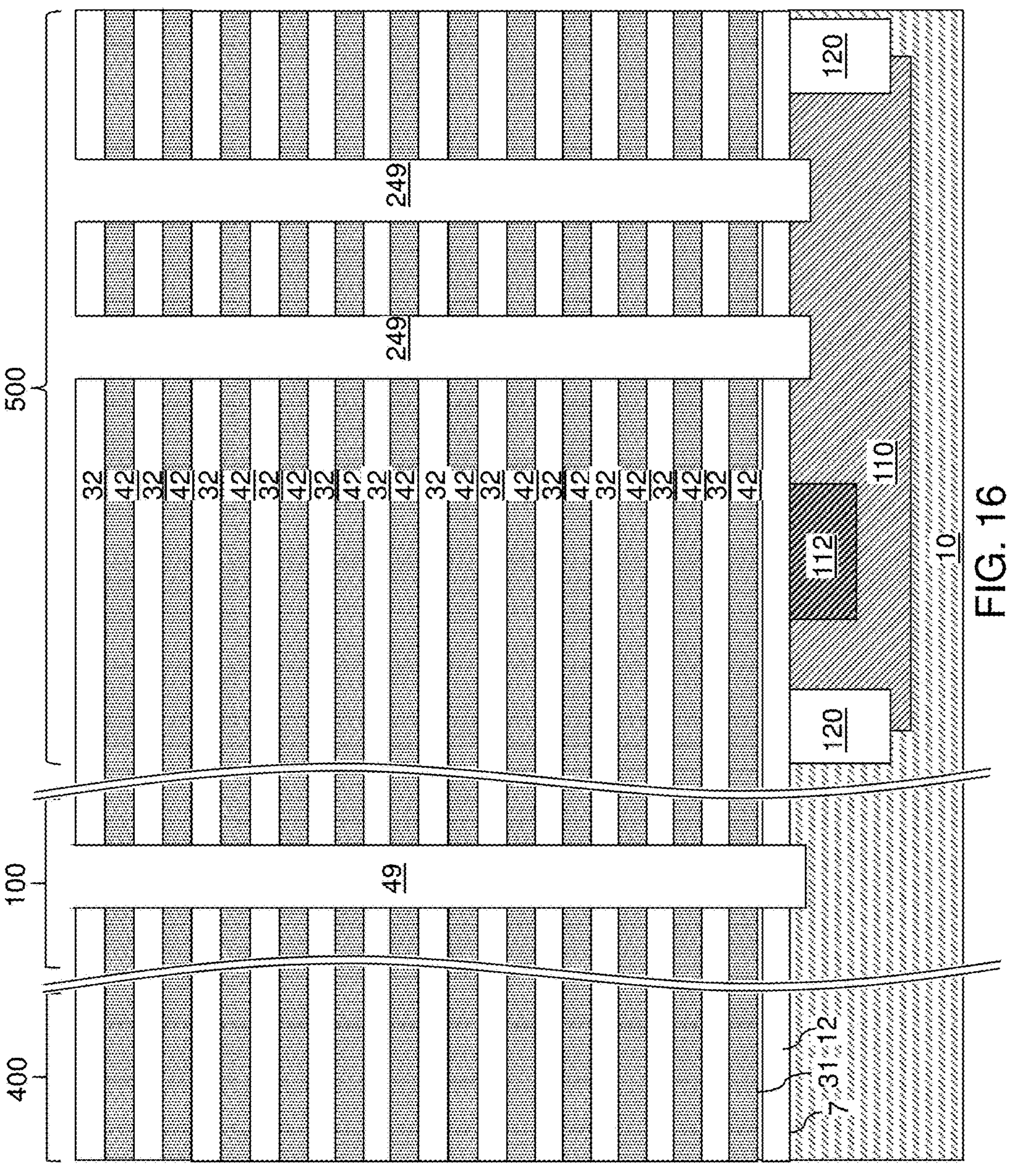
FIG. 16 is a vertical cross-sectional view of the second exemplary structure after formation of memory openings and vertically-extending cavities according to the second embodiment of the present disclosure.

Referring to FIG. 16, memory openings 49 are formed in the memory device region 100 and at least one resistor opening 249 can be formed in the resistor region 500. The memory openings 49 and the at least one resistor opening 249 can be formed simultaneously employing the same processing steps employed to form the memory openings of the first embodiment. The size of each resistor opening 249 may be the same as, or may be different from, the size of the memory openings 49. If a plurality of resistor openings 249 is formed, the resistor openings 249 can have the same size, or can have different size. The size of the resistor openings 249 can be adjusted depending on the target resistance of a resistor to be subsequently formed. In one embodiment, the resistance of a resistor to be formed in a resistor opening 249 is generally inversely proportional to the diameter (or a lateral dimension if a non-circular cross-sectional shape is employed) of the resistor opening 249. The bottom of each resistor opening 249 can extend to a top surface of the doped semiconductor well 110.

Each resistor opening 249 is a vertically-extending cavity that extends from a first horizontal plane including a top surface of the alternating stack (32, 42) to the laterally-extending semiconductor or conductive structure of the combination of the doped semiconductor well 110 and the doped contact region 112. A physically exposed portion of the top surface of the laterally-extending semiconductor or conductive structure (i.e., the doped semiconductor well 110) is present within a second horizontal plane located underneath, and vertically spaced by a plurality of layers within the alternating stack (32, 42) from, the top surface of the alternating stack (32, 42). The second horizontal plane is the plane including the bottom surface of each resistor opening 249, which is the recessed, or non-recessed, top surface of the doped semiconductor well 110.

Figure 17:
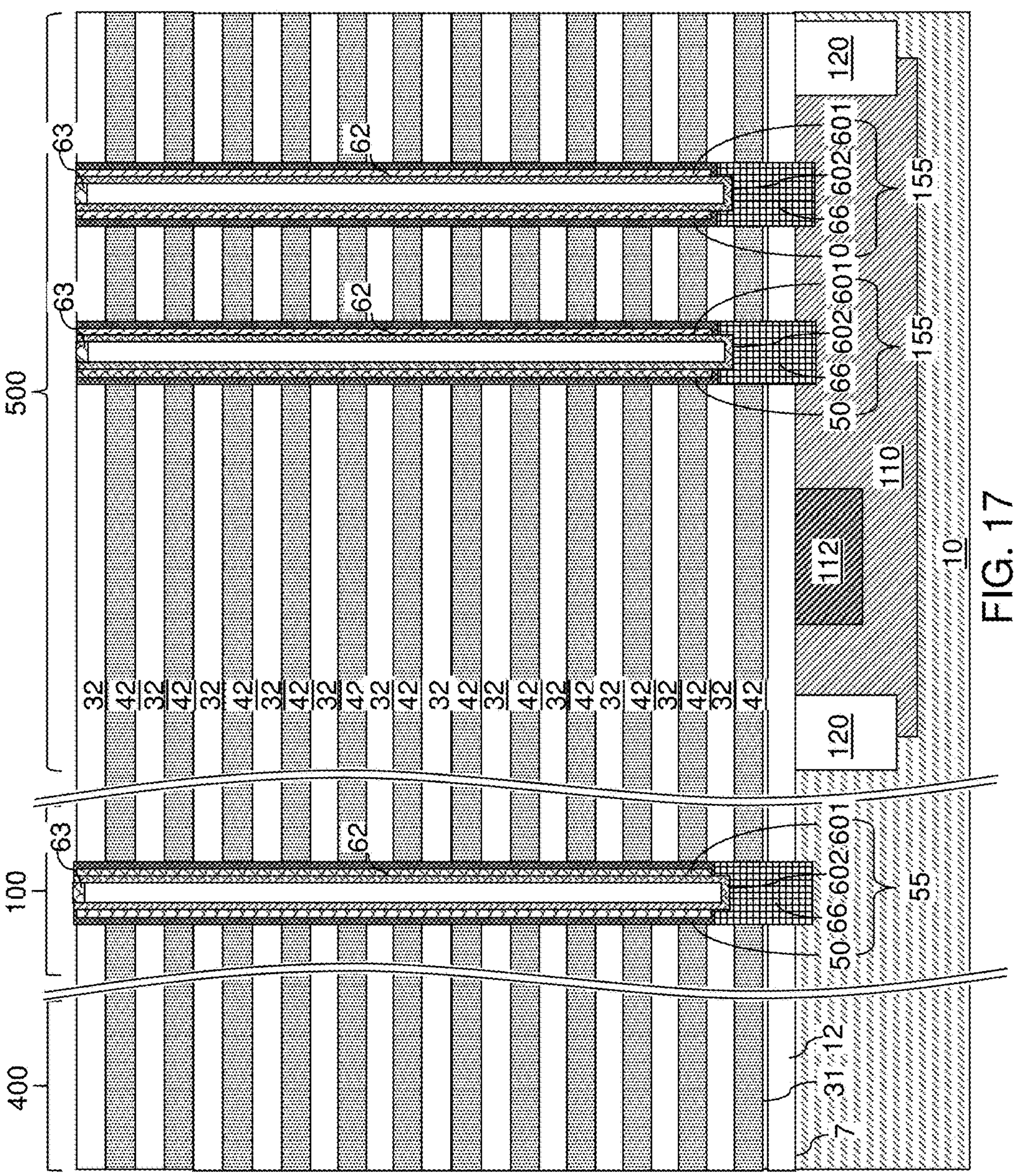
FIG. 17 is a vertical cross-sectional view of the second exemplary structure after formation of memory stack structures and pillar structures according to the second embodiment of the present disclosure.

Referring to FIG. 17, the processing steps of FIG. 2 of the first embodiment can be performed to form memory stack structures 55 and at least one pillar structure 155 simultaneously. The memory stack structures 55 are formed in the memory openings 49 in the memory device region 100, and a pillar structure 155 is formed in each resistor opening 249 in the resistor region 500. Each pillar structure 155 can have the same set of components as a memory stack structure 55 and which are formed during the same formation (e.g., deposition) steps. Each component within a pillar structure 155 can have the same composition as the corresponding component (having the same reference numeral) within a memory stack structure 155. Each component within a pillar structure 155 can have the same height as the corresponding component within a memory stack structure 155. Except for an epitaxial channel portion 66 and a dielectric core 62, each component within a pillar structure 155 can have the same lateral dimension (such as a lateral thickness) as the corresponding component within a memory stack structure 155. If a horizontal cross-sectional shape of a pillar structure 155 is different from a horizontal cross-sectional shape of a memory stack structure 55 taken at a same vertical distance from the top surface of the substrate (10, 110, 112, 12), the epitaxial channel portion 155 and the dielectric core 62 within the pillar structure 155 can have different dimensions than the corresponding dimensions of a memory stack structure 55. If a horizontal cross-sectional shape of a pillar structure 155 is the same a horizontal cross-sectional shape of a memory stack structure 55 taken at a same vertical distance from the top surface of the substrate (10, 110, 112, 12), the epitaxial channel portion 66 and the dielectric core 62 within the pillar structure 155 can have the same dimensions as the epitaxial channel portion 66 and the dielectric core 62 within the memory stack structure 55.

A pillar structure 155 is formed within each resistor opening 249. A semiconductor channel (601, 602) is formed on each optional epitaxial channel portion 66, which is a single crystalline semiconductor material portion and is intrinsic or has a doping of the first conductivity type. The single crystalline semiconductor material portion in the resistor opening 249 (as embodied as an epitaxial channel portion 66 in the resistor opening 249) is formed simultaneously with formation of the epitaxial channel portions 66 in the memory openings 49. The first conductivity type is the conductivity type of the semiconductor material layer 10, and is the opposite of the conductivity type of the doped semiconductor well 110 (which has a doping of the second conductivity type). The memory films 50 in the memory stack structures 55 and the at least one pillar structure 155 can be a layer stack of dielectric material layers as described above, i.e., a stack of a blocking dielectric layer, a memory material layer, and a tunneling dielectric layer.

Each semiconductor channel (601, 602) in the memory openings 49 and the at least one resistor opening 249 can be formed by deposition of an intrinsic semiconductor material or a semiconductor material of the first conductivity type. The semiconductor channels (601, 602) can include a polycrystalline semiconductor material or an amorphous semiconductor material. A vertically-extending semiconductor material portion in each resistor opening 249 (as embodied in a semiconductor channel (601, 602) in the resistor opening 249) is formed simultaneously with formation of the semiconductor channels (601, 602) in the memory openings 49.

Each drain region 63 formed in the at least one resistor opening 249 is a doped semiconductor material portion, and is formed with a doping of the second conductivity type. The drain regions 63 of the memory stack structures 55 and each drain region 63 of the pillar structure 155 can be formed simultaneously.

Figure 18:
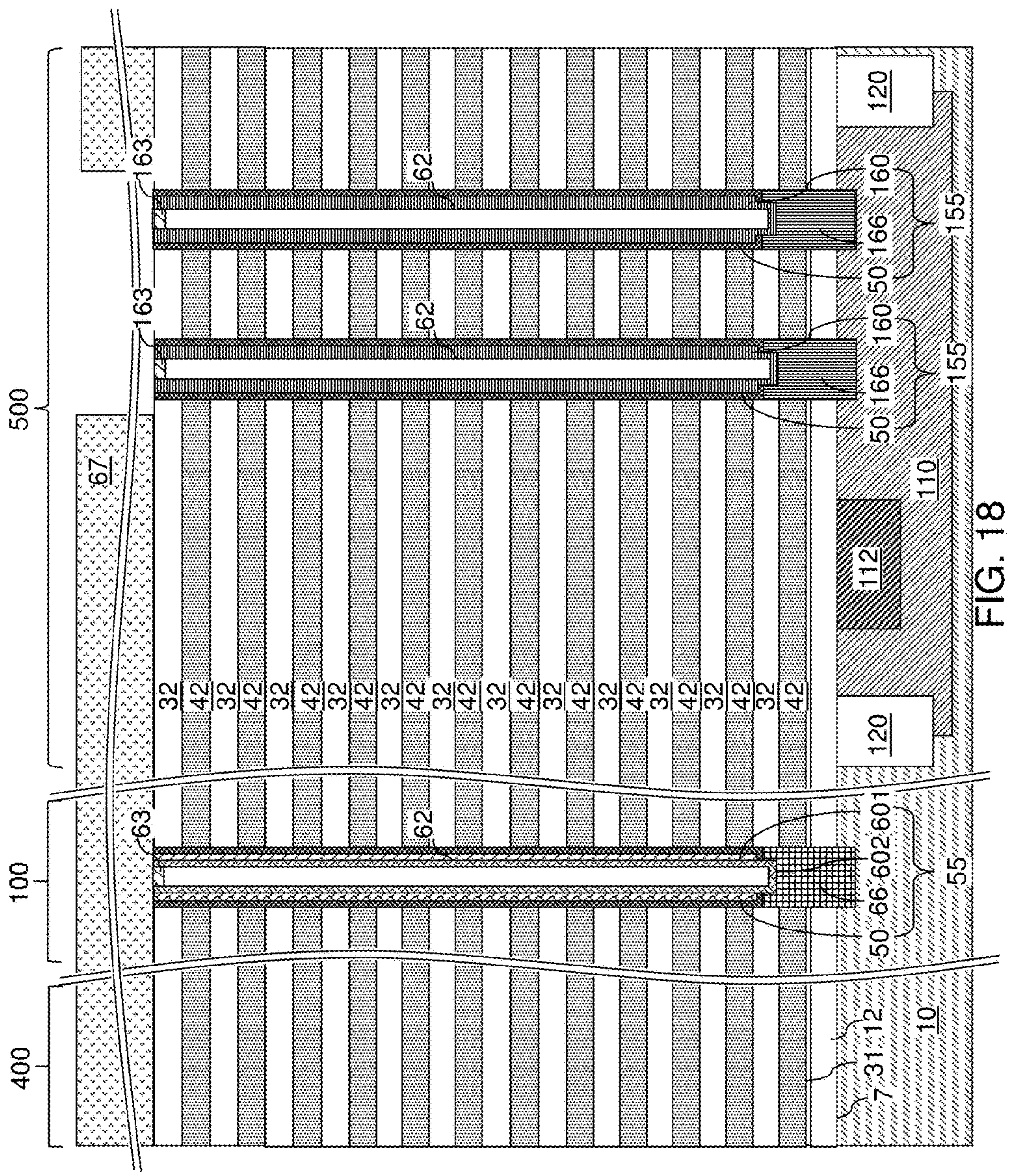
FIG. 18 is a vertical cross-sectional view of the second exemplary structure after implantation of dopants of a second conductivity type into the pillar structures according to the second embodiment of the present disclosure.

Referring to FIG. 18, a photoresist layer 67 is applied over the second exemplary structure, and is lithographically patterned to form openings in the resistor region 500. Specifically, an opening in the photoresist layer 67 is formed in an area including the at least one pillar structure 155 by patterning the photoresist layer 67. In one embodiment, the thickness of the photoresist layer 67 can be selected such that electrical dopants to be subsequently implanted into the at least one pillar structure 155 can be implanted to the bottommost portion of the at least one pillar structure 155, while the electrical dopants are not implanted into any portion of the memory stack structures 55 in the memory device region 100. In one embodiment, the thickness of the photoresist layer 67 can be greater than the thickness of the alternating stack (32, 42).

Electrical dopants of the second conductivity type (e.g., n-type) can be implanted into the vertically-extending semiconductor material portion (embodied as a semiconductor channel (601, 602)) in each pillar structure 155, while implantation of the electrical dopants of the second conductivity type into the semiconductor channels (601, 602) of the memory stack structures 55 is prevented by the presence of the patterned photoresist layer 67. All semiconductor material portions in the pillar structure 155 can be doped with the implanted dopants of the second conductivity type. The dose of the implanted dopants of the second conductivity type is selected such that all semiconductor material portions are doped in the pillar structure 155.

The implantation of the electrical dopants of the second conductivity type converts each epitaxial semiconductor channel 66 (which is intrinsic or has a doping of the first conductivity type as formed) in the at least one pillar structure 155 into a epitaxial doped semiconductor portion 166 having a doping of the second conductivity type. Further, the implantation of the electrical dopants of the second conductivity type converts each semiconductor channel (601, 601) in the at least one resistor opening 249 into a vertically-extending doped semiconductor portion, which is herein referred to as a first doped semiconductor portion 160. Each epitaxial doped semiconductor portion 166 and each first doped semiconductor portion 160 are doped semiconductor material portions, and are formed by ion implantation of electrical dopants of the second conductivity type such that an atomic concentration of the dopants of the second conductivity type in a range from $1.0\times10^{17}/cm^3$ to $1.0\times10^{20}/cm^3$ therein. In one embodiment, all semiconductor material within each pillar structure 155 can have a doping of a same conductivity type, which is the second conductivity type.

An epitaxial doped semiconductor portion 166 is located at a bottom portion of each vertically-extending cavity (i.e., a resistor opening 249), and comprises the same semiconductor material as the epitaxial channel portions 66 of the memory stack structures 55. In one embodiment, each first doped semiconductor portion 160 can comprise a doped polycrystalline semiconductor material portion that is formed directly on inner surfaces of at least one electrically insulating material (i.e., the dielectric material of the memory film 50) within a respective resistor opening 249. Each drain region 63 within the at least one pillar structure 155 is herein referred to as a second doped semiconductor portion 163.

Figure 19:
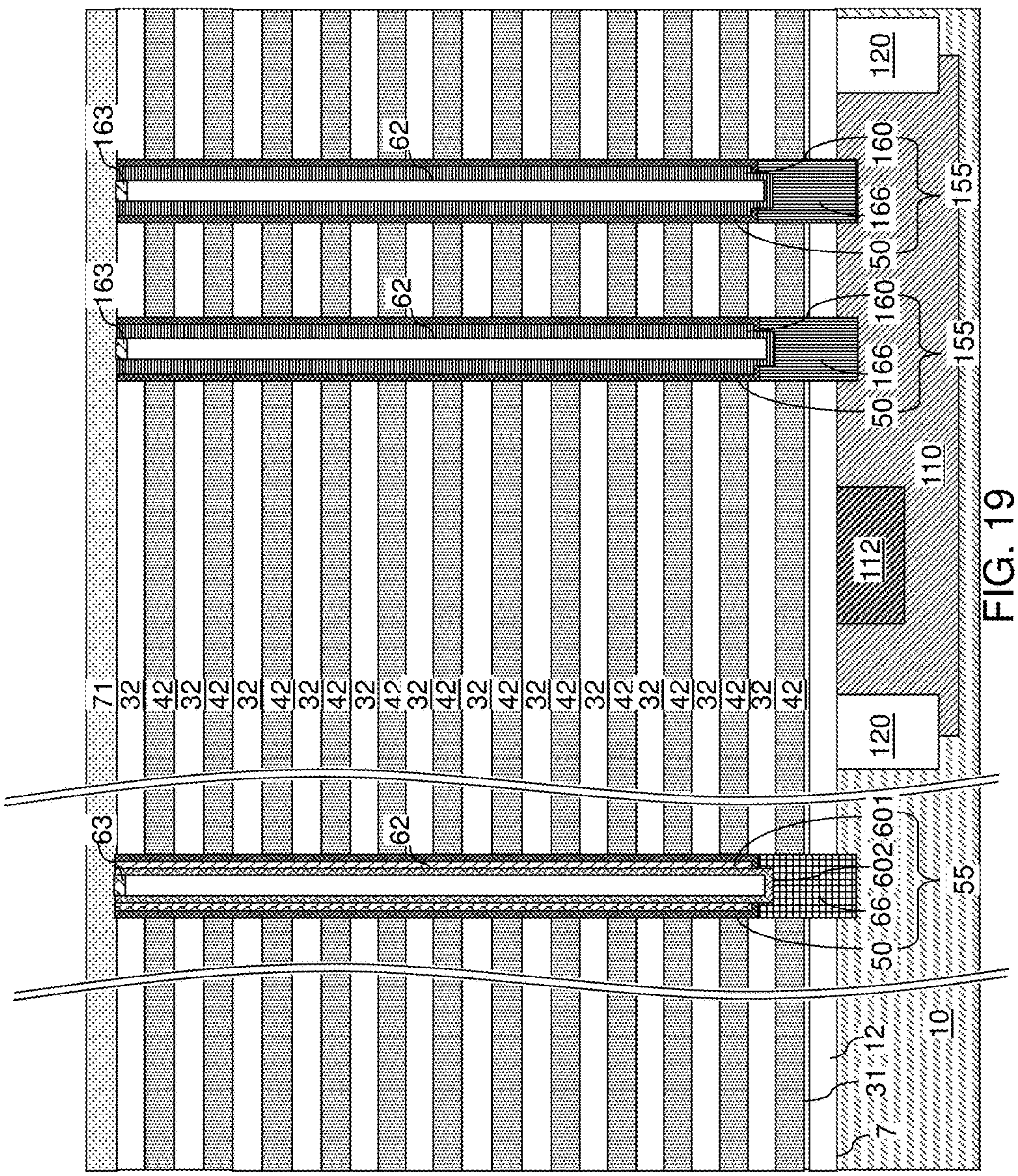
FIG. 19 is a vertical cross-sectional view of the second exemplary structure after formation of an optional insulating cap layer according to the second embodiment of the present disclosure.

Referring to FIG. 19, the patterned photoresist layer 67 can be removed, for example, by ashing. A dielectric cap layer 71 can be formed employing the same method as in the first embodiment (as illustrated in FIG. 2).

Figure 20:
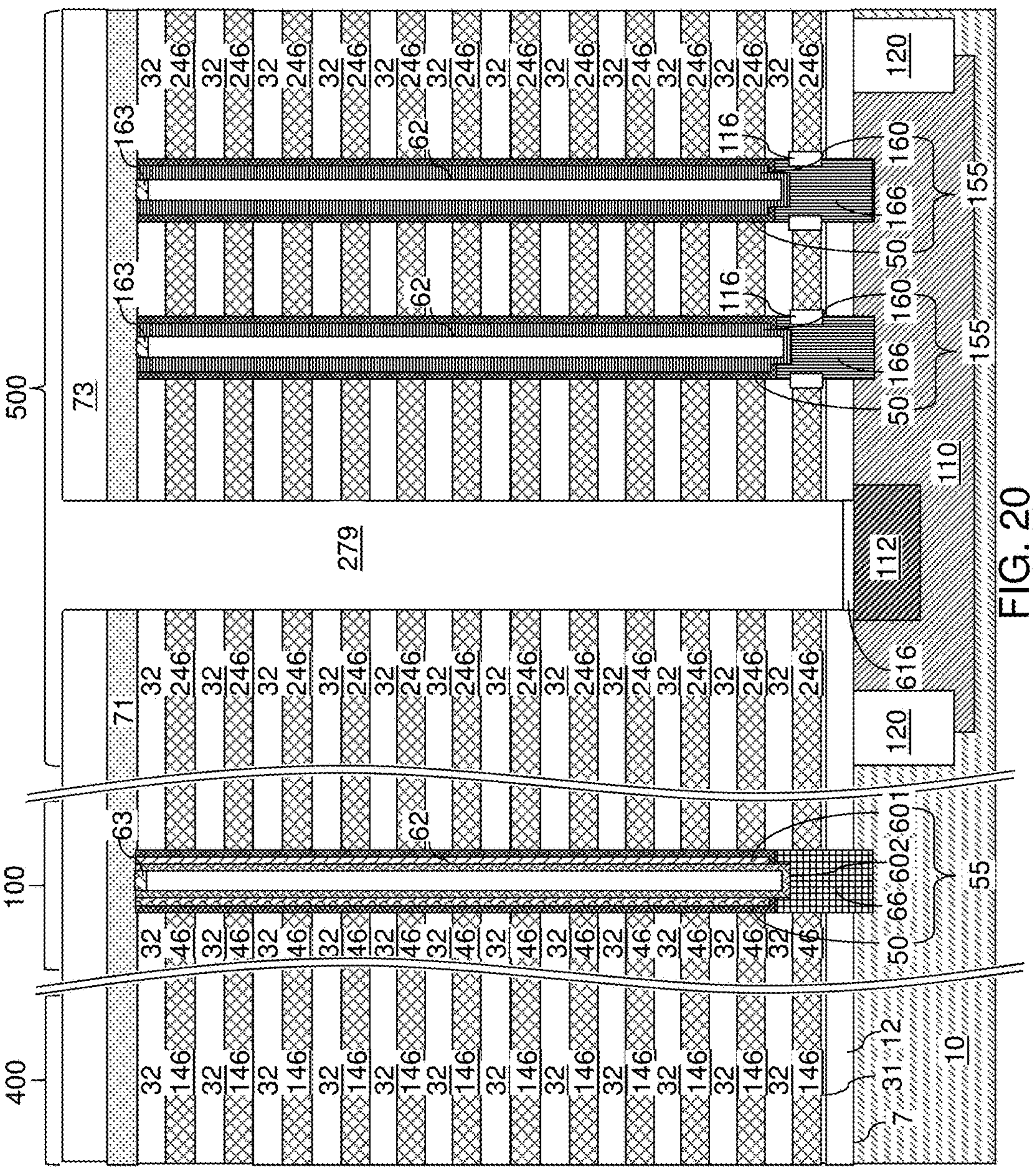
FIG. 20 is a vertical cross-sectional view of the second exemplary structure after formation of a resistor contact trench according to the second embodiment of the present disclosure.

Referring to FIG. 20, the processing steps of FIGS. 3, 4, 5A and 5B, 6A and 6B, and 7A-7C can be performed. Concurrently with formation of the backside contact trench 79 and optional formation of the lateral separation trenches 89 (See FIGS. 7B and 7C), a resistor contact trench 279 can be formed in an area overlying the doped contact region 112. The lateral separation trenches 89 may be omitted if the capacitor structures of the first embodiment are not to be formed.

The processing steps of FIGS. 8A-8C, 9A and 9B, and 10A and 10B can be subsequently performed to form first electrically conductive layers 46 in the memory device region 100, second electrically conductive layers 146 in the capacitor region 400, and third electrically conductive layers 246 in the resistor region 500. During the processing steps of FIGS. 8A-8C, portions of the sacrificial material layers 42 in the resistor region 500 can be removed by introduction of the etchant through the resistor contact trench 279 to form third backside recesses in each space from which the sacrificial material layers 42 are removed from the resistor region 500. The third electrically conductive layers 246 are formed in the third backside recesses by deposition of the same material as the first and second electrically conductive layers (46, 146) in the same processing step. The contiguous conductive material layer 46L can be deposited on the sidewalls of the resistor contact trench 279, and is subsequently removed from the sidewalls of the resistor contact trench 279 during the processing steps of FIGS. 10A and 10B.

Figure 21:
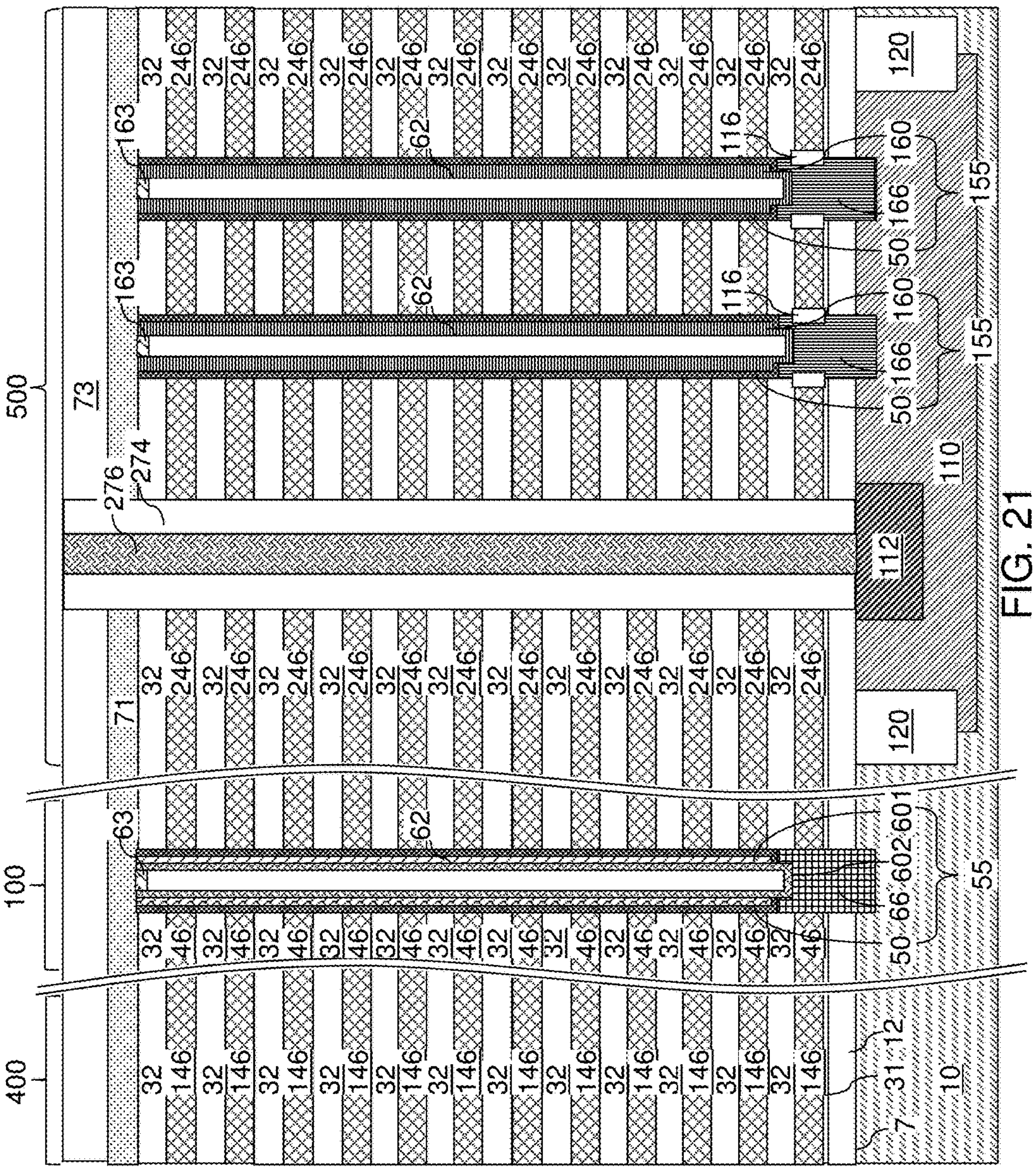
FIG. 21 is a vertical cross-sectional view of the second exemplary structure after formation of an insulating spacer and a substrate contact via structure according to the second embodiment of the present disclosure.

Referring to FIG. 21, the processing steps of FIGS. 11A and 11B can be performed to form an insulating spacer 274 in each resistor contact trench 279 concurrently with formation of the insulating spacer 74 in the backside contact trench 79. The insulating spacer 274 in the resistor region 500 can have the same composition as, and the same lateral thickness as, the insulating spacer 74 in the memory device region 100. A substrate contact via structure 276 can be formed in the cavity extending through the insulating spacer 274 in the resistor region 500. The substrate contact via structure 276 in the resistor region 500 can be formed concurrently with formation of the backside contact via structure 76 in the memory device region 100. The substrate contact via structure 276 is a contact via structure that contacts a top surface of a laterally-extending semiconductor or conductive structure (which is a combination of the doped semiconductor well 110 and the doped contact region 112). In one embodiment, the backside contact via structure 76 and the substrate contact via structure 276 can be formed by deposition of a metallic material.

Figure 22:
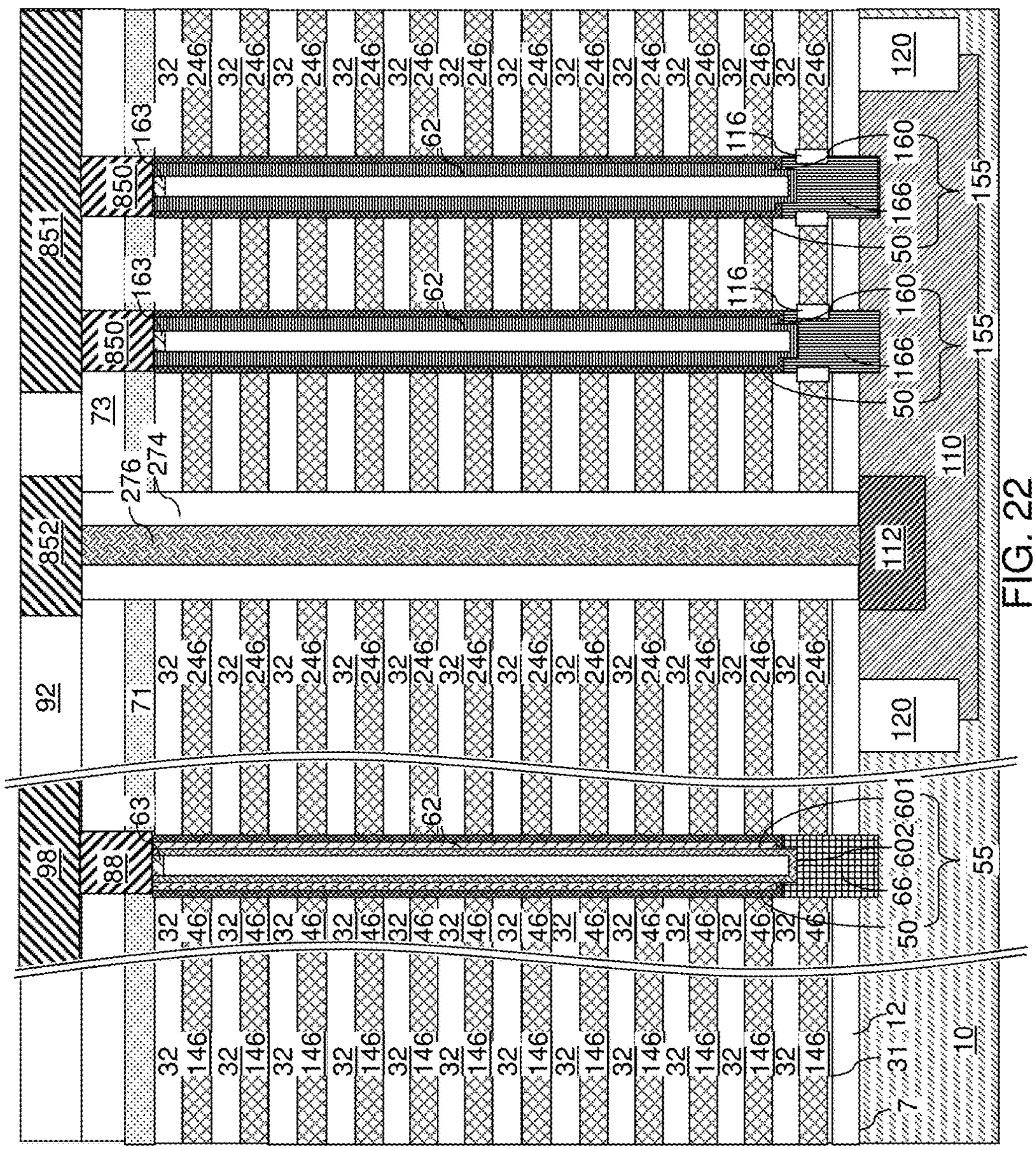
FIG. 22 is a vertical cross-sectional view of the second exemplary structure after formation of drain contact via structures, pillar contact via structures, and interconnect line structures according to the second embodiment of the present disclosure.

Referring to FIG. 22, the processing steps of FIGS. 12A-12D can be sequentially performed to form various contact via structures (8C, 88), which can include the capacitor contact via structures 8C, the control gate contact via structures 304, and the drain contact via structures 88. A pillar contact via structure 850 can be formed on a top surface of each pillar structure 155 concurrently with formation of other via contact structures such as the drain contact via structures 88. In one embodiment, as many pillar contact via structures 850 can be formed as the number of pillar structures 155. The pillar structures 850 can be formed in the same processing step as, and can have the same composition as, the drain contact vial structures 88. Optionally, the pillar contact via structures 850, the capacitor contact via structures 8C, the control gate contact via structures 304, and the drain contact via structures 88 can be formed employing a same set of processing steps, and can comprise a same set of conductive materials.

Subsequently, the processing steps of FIGS. 13A-13E can be performed to form a line level dielectric material layer 92 and various interconnect line structures therein. The interconnect line structures formed in the line level dielectric material layer 92 can include, for example, node-tying metal lines (821, 822, 823, 831, 832, 833), source metal line 96, and bit lines 98 as illustrated in FIGS. 13A-13E, and additionally include a first resistor node metal line 851 contacting the pillar contact structures 850 and a second resistor node metal liner 852 contacting the substrate contact via structure 276.

The second exemplary structure can comprise a semiconductor device. The semiconductor device can comprise an alternating stack (32, 246) of first material layers 32 and second material layers 246 located over a substrate (10, 110, 112, 120). The semiconductor device can further comprise at least one pillar structure 155 extending from a first horizontal plane including a top surface of the alternating stack (32, 246) to a second horizontal plane located underneath, and vertically spaced by a plurality of layers (such as the first material layers 32 and the second material layers 246) within the alternating stack (32, 246) from, the top surface of the alternating stack (32, 246). The semiconductor device further comprises a laterally-extending semiconductor or conductive structure (110, 112) contacting a bottom surface of the at least one pillar structure 155; and a contact via structure 276 contacting a top surface of the laterally-extending semiconductor or conductive structure (110, 112) and laterally spaced from the at least one pillar structure 155. Each of the at least one pillar structure 155 comprises a set of at least one doped semiconductor material portion (160, 166, 63) therein. All semiconductor material within each of the at least one pillar structure 155 has a doping of a same conductivity type, which can be the second conductivity type. The contact via structure (as embodied in the substrate contact via structure 276) can comprise a metallic via structure.

In one embodiment, the at least one doped semiconductor material portion (160, 166, 63) comprises a doped polycrystalline semiconductor material portion 160 contacting inner surfaces of at least one electrically insulating material, which can be a memory film 50.

The semiconductor device can further include a memory opening extending between the first horizontal plane and another horizontal plane including a bottom surface of the alternating stack (32, 46), and a memory stack structure 55 that comprises a memory film 50 located within the memory opening, and a semiconductor channel (601, 602) located within the memory film 50. Each of the at least one pillar structure 155 comprises a layer stack of at least two dielectric material layers (i.e., a memory film 50) located on an outer sidewall of a respective set of at least one doped semiconductor material portion (160, 166, 63). The memory film 50 in a memory stack structure 55 and the layer stack 50 of at least two dielectric material layers in the pillar structure 155 comprise an identical set of dielectric materials.

A first doped semiconductor material portion (as embodied in a doped polycrystalline semiconductor material portion 160) within each set of at least one doped semiconductor material portion (160, 166, 63) comprises the same semiconductor material as the semiconductor channel (601, 602), and further includes electrical dopants of the second conductivity type.

In one embodiment, the semiconductor channel (601, 602) can be intrinsic, or can have a doping of an opposite conductivity type from the set of at least one doped semiconductor material portion (160, 166, 63), which has a doping of the second conductivity type.

In one embodiment, the memory stack structure 55 further comprises a drain region 63 having a doping of the second conductivity type. A second doped semiconductor material portion, as embodied as a drain region 63, can be present within each set of at least one doped semiconductor material portion (160, 166, 63). The second doped semiconductor material portion 63 in each pillar structure 155 can comprise the same semiconductor material as the drain region 63 in the memory stack structure 55.

In one embodiment, the memory stack structure 55 further comprises an epitaxial channel portion 66 having a doping of the first conductivity type, and an epitaxial doped semiconductor portion 166 can be present within each set of at least one doped semiconductor material portion (160, 166, 63). The epitaxial doped semiconductor portion 166 comprises the same semiconductor material as the epitaxial channel portion 66, and further includes electrical dopants of the second conductivity type.

In one embodiment, the laterally-extending semiconductor or conductive structure (110, 112) consists of at least one single crystalline semiconductor material portion located in the substrate. In one embodiment, the laterally-extending semiconductor or conductive structure (110, 112) can consist of the doped semiconductor well 110 and the doped contact region 112, which have a doping of the second conductivity type.

In one embodiment, the first material layers 32 can be electrically insulating layers 32, and the second material layers (246, 46) can be electrically conductive layers. In one embodiment, the first material layers 32 comprise a first electrically insulating material, the second material layers (246, 46) comprise a second electrically insulating material, and the memory stack structure 55 extends through another alternating stack (32, 46) of the first material layers 32 and electrically conductive layers 46 located at each level of the second material layers (246, 46). In one embodiment, the set of at least one doped semiconductor material portion (160, 166, 163) comprises electrical dopants of the second conductivity type at an atomic concentration in a range from $1.0\times10^{17}/cm^3$ to $1.0\times10^{20}/cm^3$.

In one embodiment, the semiconductor structure can further include the vertical NAND memory device of the first embodiment.

Figure 23:
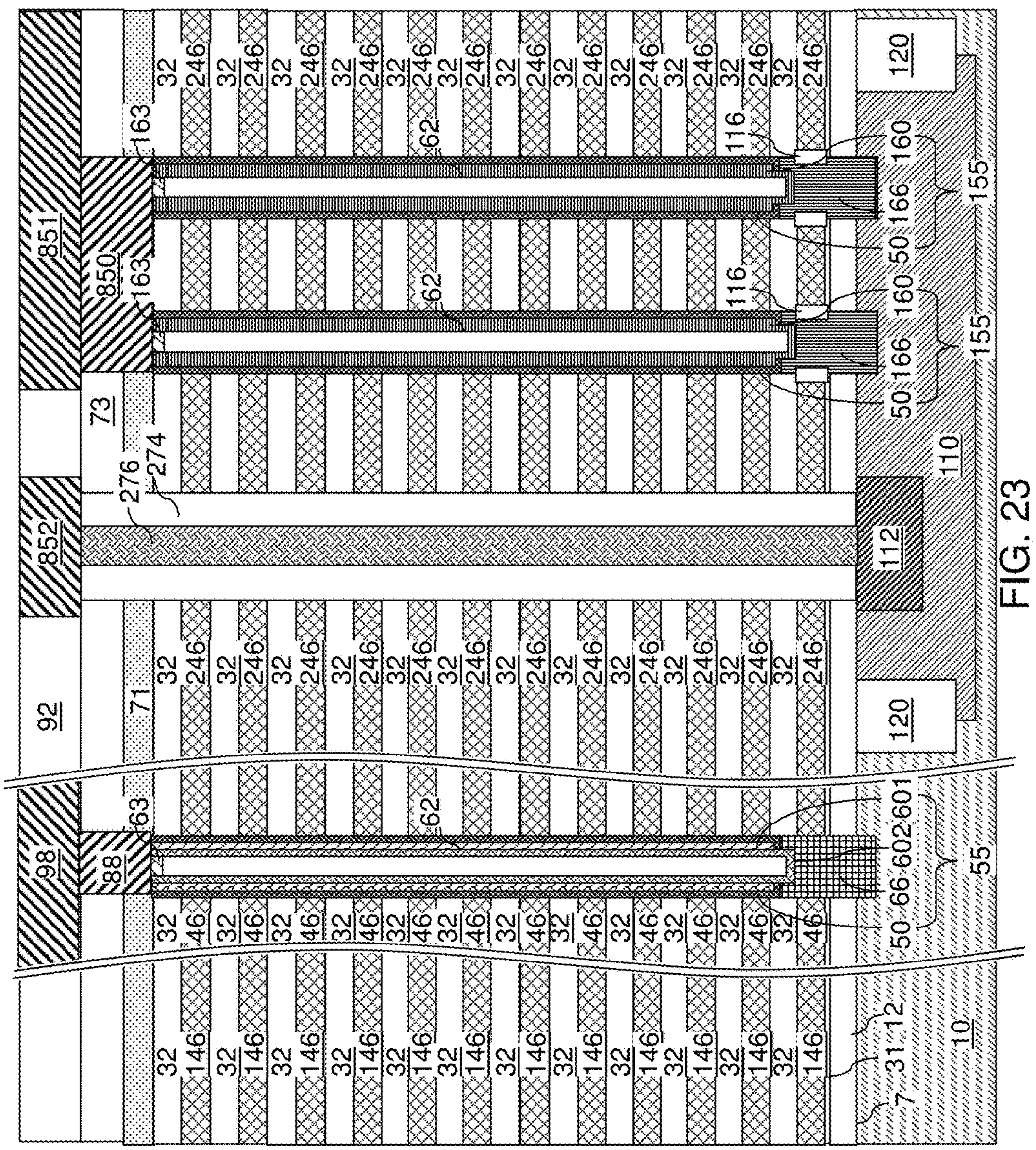
FIG. 23 is a vertical cross-sectional view of an alternate embodiment of the second exemplary structure according to the second embodiment of the present disclosure.

Referring to FIG. 23, an alternate embodiment of the second exemplary structure can be derived from the second exemplary structure by forming a pillar contact via structure 850 that contacts a plurality of pillar structures 155 at the processing steps of FIG. 22

Figure 24:
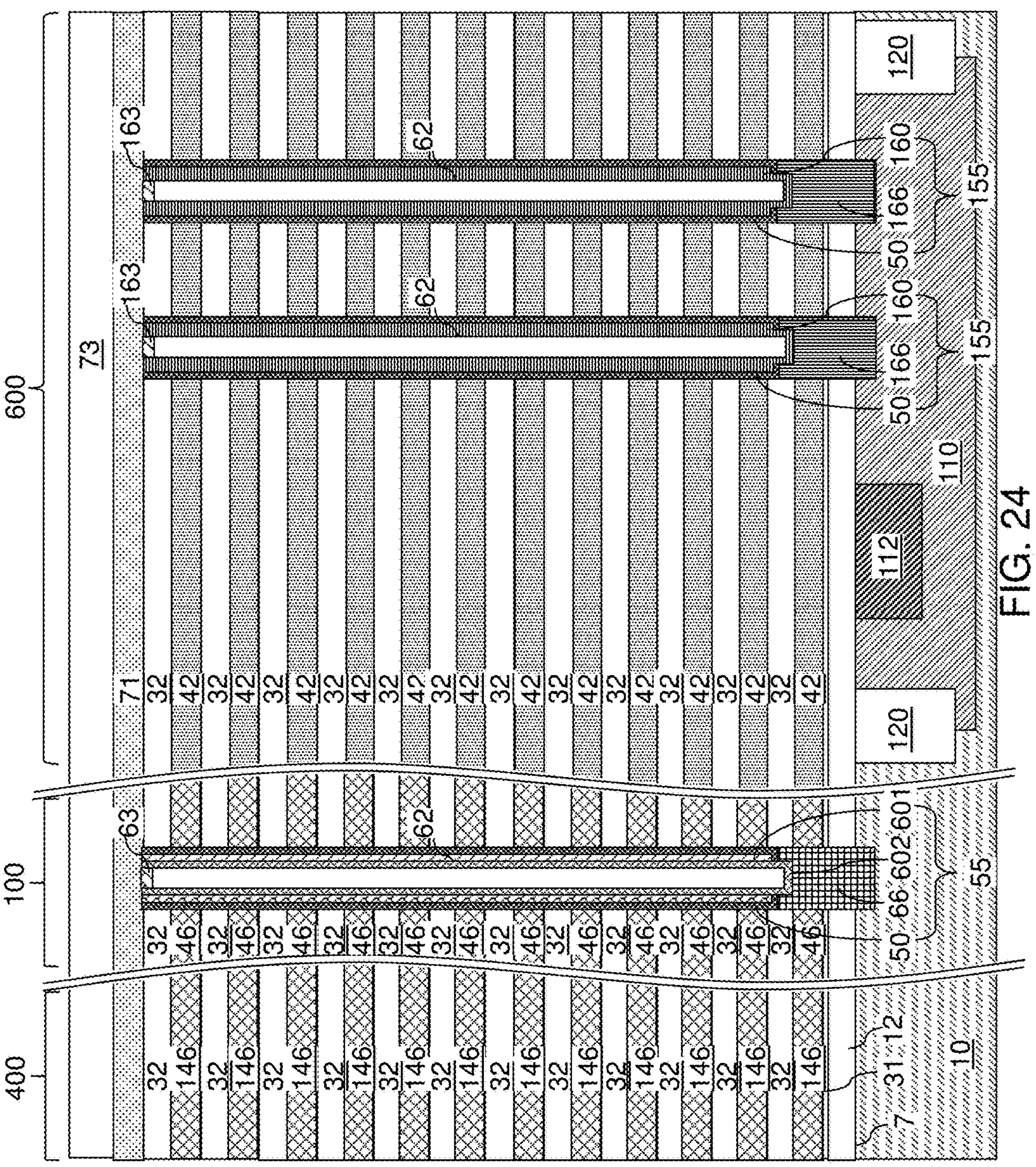
FIG. 24 is a vertical cross-sectional view of a third exemplary structure after replacement of first portions of second material layers with electrically conductive layers while maintaining second portions of the second material layers intact according to a third embodiment of the present disclosure.

In a third exemplary structure according to a third embodiment of the present disclosure the original insulating layers 42 are retained in the stack and are not replaced by the electrically conducting layers 246. Referring to FIG. 24, this structure can be derived from the second exemplary structure of FIG. 19 by performing the processing steps of FIGS. 3, 4, 5A and 5B, and by forming the dielectric pillar structure(s) 7P and the dielectric material layer 73 employing the processing methods of FIGS. 6A and 6B. If desired, the dielectric support pillar structures 7Q (not shown for clarity) as described and illustrated above may also be present in the device of this embodiment. At least one pillar structure 155 can be formed in a resistor region 600, which can be a region that replaces the resistor region 500 of the second embodiment, or can be provided in addition to the resistor region 500 of the second embodiment. Regions 500 or 600 may be located in part of the memory device region 100 and/or in the kerf region 501, as shown in FIG. 37.

Subsequently, the processing steps of FIGS. 7A-7D, 8A-8C, 9A and 9B, 10A and 10B, and 11A and 11B are performed without forming the resistor contact trench 279 in the resistor region 600. If another resistor region 500 of the second embodiment is provided, a resistor contact trench 279 can be formed in such a resistor contact region 500.

In the third embodiment, first portions of second material layers 42 in the memory device region 100, an optional capacitor region 400, and an optional additional resistor region 500 are replaced with electrically conductive layers (46, 146, 246), while second portions of the second material layers 42 in the resistor region 600 remain intact. In this case, the second material layers 42 comprise a dielectric material, and are not removed within a region (i.e., the resistor region 600) including at least one vertically-extending cavity that is filled with a pillar structure 155.

Figure 25:
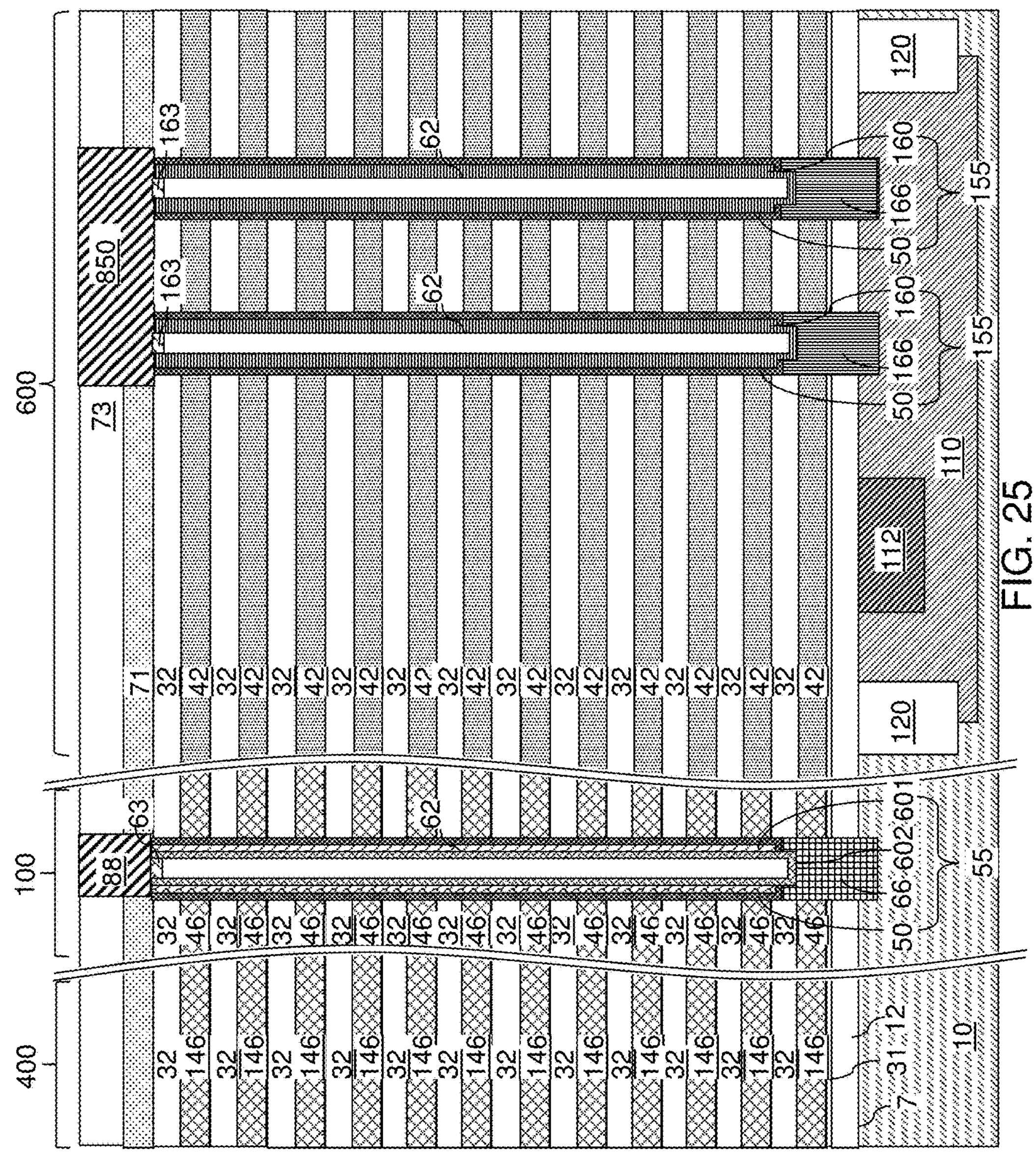
FIG. 25 is a vertical cross-sectional view of the third exemplary structure after formation of drain contact via structures and a pillar contact line structure according to the third embodiment of the present disclosure.

Referring FIG. 25, at least one pillar contact via structure 850, drain contact via structures 88, and capacitor contact via structures 8C can be formed in the same manner as in the processing steps of FIG. 22.

Figure 26:
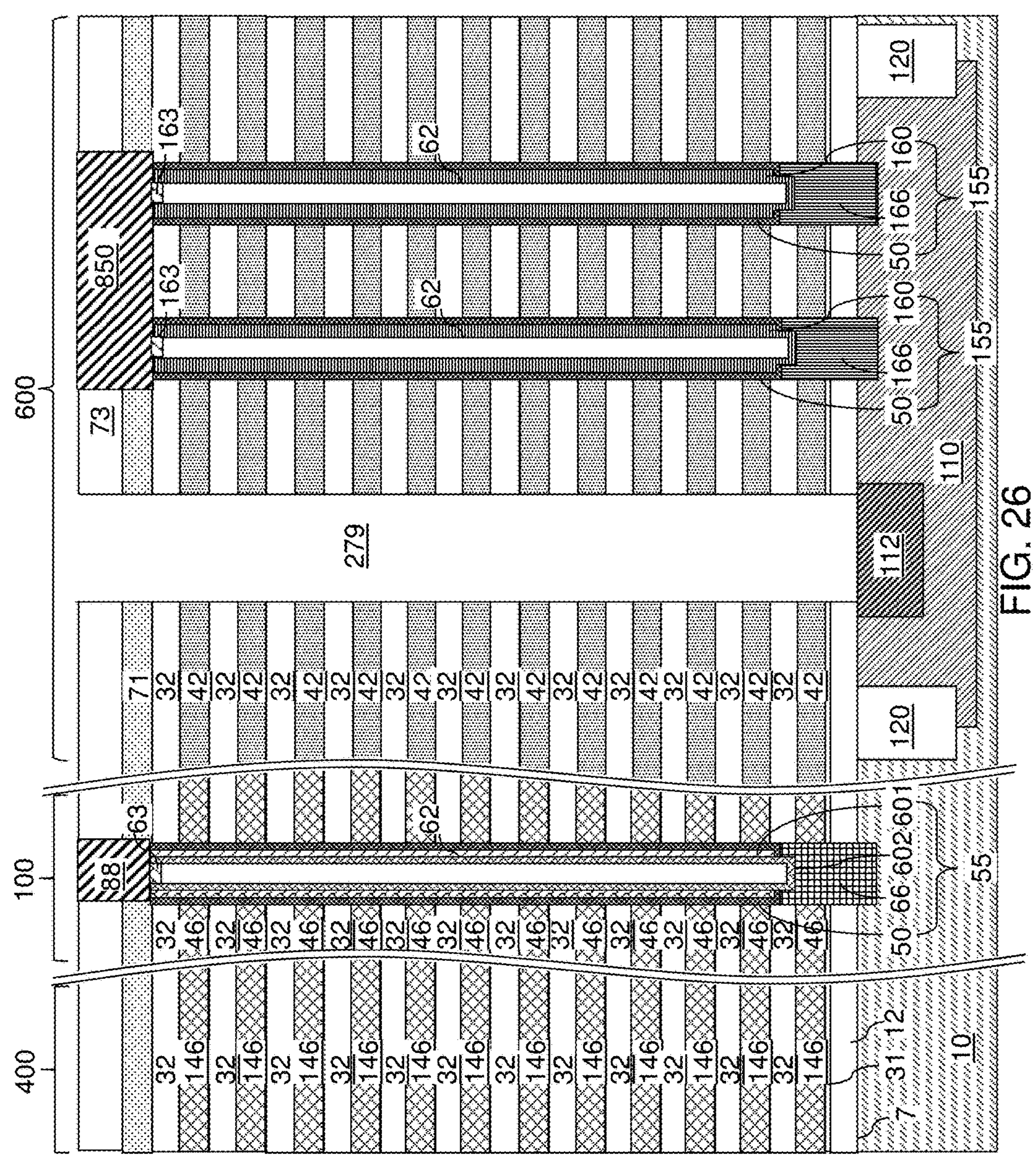
FIG. 26 is a vertical cross-sectional view of the third exemplary structure after formation of a resistor contact trench according to the third embodiment of the present disclosure.

Referring to FIG. 26, a resistor contact trench 279 can be formed through the alternating stack of first material layers 32 and second material layers 42 over the area of the doped contact region 112, for example, by application of a photoresist layer, lithographic patterning of the photoresist layer, and transfer of the pattern in the photoresist layer through the alternating stack (32, 42) by an anisotropic etch. In this case, the resistor contact trench 279 can be formed after formation of the backside contact trench 79 employed to replace portions of the second material layers 42 in the memory device region 100 and the capacitor region 400 with a conductive material. In one embodiment, the first material layers 32 can include a first insulating material (such as silicon oxide) and the second material layers 42 can include a second insulating material (such as silicon nitride).

Figure 27:
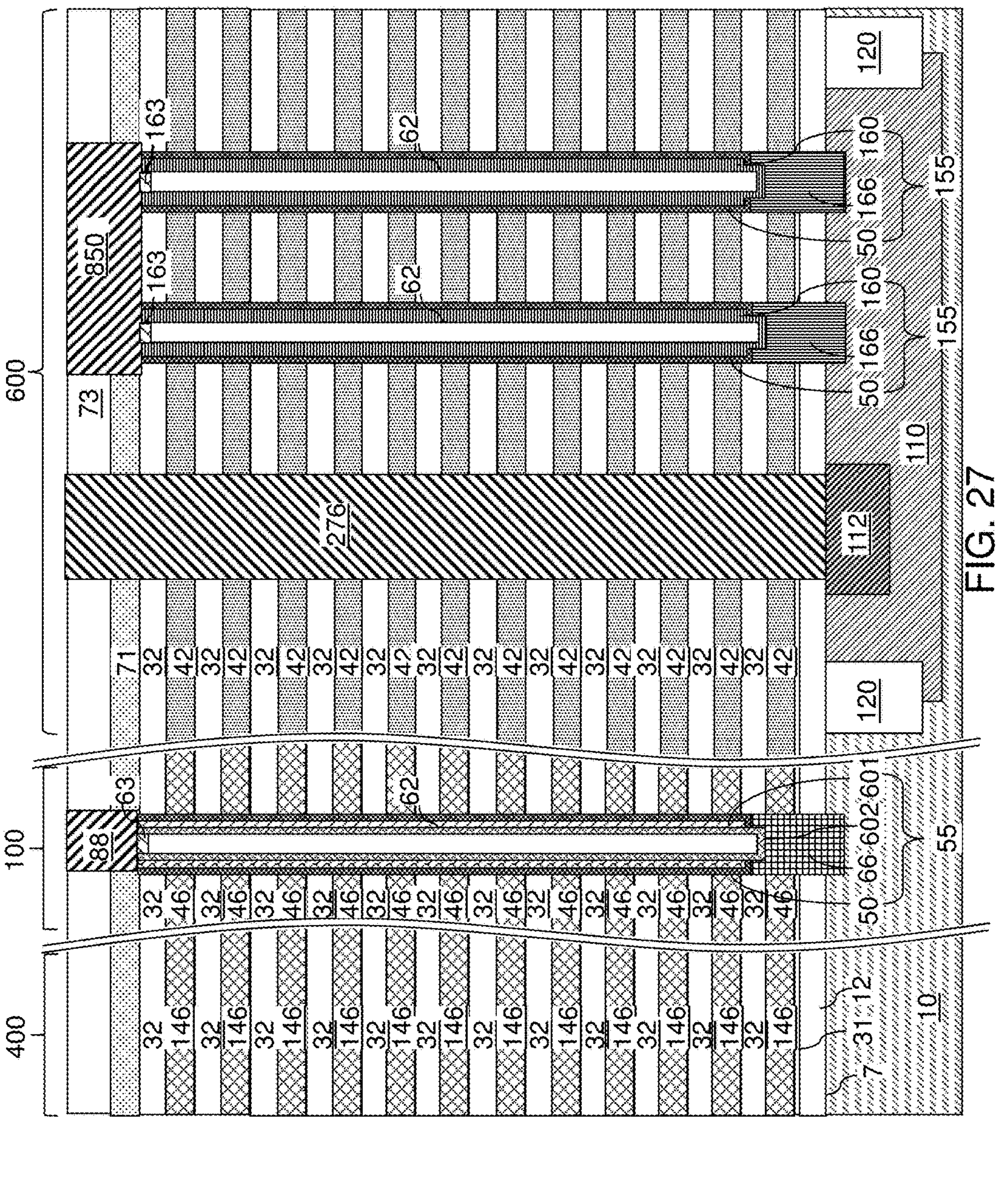
FIG. 27 is a vertical cross-sectional view of the third exemplary structure after formation of a substrate contact via structure according to the third embodiment of the present disclosure.

Referring to FIG. 27, a substrate contact via structure 276 can be formed by filling the resistor contact trench 279 with at least one conductive material. An insulating spacer is not necessary in the resistor contact trench 279. Thus, the substrate contact via structure 276 can contact sidewalls of the first material layer 32 and the second material layer 42 in the resistor region 600. The at least one pillar contact via structure 850 can be a first resistor node via structure, and the substrate contact via structure 276 can be a second resistor node via structure.

Figure 28:
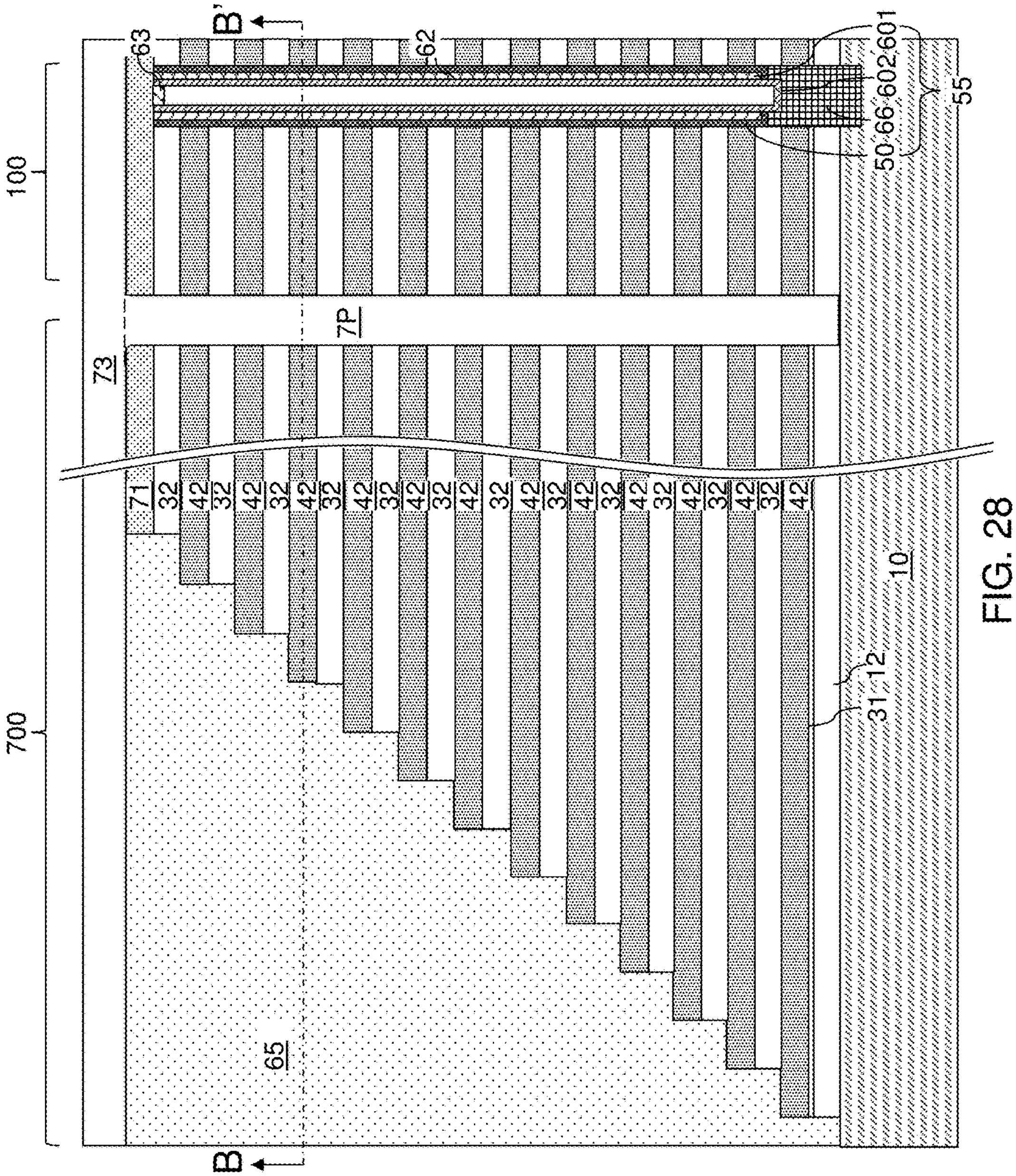
FIG. 28 is a vertical cross-sectional view of a fourth exemplary structure after formation of a dielectric material layer according to a fourth embodiment of the present disclosure.
Figure 29A:
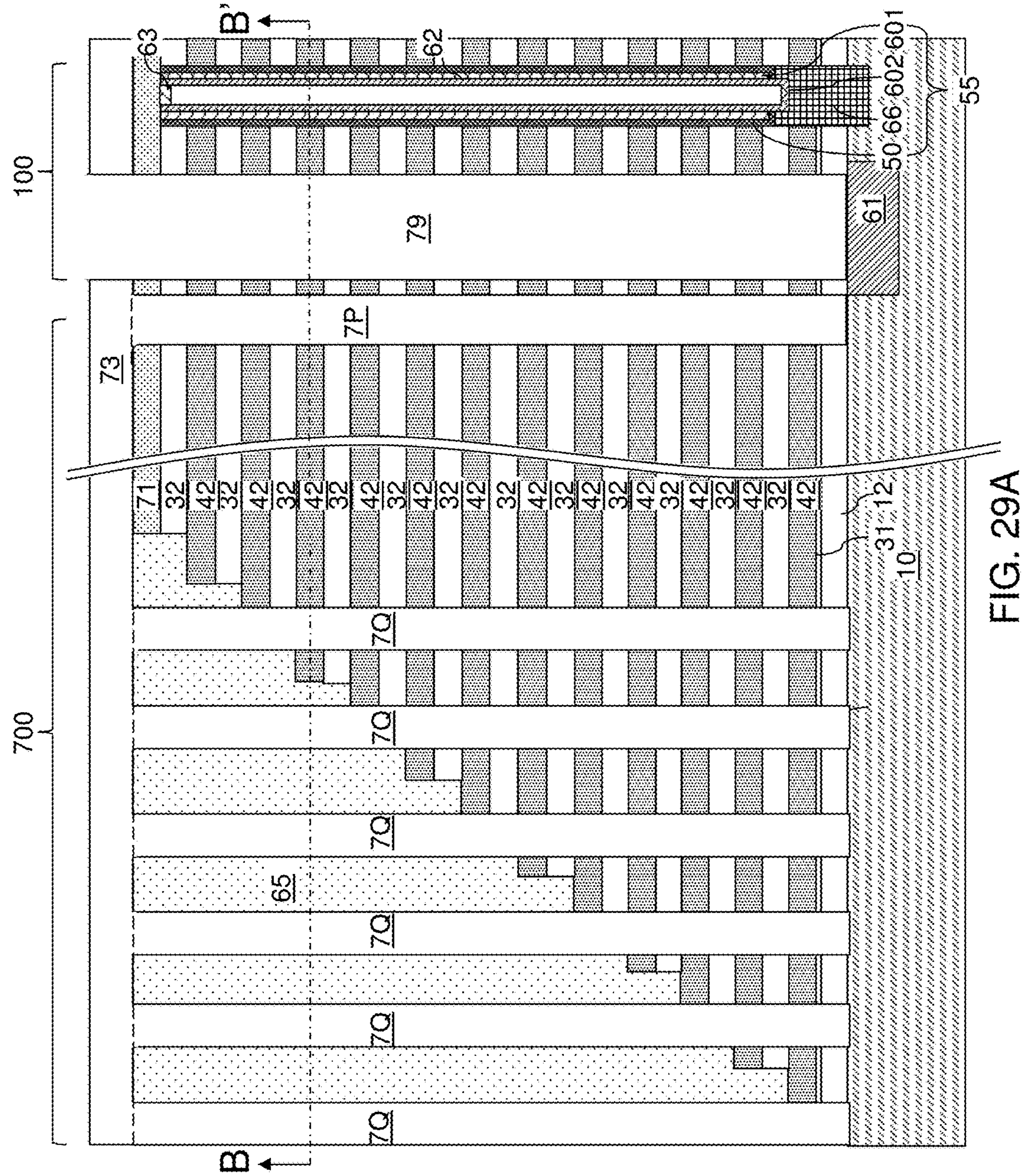
FIG. 29A is a vertical cross-sectional view of the fourth exemplary structure after formation of a backside contact trench according to the fourth embodiment of the present disclosure.
Figure 29B:
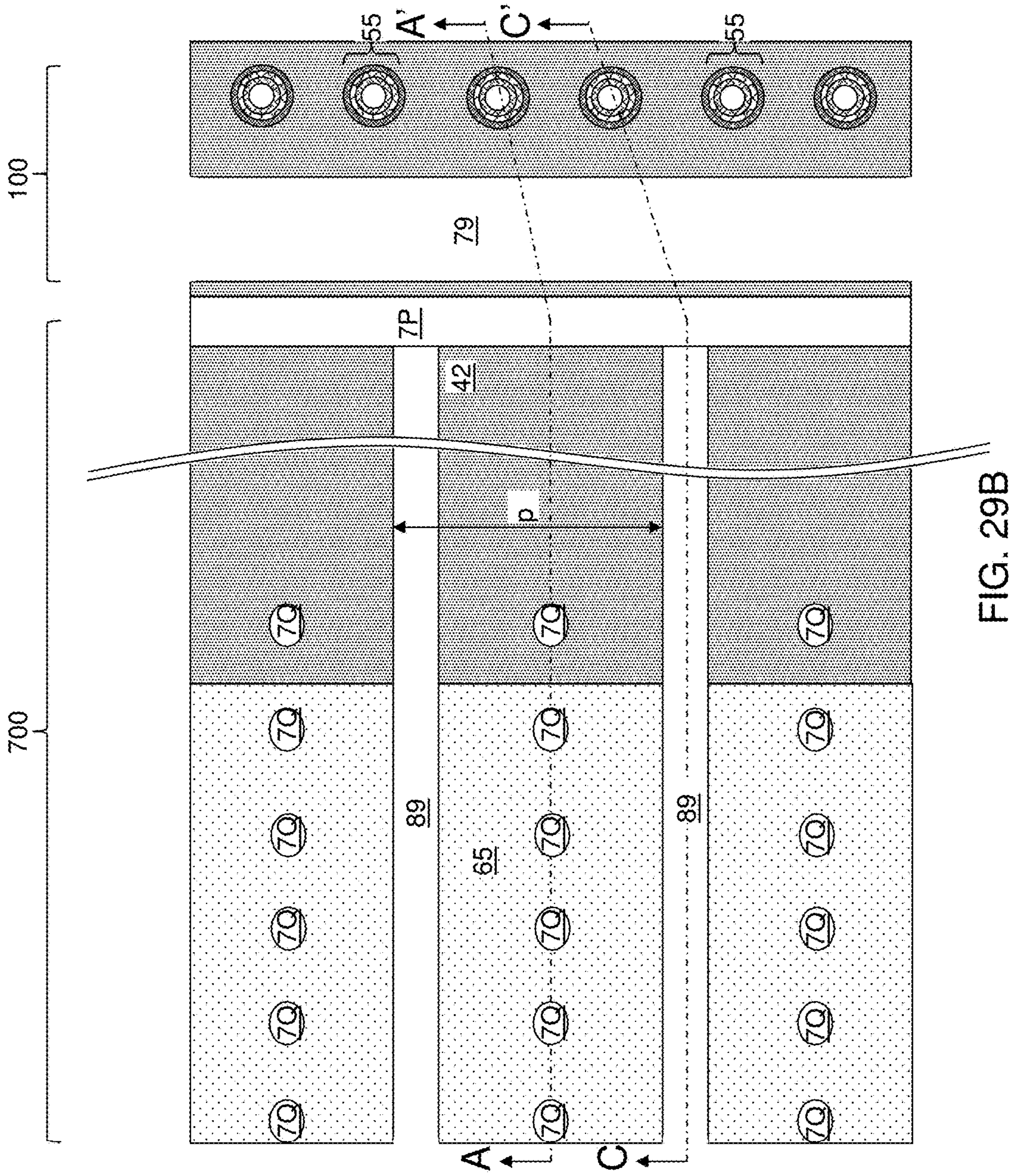
FIG. 29B is a horizontal cross-sectional view of the fourth exemplary structure along the horizontal plane B-B' of FIG. 29A. The vertical plane A-A' is the plane of vertical cross-sectional view of FIG. 29A.
Figure 29C:
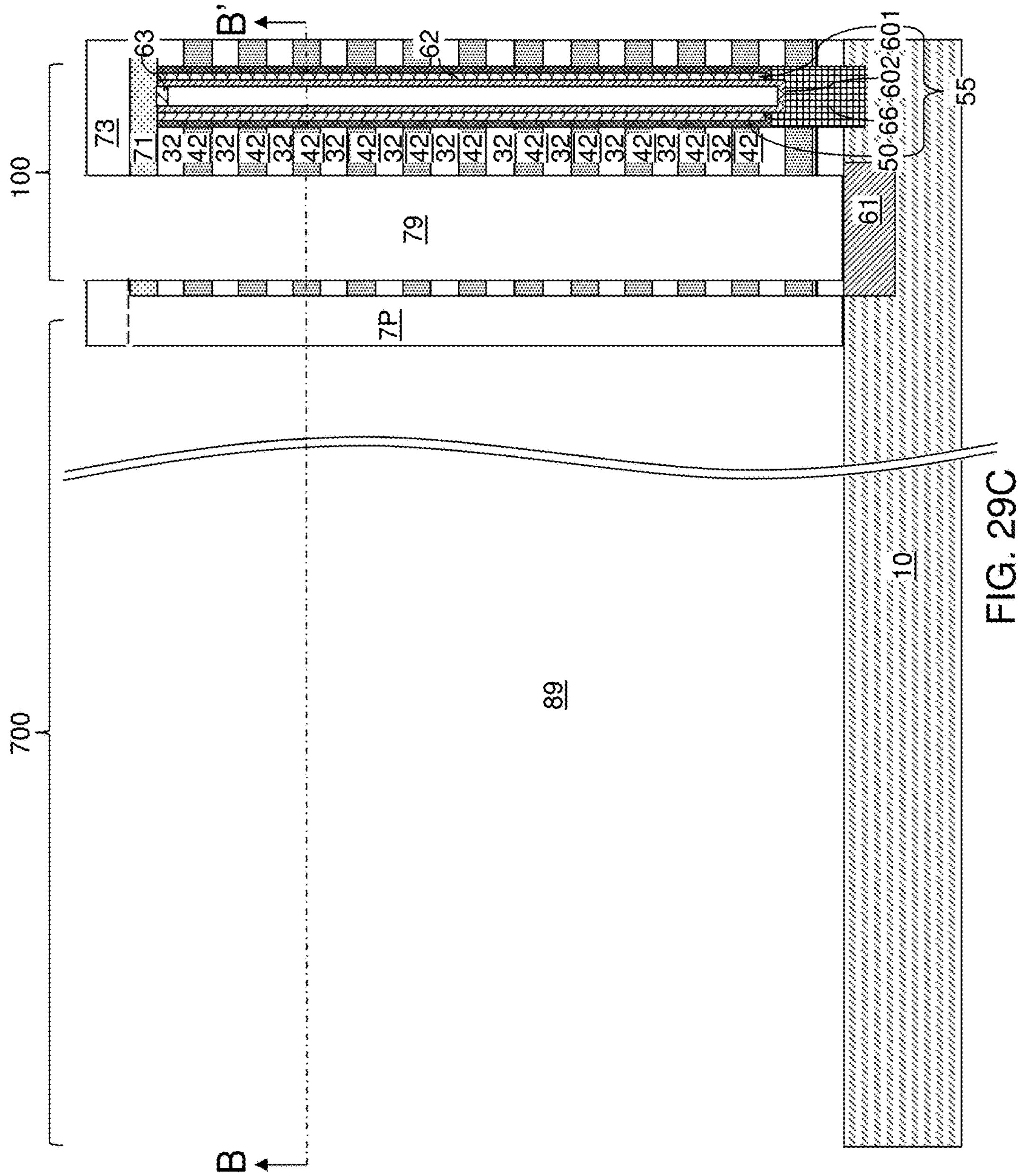
FIG. 29C is a vertical cross-sectional view of the first exemplary structure of FIG. 29B along the vertical plane C-C'.
Figure 29D:
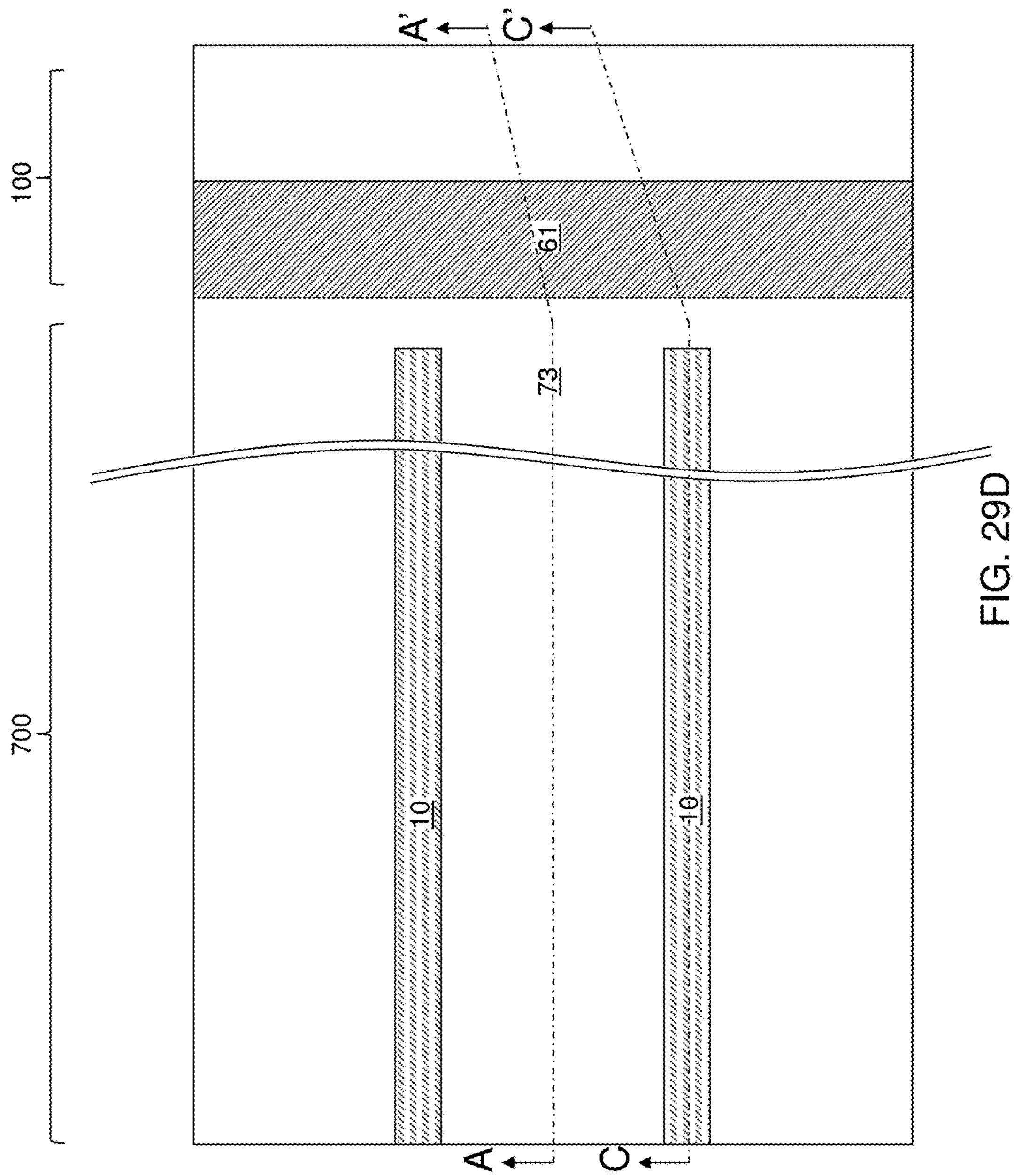
FIG. 29D is a top-down view of the first exemplary structure of FIGS. 29A-29C.

In a fourth exemplary structure according to a fourth embodiment of the present disclosure, the resistors are formed in one or more of the stepped regions 700, which may be located in the word line stepped surface region(s) 300, the dummy staircase region(s) 400, and/or in the dummy staircase track 406, as shown in FIG. 37. Referring to FIG. 28, this structure can be derived from the first exemplary structure of FIGS. 6A and 6B, or the second exemplary structure of FIG. 19 by forming the optional dielectric pillar structure 7P and the dielectric support pillar structures 7Q and the dielectric material layer 73. The capacitor region 400 of the first embodiment may, or may not, be present in the fourth exemplary structure. The resistor region 500 of the second embodiment may, or may not, be present in the fourth exemplary structure. The resistor region 600 of the third embodiment may, or may not, be present in the fourth exemplary structure. A resistor region 700 is provided adjacent to a memory device region 100 (e.g., in stepped regions 300, 400 and/or 406). The optional dielectric pillar structure 7P can be formed at, or in proximity to, a boundary between the memory device region 100 and the resistor region 700 in a pattern same as, or similar to, the pattern of the dielectric pillar structure 7P of the first embodiment.

Referring to FIGS. 29A-29D, the processing steps of FIGS. 7A-7D are performed to form a backside contact trench 79 in the memory device region 100 and optional lateral separation trenches 89 in the resistor region 700.

Figure 30A:
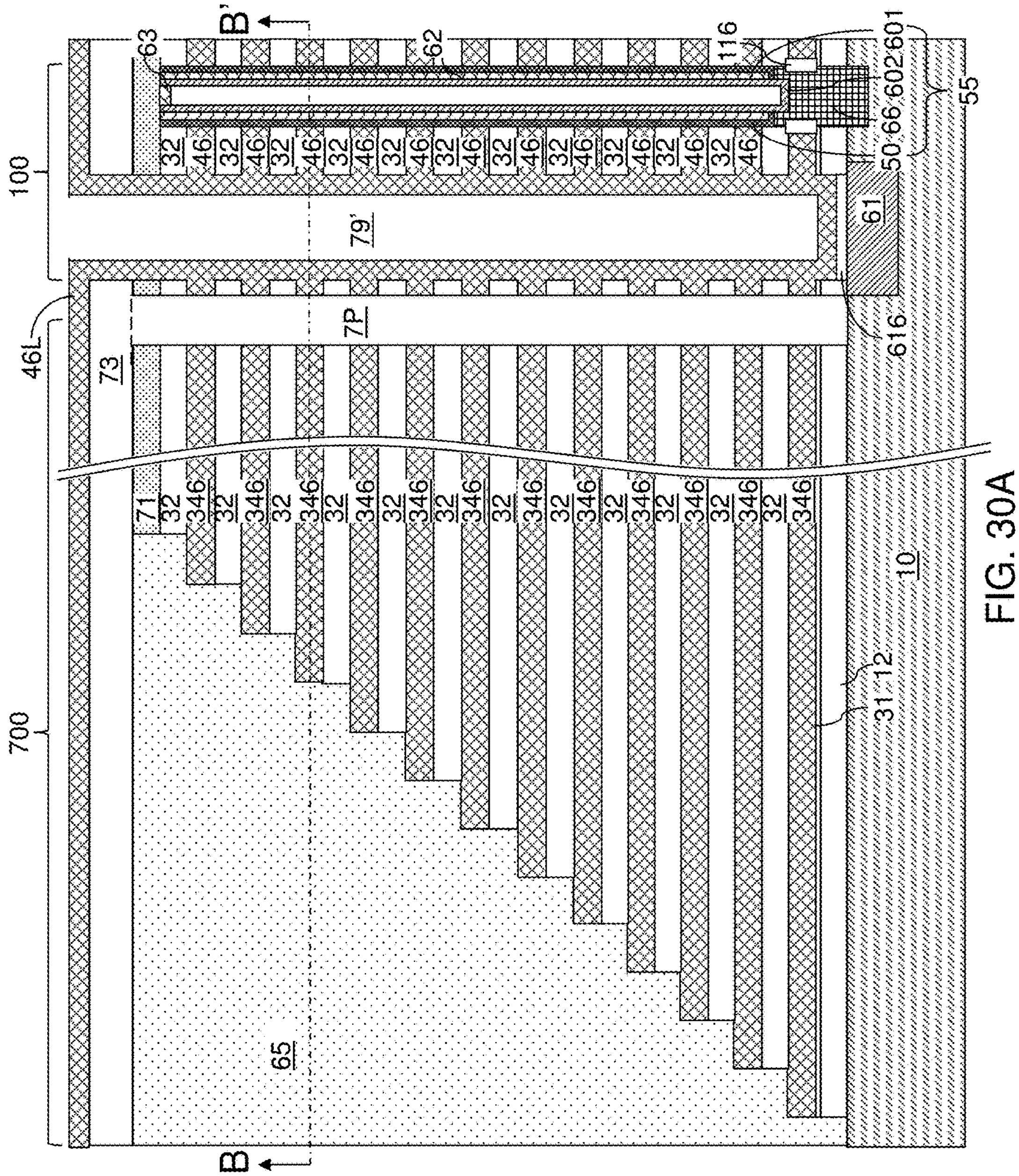
FIG. 30A is a vertical cross-sectional view of the fourth exemplary structure after formation of electrically conductive layers according to the fourth embodiment of the present disclosure.
Figure 30B:
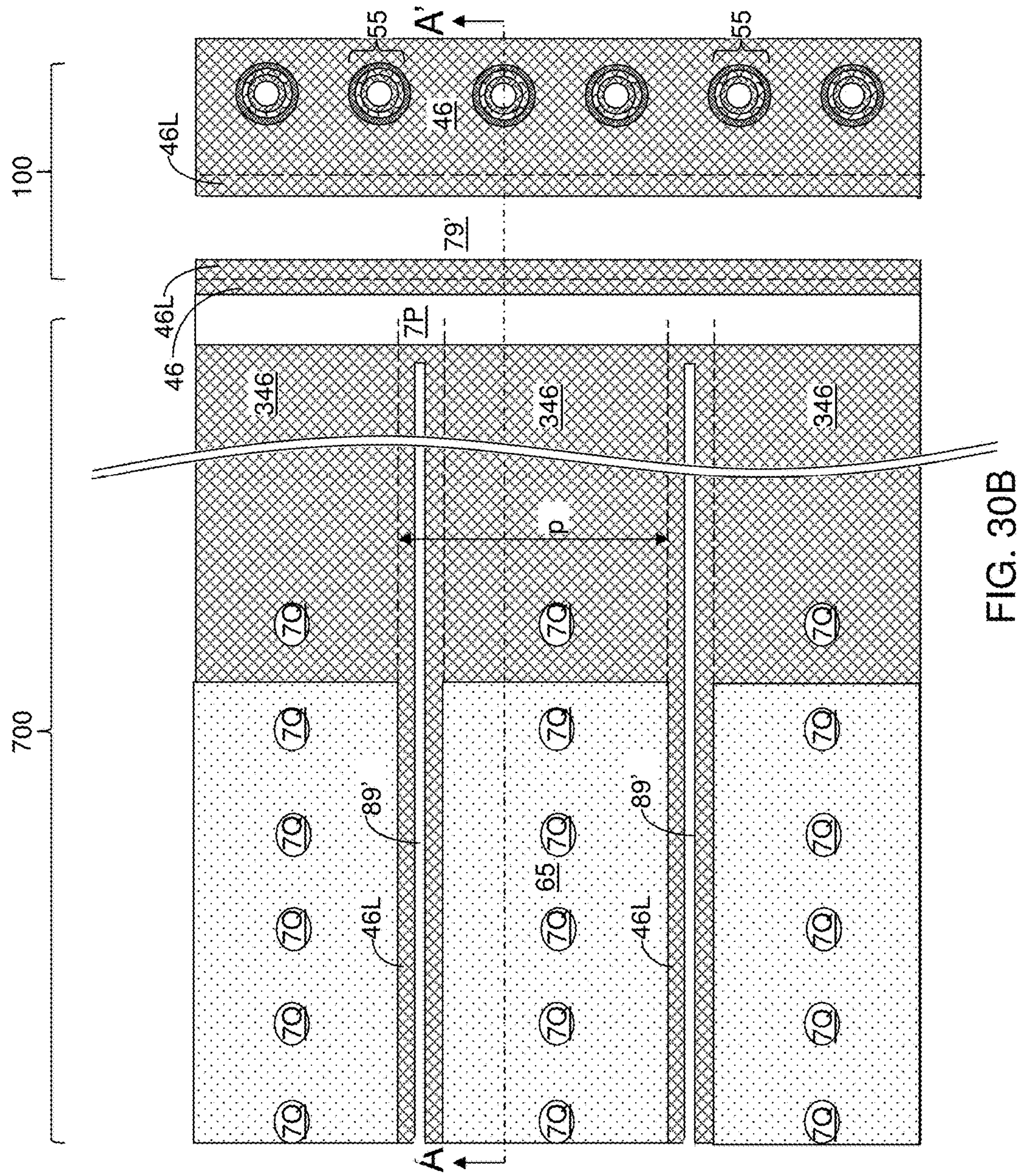
FIG. 30B is a horizontal cross-sectional view of the fourth exemplary structure of FIG. 30A along the plane B-B'. The vertical plane A-A' is the plane of vertical cross-sectional view of FIG. 30A.

Referring to FIGS. 30A and 30B, the processing steps of FIGS. 8A-8C and the processing steps of FIGS. 9A and 9B are performed to form an alternating stack (32, 346) of first material layers that are electrically insulating layers 32 and second material layers that are electrically conductive layers 346, which are herein referred to as fourth electrically conductive layers 346.

Figure 31A:
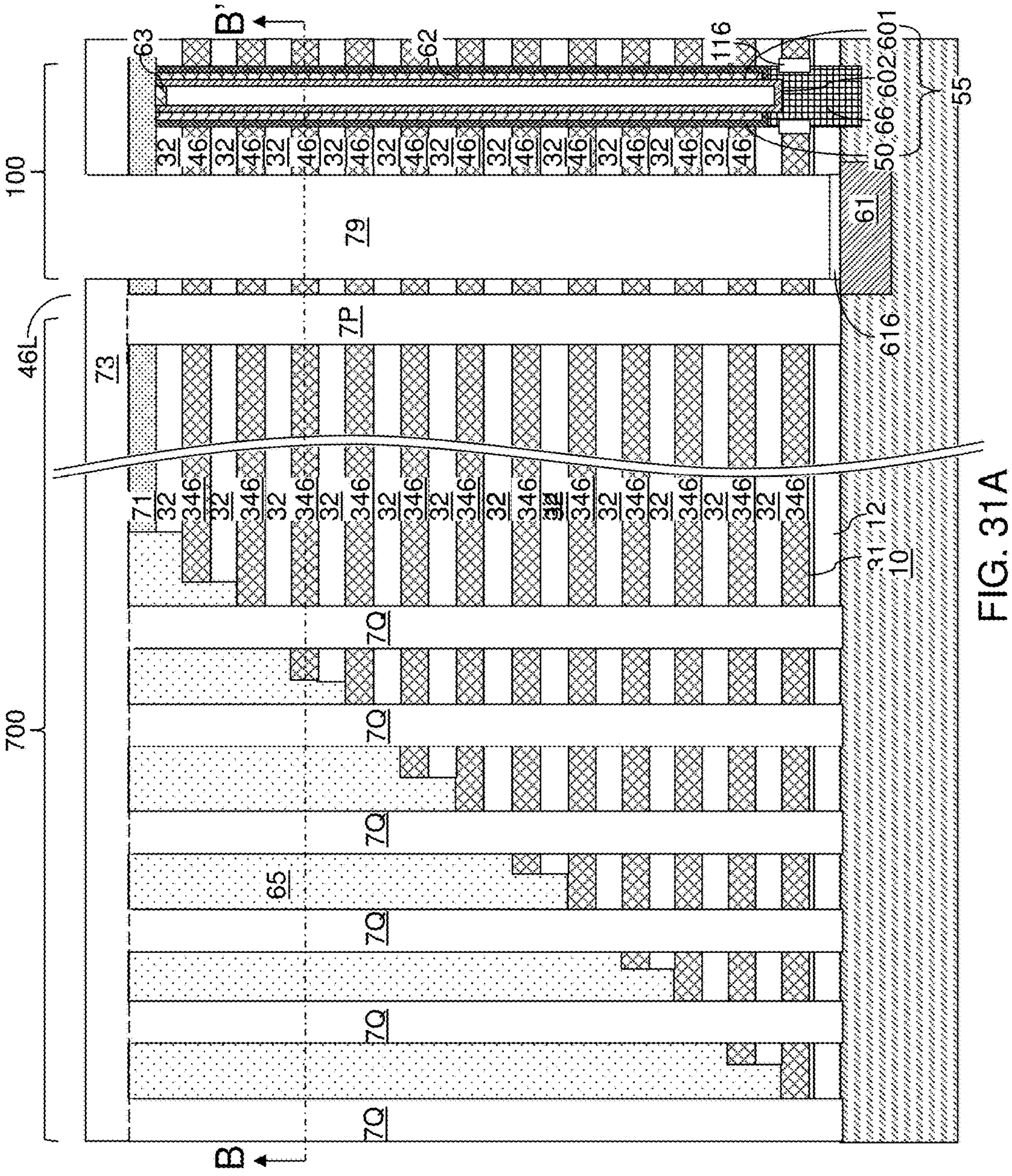
FIG. 31A is a vertical cross-sectional view of the fourth exemplary structure after removal of a metallic material from trenches according to the fourth embodiment of the present disclosure.
Figure 31B:
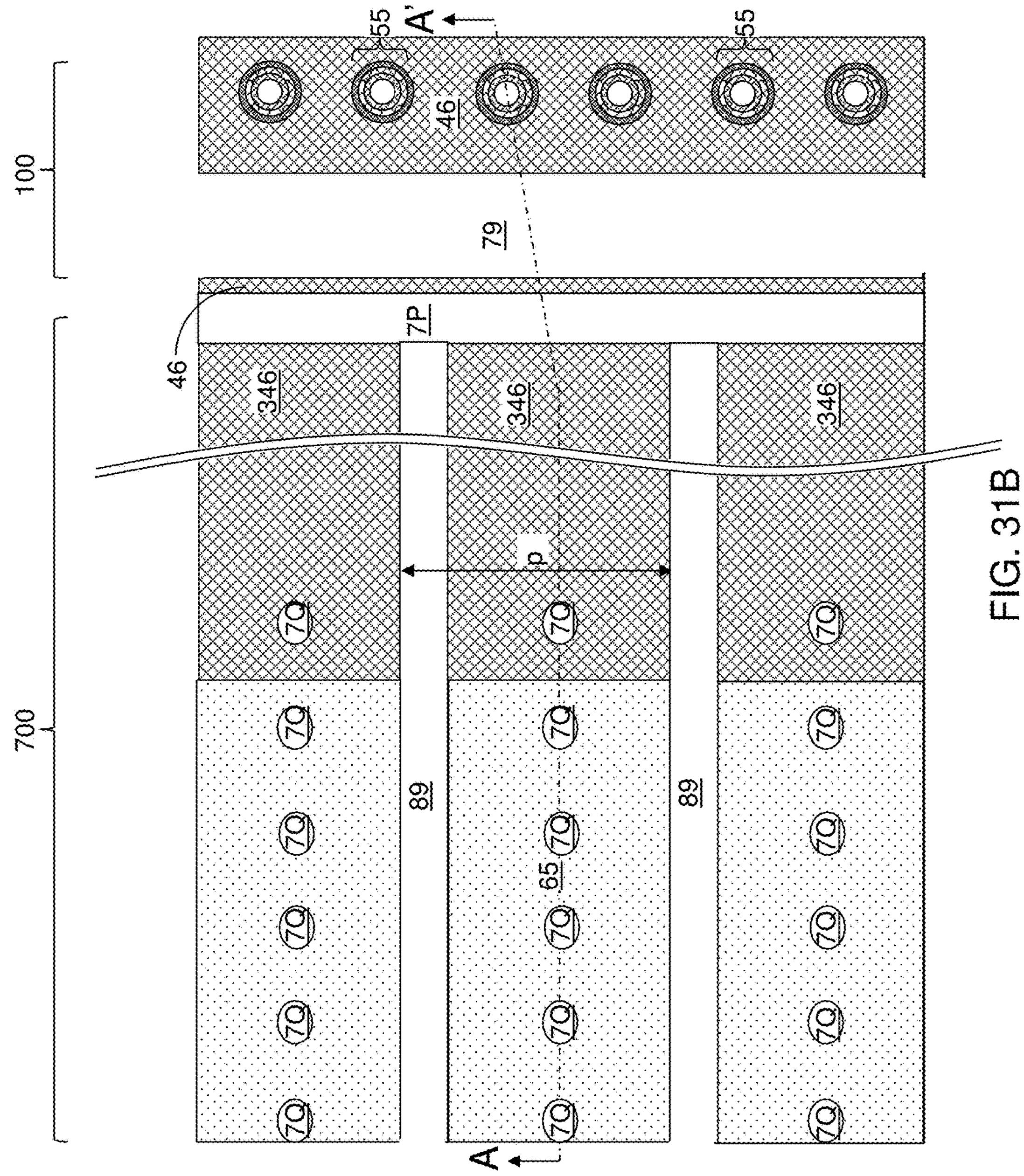
FIG. 31B is a horizontal cross-sectional view of the fourth exemplary structure of FIG. 31A along the plane B-B'. The vertical plane A-A' is the plane of vertical cross-sectional view of FIG. 31A.

Referring to FIGS. 31A and 31B, the processing steps of FIGS. 10A and 10B are performed to remove any remaining metallic material from inside the backside contact trench 79.

Figure 32A:
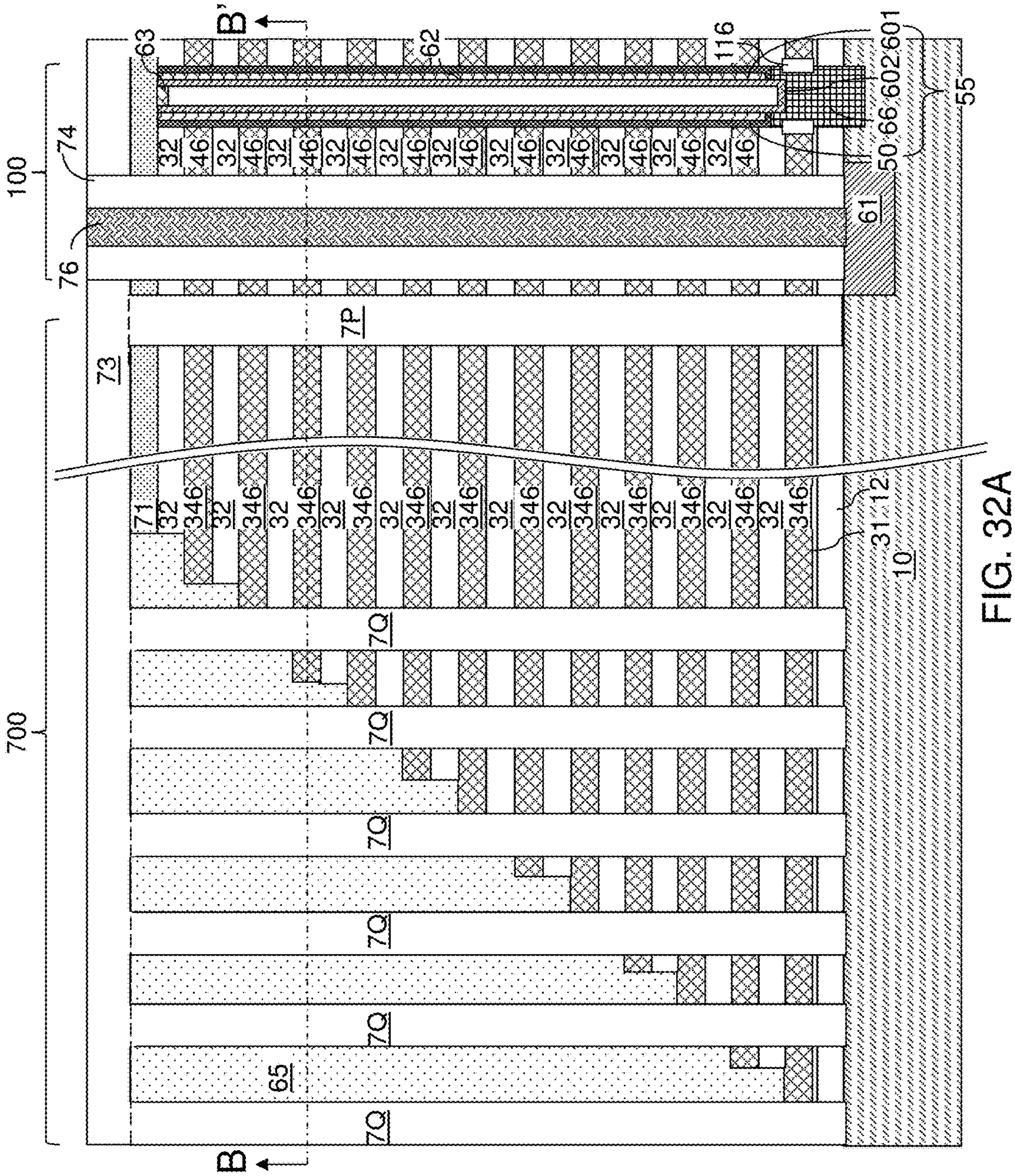
FIG. 32A is a vertical cross-sectional view of the fourth exemplary structure after formation of a backside insulating spacer and a backside contact via structure according to the fourth embodiment of the present disclosure.
Figure 32B:
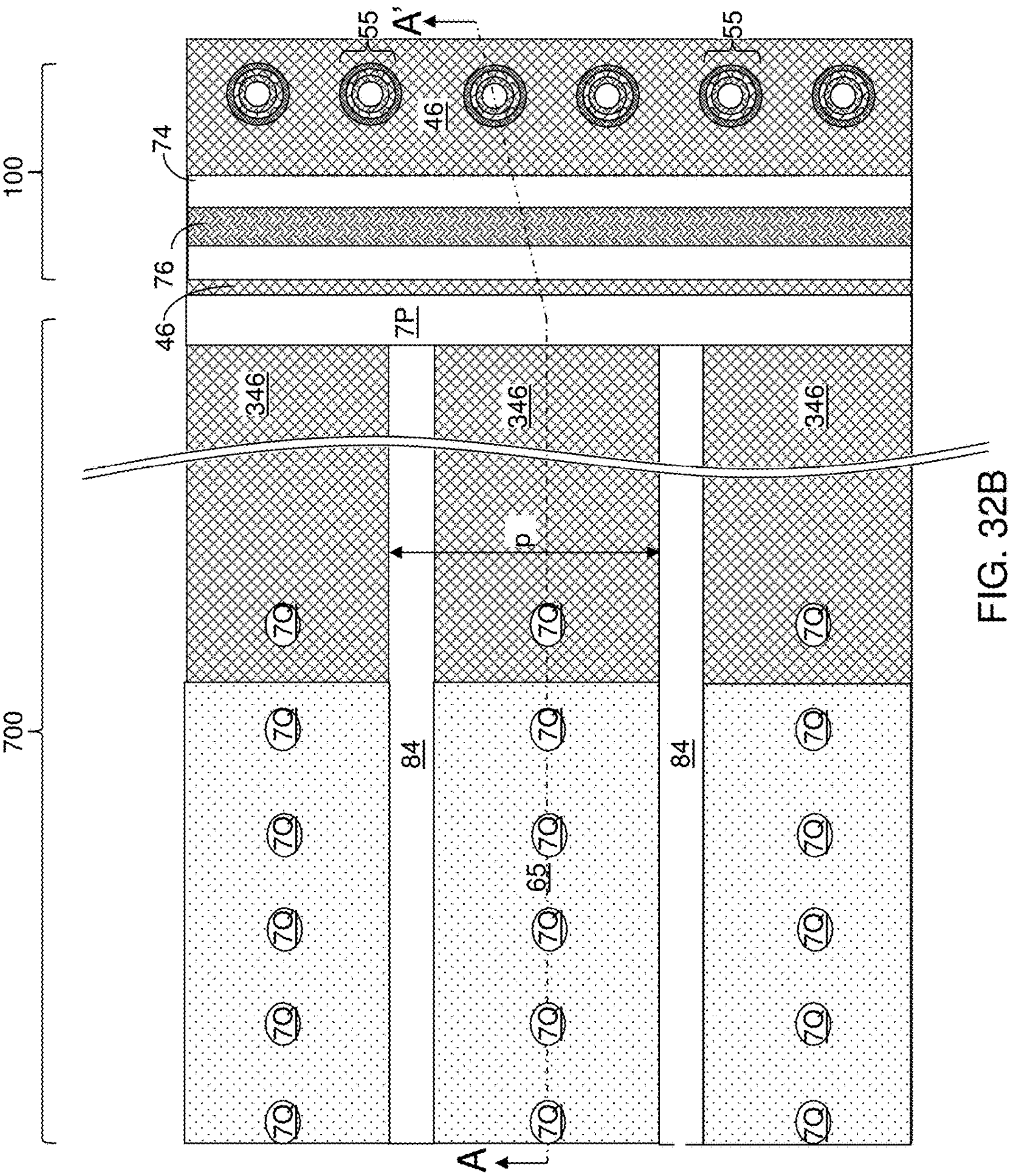
FIG. 32B is a horizontal cross-sectional view of the fourth exemplary structure of FIG. 32A along the plane B-B'. The vertical plane A-A' is the plane of vertical cross-sectional view of FIG. 32A.
Figure 33A:
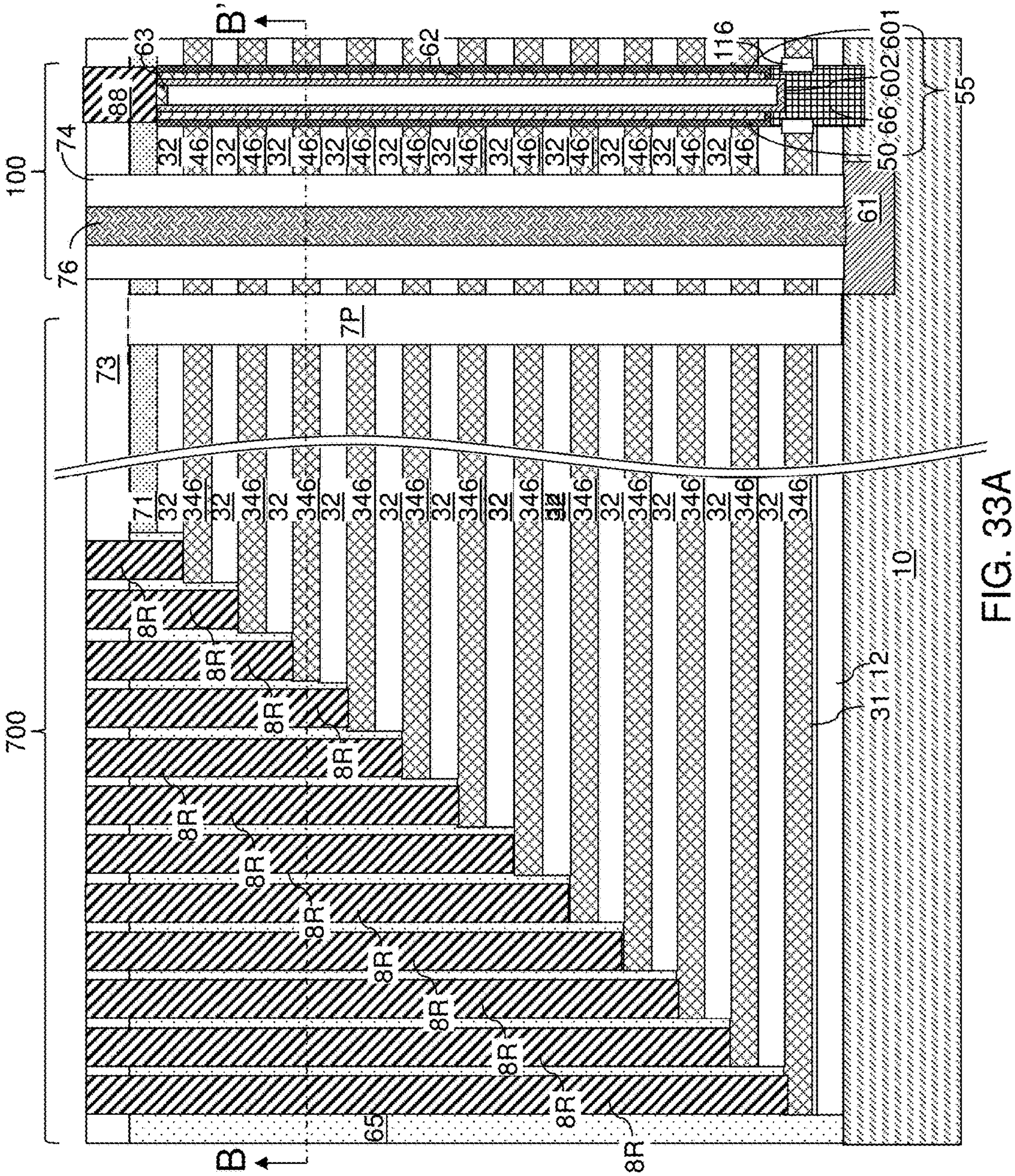
FIG. 33A is a vertical cross-sectional view of the fourth exemplary structure after formation of substrate contact via structures and drain contact via structures according to the fourth embodiment of the present disclosure.
Figure 33B:
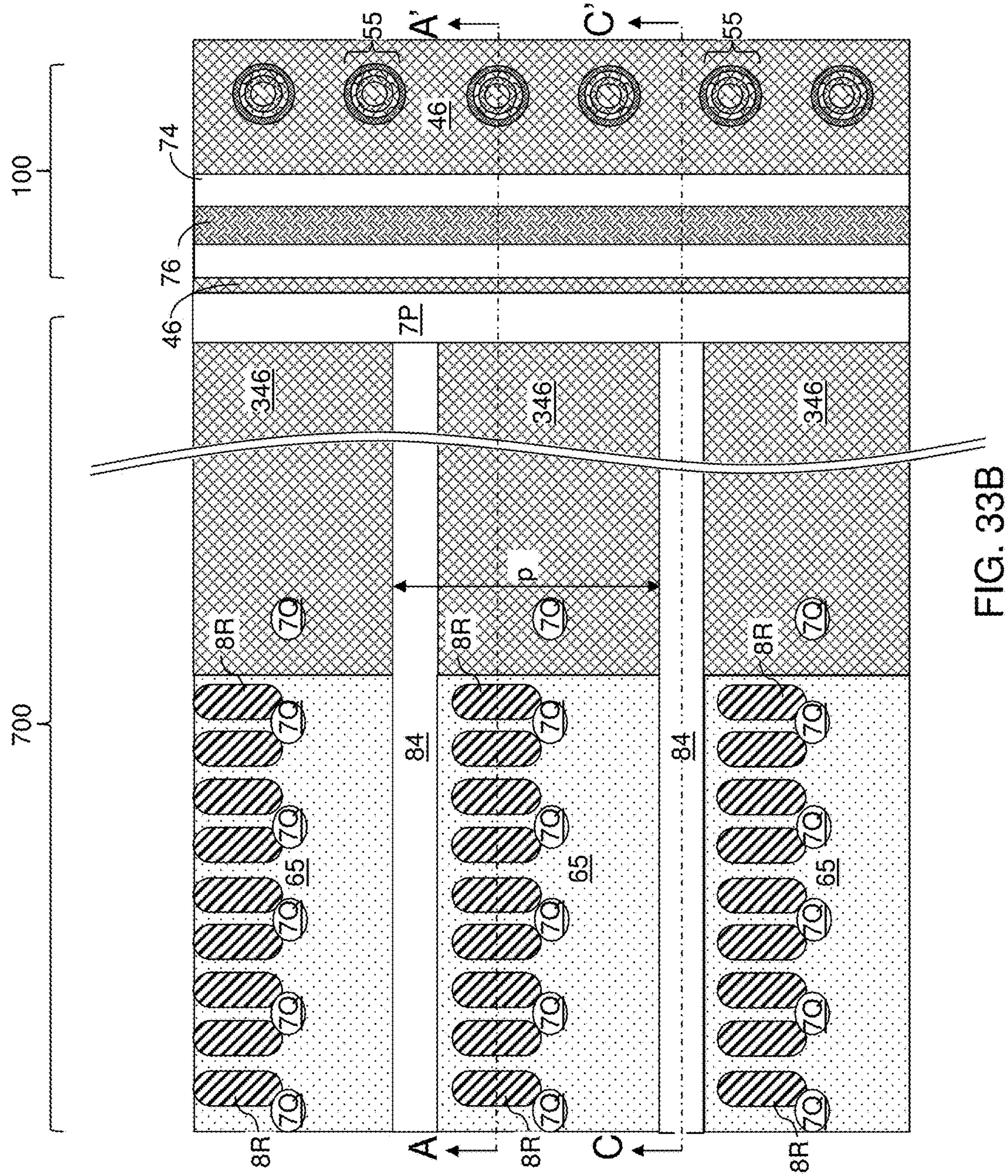
FIG. 33B is a horizontal cross-sectional view of the fourth exemplary structure of FIG. 33A along the plane B-B'. The vertical plane A-A' is the plane of vertical cross-sectional view of FIG. 33A.
Figure 33C:
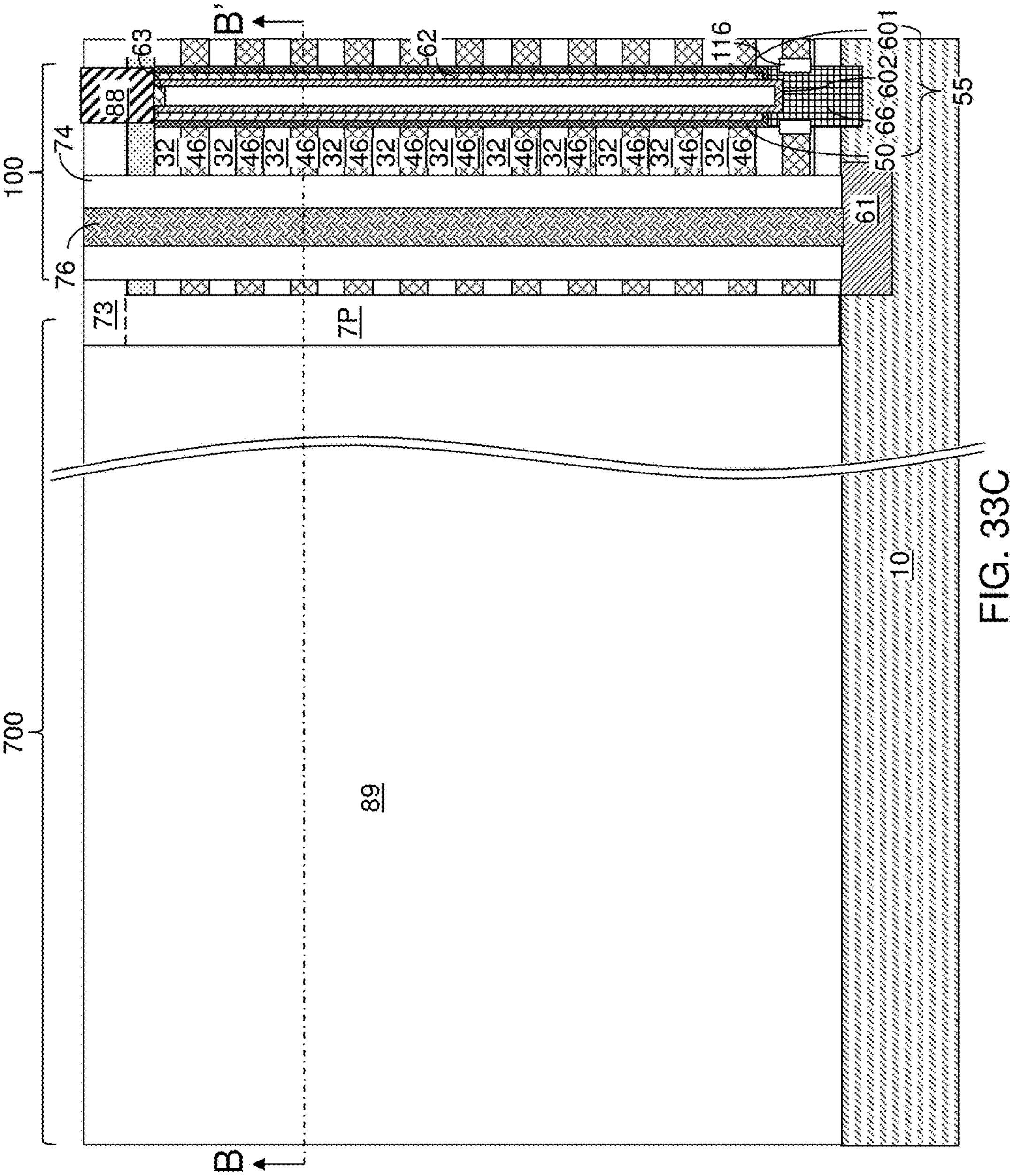
FIG. 33C is a vertical cross-sectional view of the fourth exemplary structure of FIG. 33B along the vertical plane C-C'.
Figure 33D:
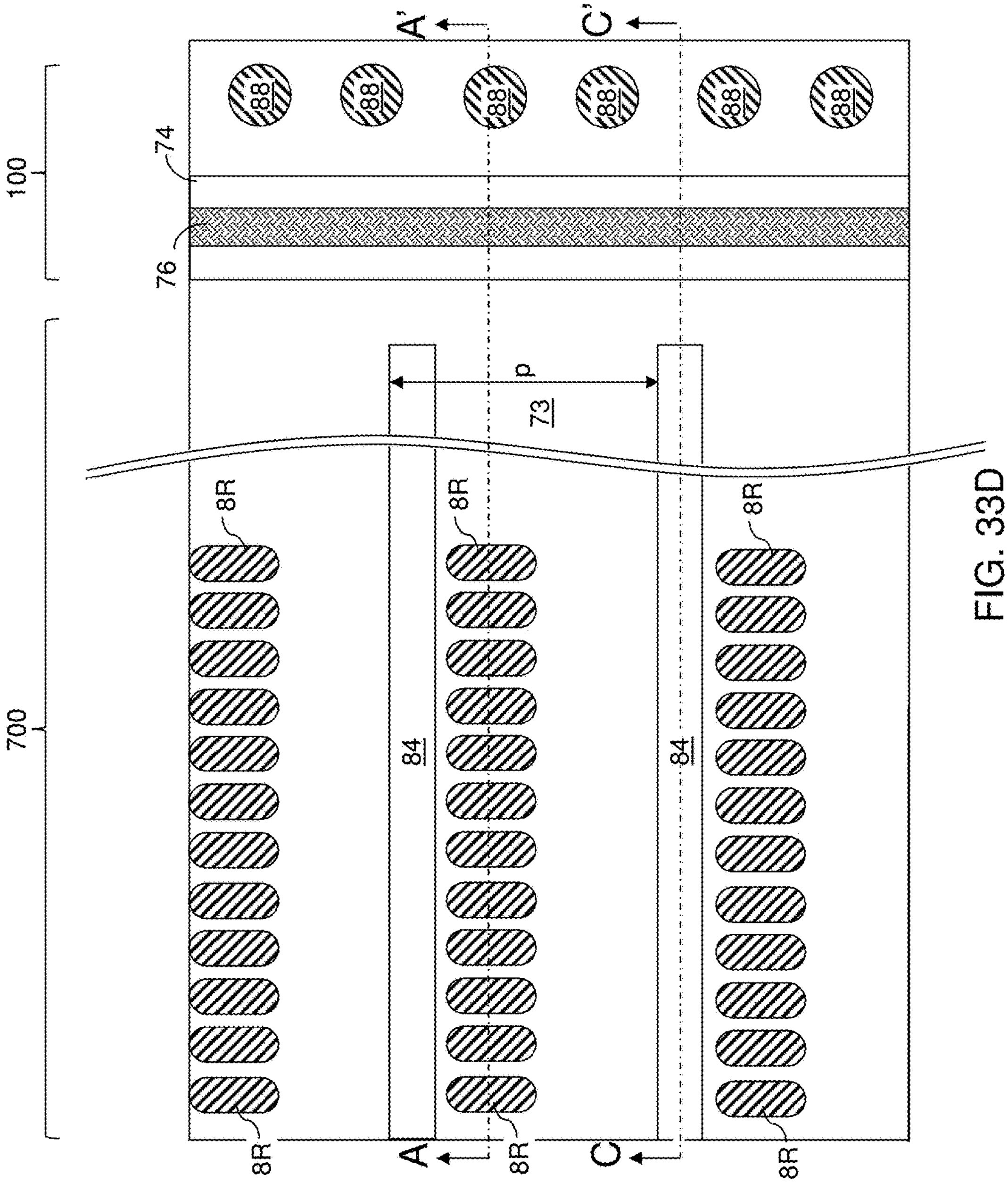
FIG. 33D is a top-down view of the fourth exemplary structure of FIGS. 33A-33C.
Figure 34A:
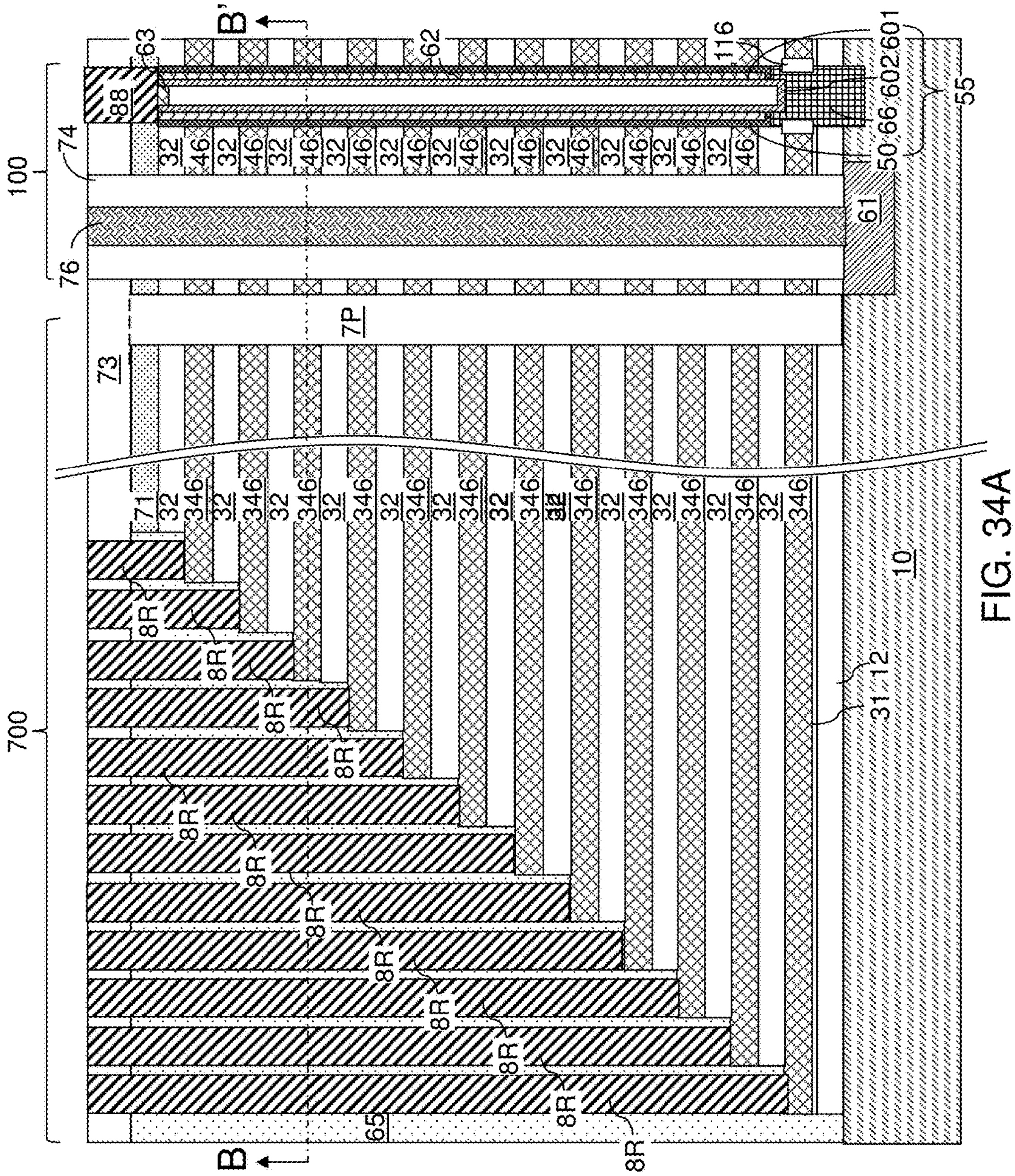
FIG. 34A is a vertical cross-sectional view of the fourth exemplary structure after formation of vertically-extending cavities according to the fourth embodiment of the present disclosure.
Figure 34B:
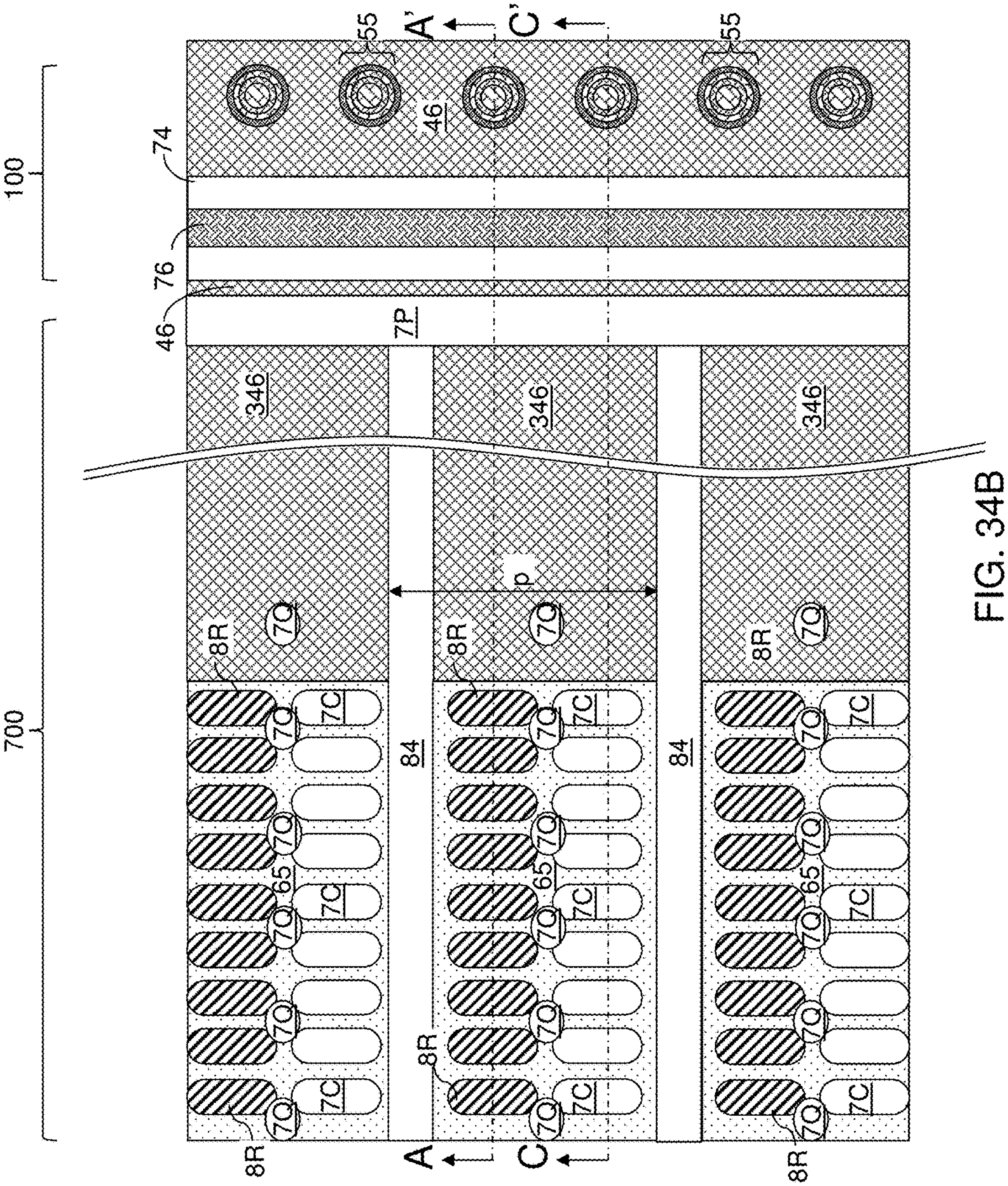
FIG. 34B is a horizontal cross-sectional view of the fourth exemplary structure of FIG. 34A along the plane B-B'. The vertical plane A-A' is the plane of vertical cross-sectional view of FIG. 34A.
Figure 34C:
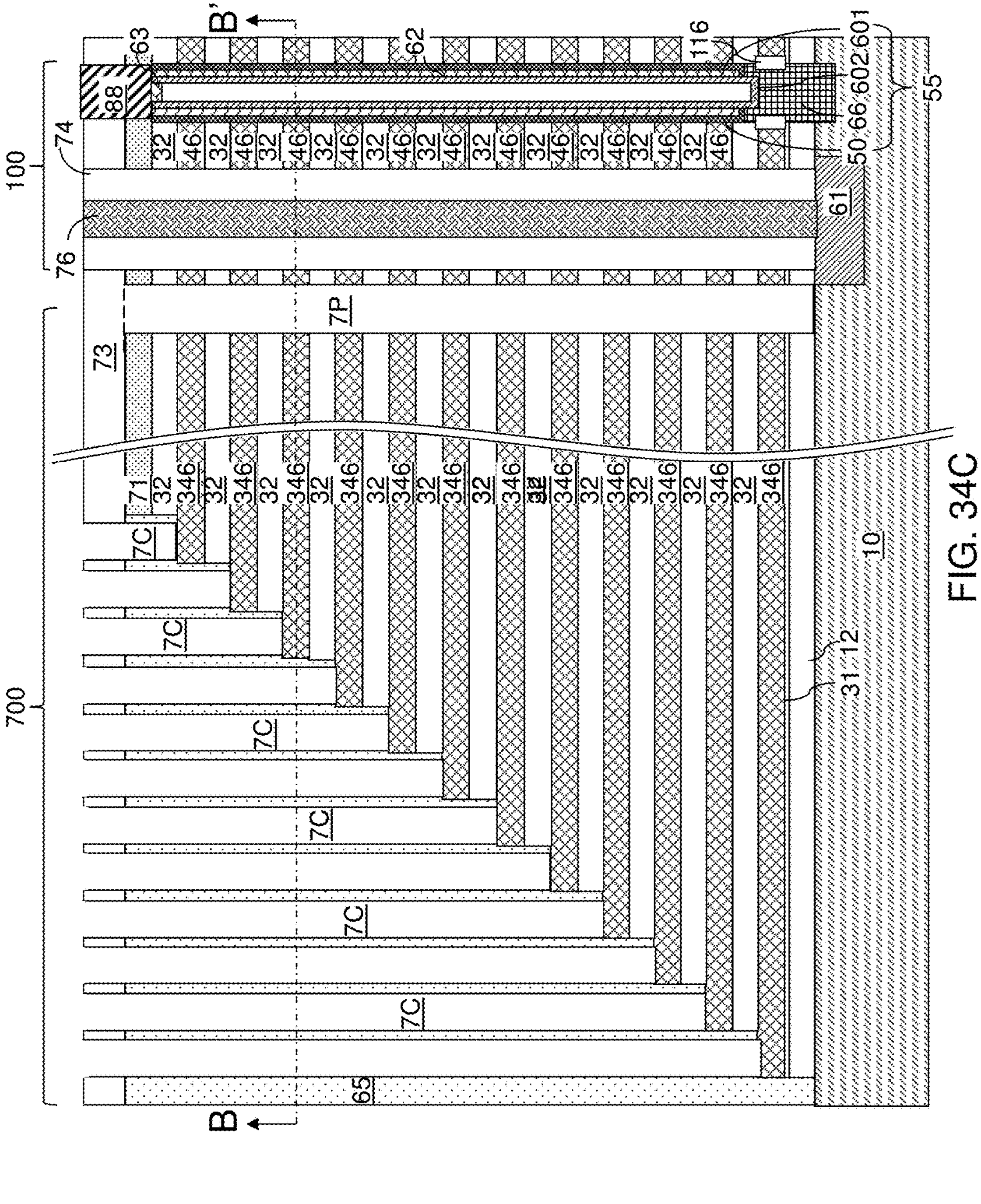
FIG. 34C is a vertical cross-sectional view of the fourth exemplary structure of FIG. 34B along the vertical plane C-C'.
Figure 34D:
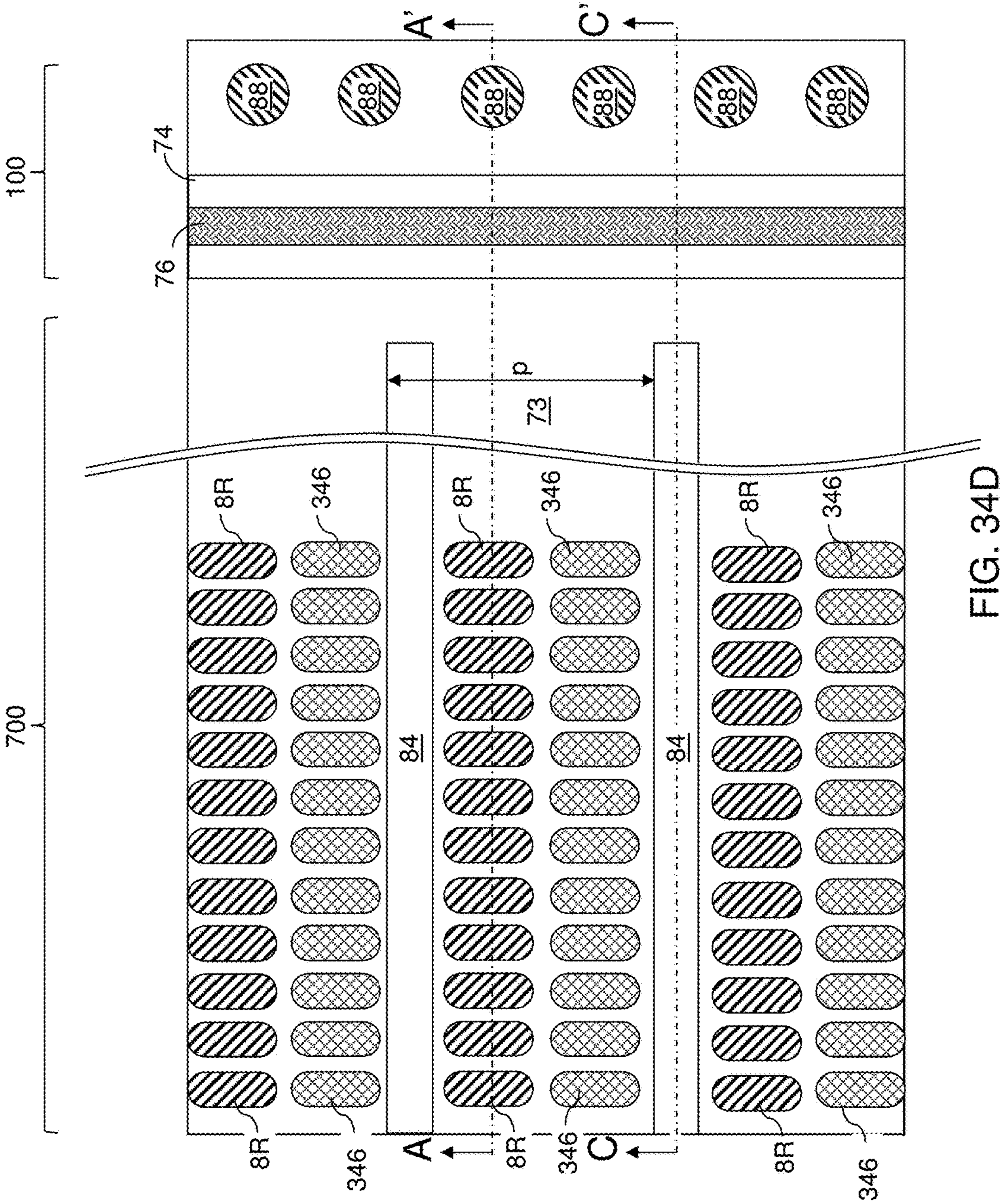
FIG. 34D is a top-down view of the fourth exemplary structure of FIGS. 34A-34C.
Figure 35A:
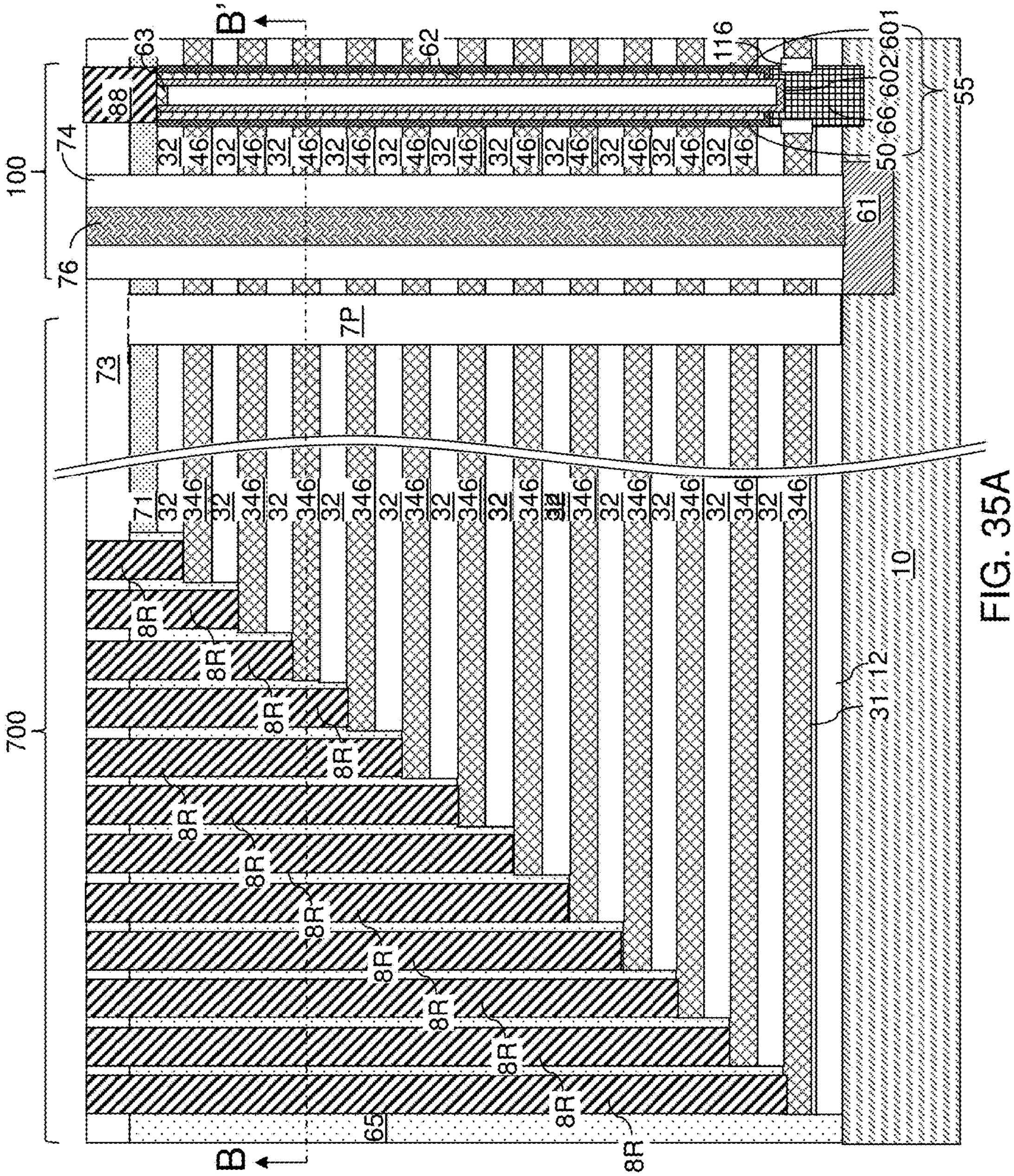
FIG. 35A is a vertical cross-sectional view of the fourth exemplary structure after formation of resistor pillar structures according to the fourth embodiment of the present disclosure.
Figure 35B:
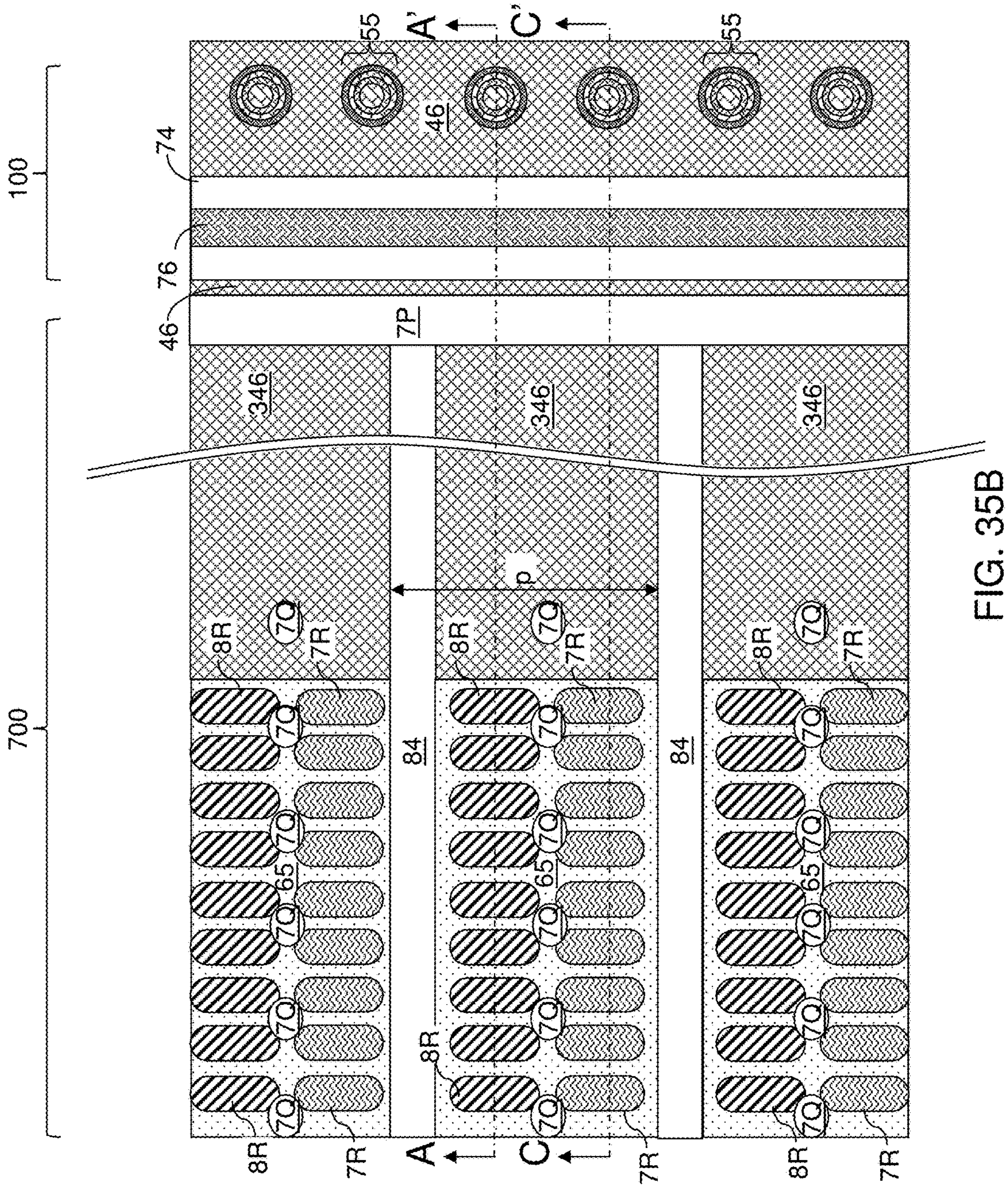
FIG. 35B is a horizontal cross-sectional view of the fourth exemplary structure of FIG. 35A along the plane B-B'. The vertical plane A-A' is the plane of vertical cross-sectional view of FIG. 35A.
Figure 35C:
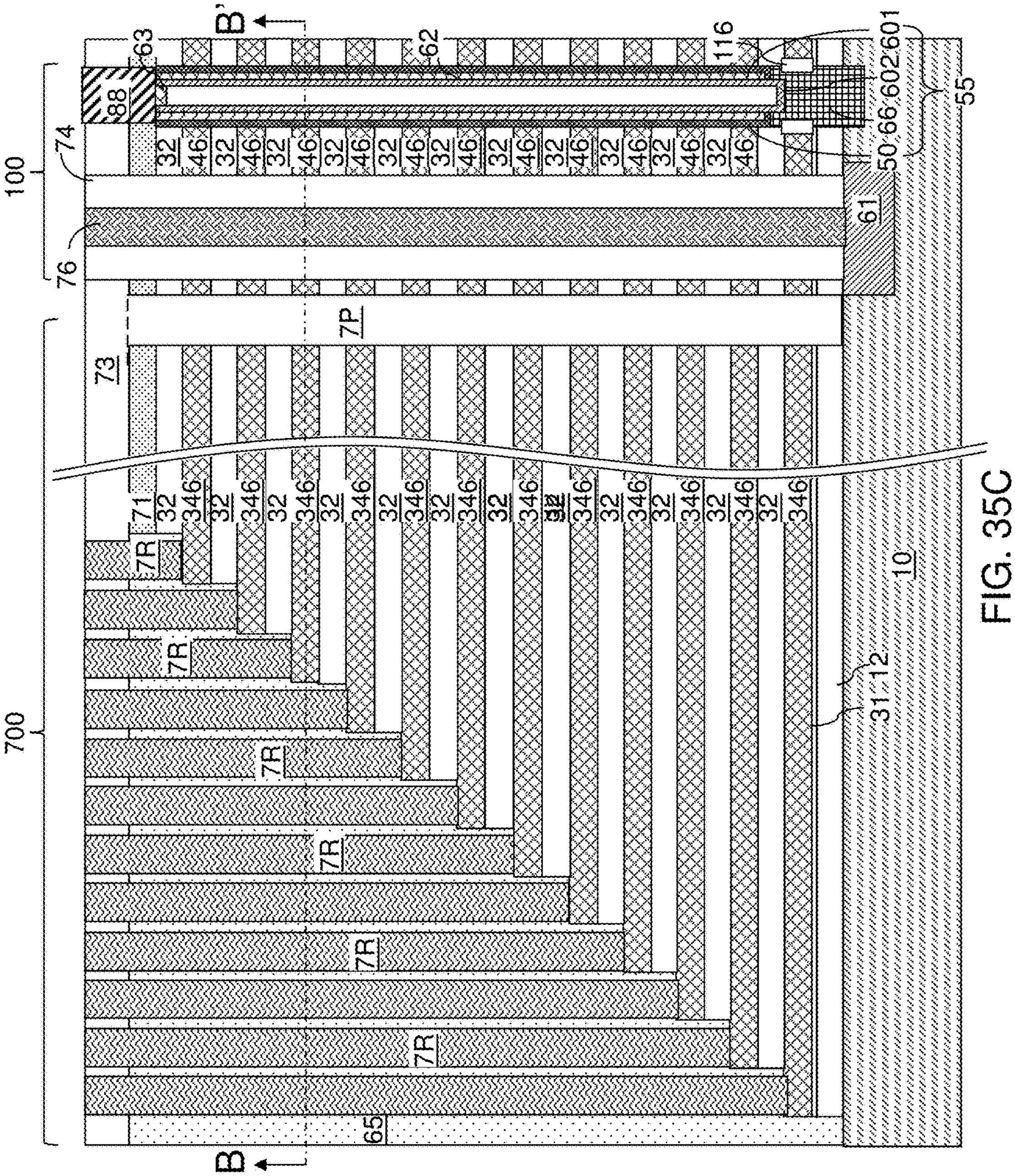
FIG. 35C is a vertical cross-sectional view of the fourth exemplary structure of FIG. 35B along the vertical plane C-C'.
Figure 35D:
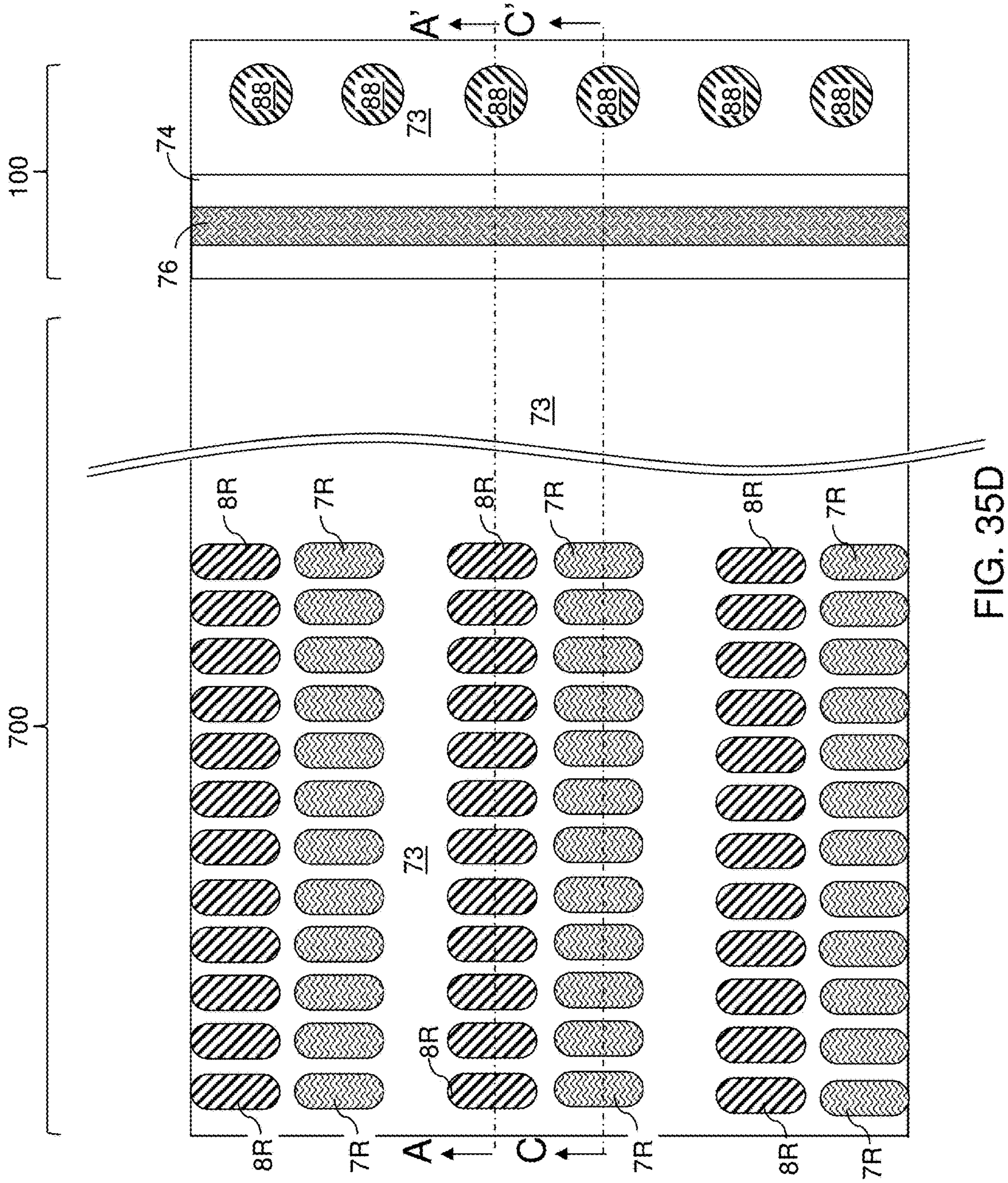
FIG. 35D is a top-down view of the fourth exemplary structure of FIGS. 35A-35C.
Figure 36A:
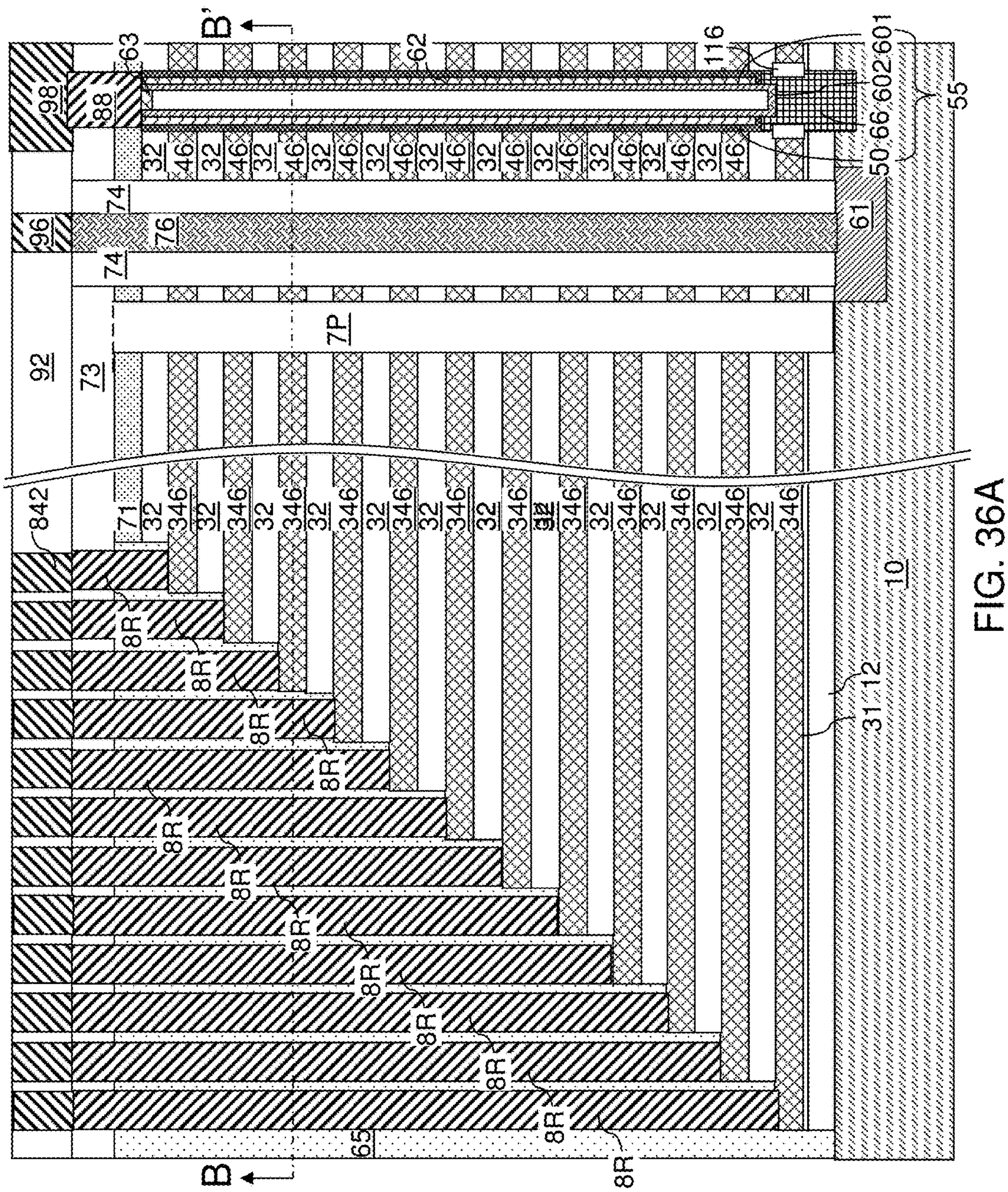
FIG. 36A is a vertical cross-sectional view of the fourth exemplary structure after formation of interconnect line structures according to the fourth embodiment of the present disclosure.
Figure 36B:
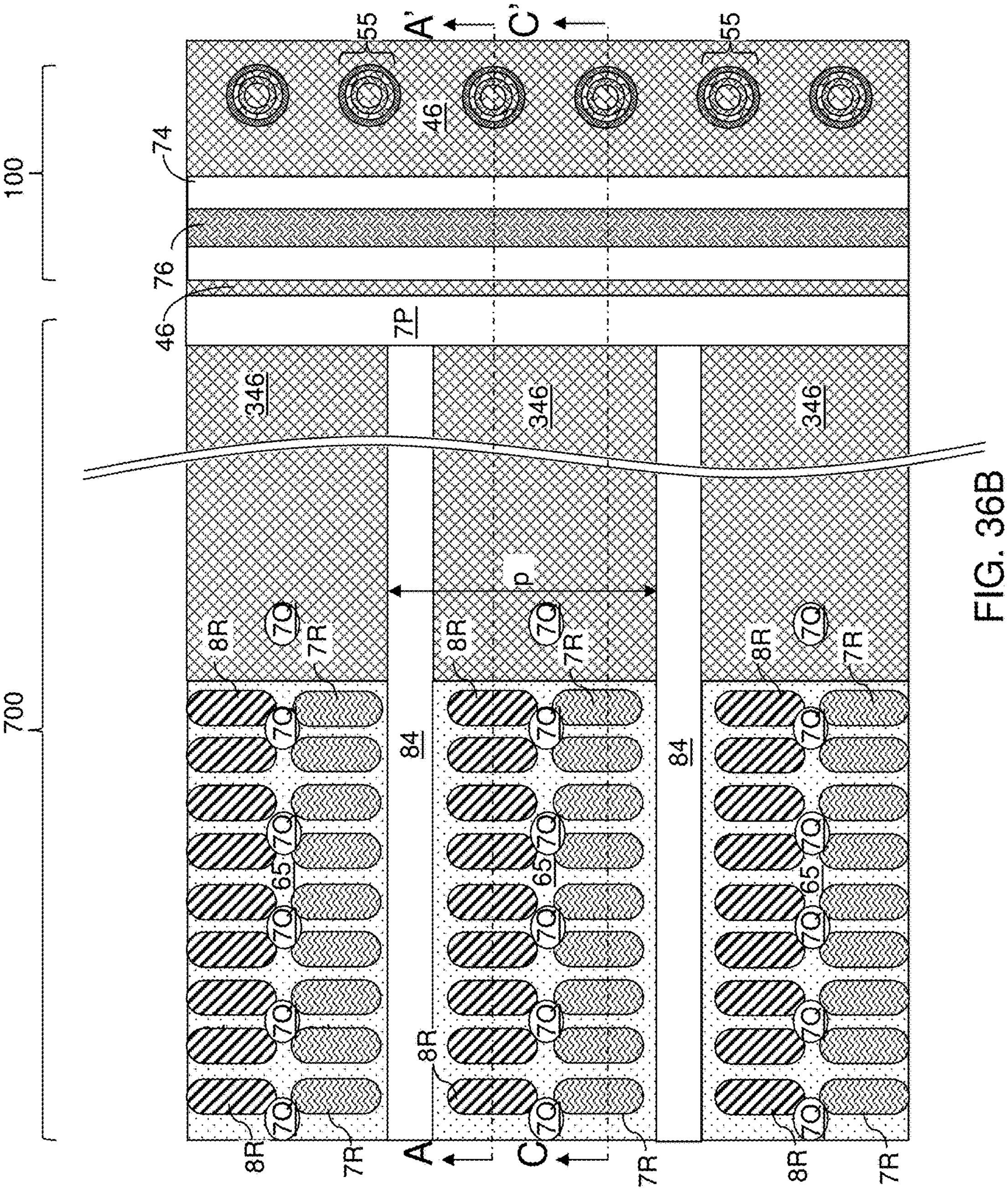
FIG. 36B is a horizontal cross-sectional view of the fourth exemplary structure of FIG. 36A along the plane B-B'. The vertical plane A-A' is the plane of vertical cross-sectional view of FIG. 36A.
Figure 36C:
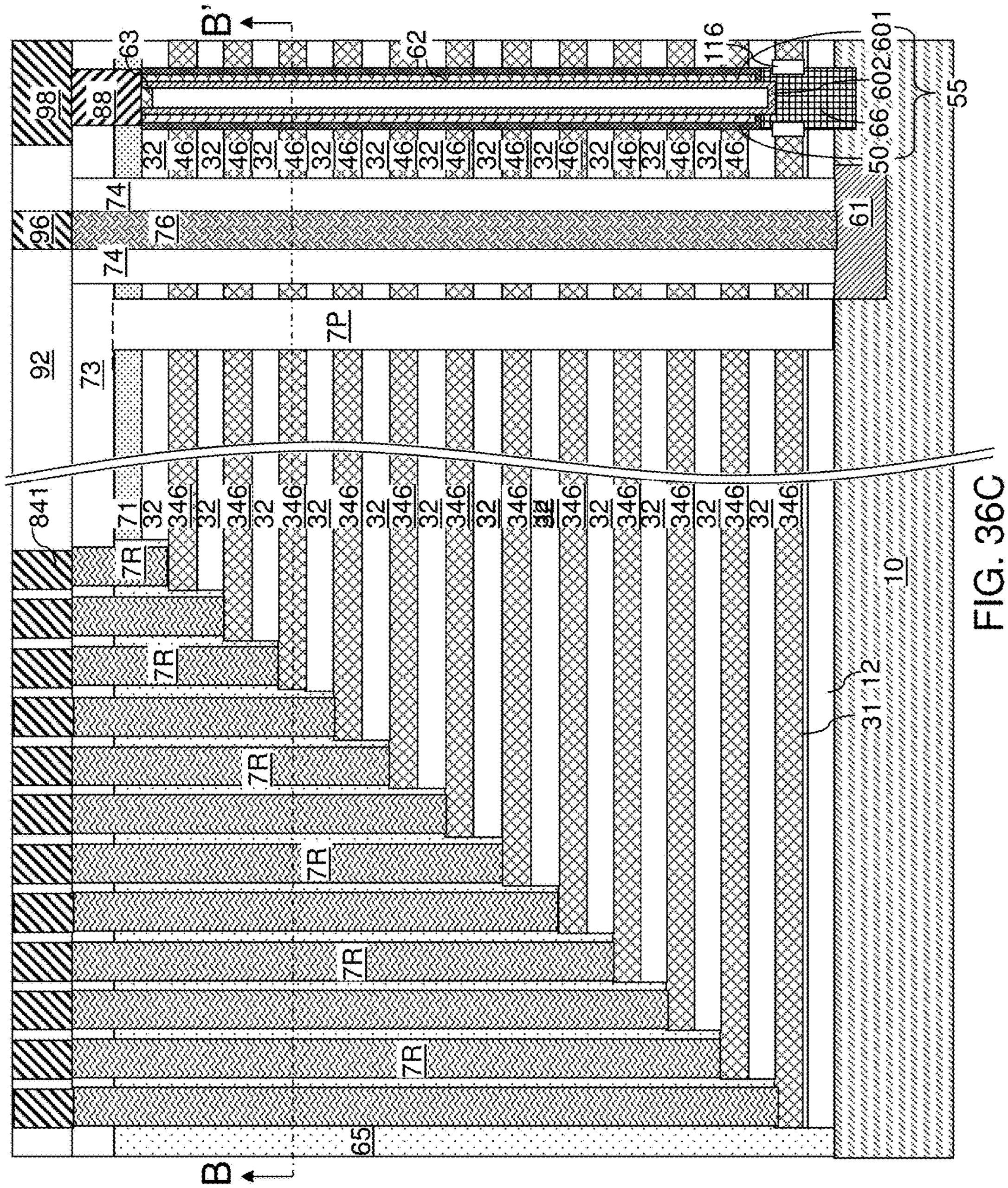
FIG. 36C is a vertical cross-sectional view of the fourth exemplary structure of FIG. 36B along the vertical plane C-C'.
Figure 36D:
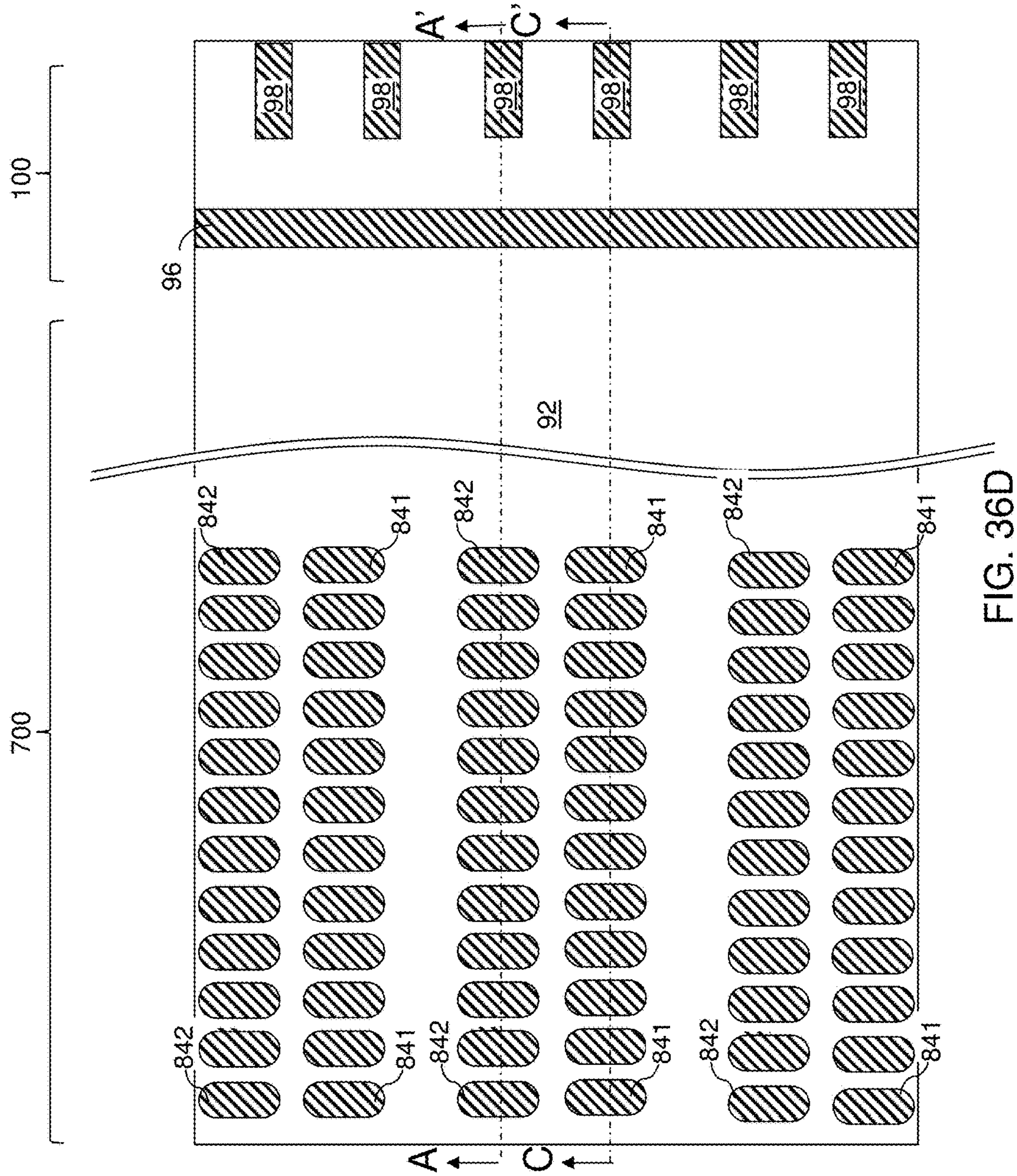
FIG. 36D is a top-down view of the fourth exemplary structure of FIGS. 36A-36C.

Referring to FIGS. 32A and 32B, the processing steps of FIGS. 11A and 11B are performed to form an insulating spacer 74 and a backside contact via structure 76.

Referring to FIGS. 33A-33D, the processing steps of FIGS. 12A-12D are performed with a different lithographic pattern for forming contact via structures, which are herein referred to as resistor contact via structures 8R. A photoresist layer is applied over the dielectric material layer 73, and is lithographically patterned to form openings that overlie stepped horizontal surfaces of the fourth electrically conductive layers 346. A first set of vertically-extending via cavities is formed through the optional dielectric material layer 73 and the retro-stepped dielectric material layer 65. The lithographic pattern formed in the photoresist layer can be selected such that each horizontal stepped surface of the fourth electrically conducive layers 346 is physically exposed at the bottom of the first set of vertically-extending via cavities in the resistor region 700. The photoresist layer is removed, for example, by ashing. The first set of vertically-extending via cavities can be filled in the same manner as in the processing steps of FIGS. 12A-12D of the first embodiment to form the resistor contact via structures 8R.

Each fourth electrically conductive layer 346 is a laterally-extending semiconductor or conductive structure that contacts a respective resistor contact via structure 8R.

Referring to FIGS. 34A-34D, another photoresist layer is applied over the dielectric material layer 73, and is lithographically patterned to form openings that overlie the stepped horizontal surfaces of the fourth electrically conductive layers 346 and do not overlap with the resistor contact via structures 8R. A second set of vertically-extending via cavities 7C is formed through the optional dielectric material layer 73 and the retro-stepped dielectric material layer 65. The lithographic pattern formed in the photoresist layer can be selected such that each horizontal stepped surface of the fourth electrically conducive layers 346 is physically exposed at the bottom of the second set of vertically-extending via cavities in the resistor region 700 without etching, or physically exposing any surface of, the resistor contact via structures 8R. The photoresist layer is removed, for example, by ashing.

Referring to FIGS. 35A-35D, the second set of vertically-extending via cavities 7C can be filled with a suitable material that can provide a target level of resistivity. In one embodiment, the second set of vertically-extending via cavities can be filled with doped semiconductor material. The doped semiconductor material can be deposited in the second set of vertically extending via cavities by deposition of a semiconductor material with in-situ doping, or can be deposited as an intrinsic semiconductor material or a doped semiconductor material and implanted with electrical dopants employing an implantation mask layer (such as a photoresist layer). Excess portions of the doped semiconductor material above the top surface of the dielectric material layer 73 can be removed, for example, by chemical mechanical planarization.

Each remaining portion of the doped semiconductor material in a vertically-extending via cavity of the second constitutes a pillar structure 7R. Each pillar structure 7R can include a doped semiconductor material having a doping of at a preselected dopant level. In one embodiment, the pillar structures 7R can have a same horizontal cross-sectional area, and the resistance of each pillar structure 7R can be inversely proportional to the height of the pillar structure 346. Each fourth electrically conductive layer 346 is a laterally-extending semiconductor or conductive structure that contacts a respective resistor contact via structure 8R and a respective pillar structure 7R. In one embodiment, each of the pillar structure 7R can consist of a respective doped semiconductor material portion that is deposited within a respective vertically-extending cavity formed on the laterally-extending semiconductor or conductive structure (which is embodied as a fourth electrically conductive layer 346).

In one embodiment, a pillar structure 7R is formed within each vertically-extending cavity in the second set of vertically extending cavities, and each pillar structure 7P can comprises a doped semiconductor material portion. All semiconductor material within each pillar structure 7R can have a doping of the same conductivity type, which can be the first conductivity type or the second conductivity type.

Referring to FIGS. 36A-36D and 37, a line level dielectric material layer 92 including a dielectric material can be formed over the top surface of the dielectric material layer 73 in the same manner as in the first embodiment. Interconnect line structures can be formed in the line level dielectric material layer 92, for example, by forming line trenches in the line level dielectric material layer 92 and filling the line trenches with at least one conductive material. Excess portions of the at least one conductive material can be removed from above the top surface of the line level dielectric material layer 92, for example, by chemical mechanical planarization.

First electrode metal lines 841, second electrode metal lines 842, source metal line 96, and bit lines 98, and optionally, additional metal line structures of the first, second, and third embodiments can be formed in the line level dielectric material layer 92. Each first electrode metal line 841 can contact a top surface of a pillar structure 7R, and each second electrode metal line 842 can contact a top surface of a resistor contact via structure 8R. The node-tying metal lines (821, 822, 823, 831, 832, 833) can include first node-tying metal lines (821, 822, 823) that tie the first node of a respective capacitor, and second node-tying metal lines (831, 832, 833) that tie the second node of a respective capacitor. The source metal line 98 provides electrical connection to the backside contact via structure 76 and the source region 61. The bit lines 98 provide electrical connection to the drain contact via structures 88 and the drain regions 63.

While the present disclosure is described employing an embodiment in which a single pillar structure 7R is formed per fourth electrically conductive layer 346, embodiments are contemplated herein in which multiple pillar structures 7R are formed per fourth exemplary conductive structure 346 at one or more levels.

Each physically adjoined set of a pillar structure 7R, a laterally-extending semiconductor or conductive structure as embodied as a portion of a fourth electrically conductive layer 346, and contact via structure 8R collectively constitute a resistor structure (7R, 346, 8R). A plurality of resistor structures can be simultaneously formed.

The fourth exemplary structure comprises a semiconductor device, which comprises an alternating stack (32, 346) of first material layers 32 and second material layers 346 located over a substrate (10, 61), at least one pillar structure 7P extending from a first horizontal plane including a top surface of the alternating stack (32, 346) to a second horizontal plane located underneath, and vertically spaced by a plurality of layers within the alternating stack (32, 346) from, the top surface of the alternating stack. For each pillar structure 7P, the second horizontal plane can be the plane that includes the top surface of a fourth electrically conductive layer 346 that contacts the pillar structure 7R. The plurality of layers that separates the first horizontal plane and the second horizontal plane can be the set of first and second material layers (32, 346) located between the first horizontal plane and the second horizontal plane. The first horizontal plane is common for all pillar structures 7P, and the second horizontal plane depends on the location of the bottommost portion of the pillar structure 7R.

A laterally-extending semiconductor or conductive structure, as embodied by a fourth electrically conductive layer 346, contacts a bottom surface of the at least one pillar structure 7P. A contact via structure 8R contacts a top surface of the laterally-extending semiconductor or conductive structure, as embodied by the fourth electrically conductive layer 346, and is laterally spaced from the at least one pillar structure 7P. Each of the at least one pillar structure 7P comprises a set of at least one doped semiconductor material portion therein (which can be a single doped semiconductor material portion). All semiconductor material within each of the at least one pillar structure has a doping of the same conductivity type, which can be the first conductivity type or the second conductivity type.

A plurality of resistor structures can be provided. Each resistor structure comprises at least one pillar structure 7R extending from the first horizontal plane to a respective electrically conductive layer 346 located at different levels. A fourth electrically conductive layer 346 can contact a bottom surface of each pillar structure 7R. A resistor contact via structure 8R can contact a top surface of each fourth electrically conductive layer 346. In one embodiment, each resistor contact via structure 8R can comprise a metallic via structure.

The doped semiconductor material portion of each pillar structure 7R can comprise a doped polycrystalline semiconductor material portion contacting inner surfaces of at least one electrically insulating material, which can be the insulating material of the retro-stepped dielectric material portion. In one embodiment, the first material layers 32 comprise electrically insulating layers, the second material layers 346 comprise electrically conductive layers, the laterally-extending semiconductor or conductive structure 346 comprises one of the electrically conductive layers. In one embodiment, each of the at least one pillar structure 7P can consist of a respective doped semiconductor material portion.

The alternating stack (32, 346) of the insulator layers 32 and the fourth electrically conductive layers 346 can comprise a stepped surface region in which each fourth electrically conductive layer 346 having at least one overlying fourth electrically conductive layer 346 laterally extends farther than any overlying fourth electrically conductive layer 346. Horizontal surfaces of the alternating stack (32, 346) that do not underlie any other layer within the alternating stack (32, 346) (and which contact one of the retro-stepped dielectric material portion 65, a pillar structure 7R, and/or a resistor contact via structure 8R) are adjoined to vertical surfaces of the first and second material layers. The retro-stepped dielectric material portion 65 overlies the stepped surface region. A set of at least one pillar structure 7R, a laterally-extending semiconductor or conductive structure as embodied in a portion of a fourth electrically conductive layer 346, and a resistor contact via structure 8R collectively constitute a resistor structure.

The first, second, third, and fourth exemplary structures can be formed alone, or in combination with any other among the first, second, third, and fourth exemplary structures. The exemplary structures of the present disclosure can provide passive components (such as resistors and capacitors) integrated with a three-dimensional device including an alternating stack of first material layers and second material layers, which can be a three-dimensional memory device such as a vertical NAND device. Some embodiments of the present disclosure provide capacitor structures and/or resistor structures employing stepped surfaces that are formed on the alternating stack of material layers. Thus, the processing steps of forming contact via structures for control gate electrodes of a vertical memory device can be employed to form the stepped surface region for the exemplary devices of the present disclosure. In some other embodiments, pillar structures that constitute a resistive portion of a resistor structure can be formed employing the same processing steps as the processing steps employed to form memory stack structures and by adding the processing step of a masked ion implantation to dope the semiconductor material therein. Thus, the passive devices of the present disclosure can be formed with minimal addition and/or modification to known processing steps for manufacturing a three-dimensional memory device, thereby reducing the production cost for the passive devices. In addition, the passive devices of the present disclosure can be formed in proximity to memory stack structures by employing stepped surfaces that can be formed on an alternating stack of insulator layers and electrically conductive layers. Thus, integration of the passive devices into a peripheral circuit for a memory device can be done with minimal electrical wiring.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A semiconductor device, comprising:

an alternating stack of first material layers and second material layers located over a substrate;

at least one pillar structure extending from a first horizontal plane including a top surface of the alternating stack through at least a portion of the alternating stack;

a laterally-extending semiconductor or conductive structure contacting a bottom surface of the at least one pillar structure;

a contact via structure contacting a top surface of the laterally-extending semiconductor or conductive structure and laterally spaced from the at least one pillar structure;

a memory opening extending through the alternating stack; and a memory stack structure that comprises a memory film located within the memory opening, and a semiconductor channel located within the memory film;

wherein:

each of the at least one pillar structure comprises at least one doped semiconductor material portion therein;

each semiconductor material portion within the at least one pillar structure has a doping of a same second conductivity type;

the at least one pillar structure comprises at least a portion of a resistor;

each of the at least one pillar structure comprises a layer stack of at least two dielectric material layers located on an outer sidewall of a respective set of at least one doped semiconductor material portion;

the memory film and the layer stack of at least two dielectric material layers comprise an identical set of dielectric materials;

the laterally-extending semiconductor or conductive structure consists of at least one single crystalline semiconductor material portion located in the substrate;

the at least one doped semiconductor material portion comprises a same semiconductor material as the semiconductor channel, and further includes electrical dopants of the same second conductivity type; and the semiconductor channel is intrinsic or has a doping of a first conductivity type that is the opposite of the second conductivity type.

2. The semiconductor structure of claim 1, wherein:

the memory stack structure further comprises a drain region having a same second conductivity type of doping as the least one doped semiconductor material portion; and a second doped semiconductor material portion of the at least one doped semiconductor material portion comprises a same semiconductor material as the drain region.

3. A semiconductor device, comprising:
an alternating stack of first material layers and second material layers located over a substrate;
at least one pillar structure extending from a first horizontal plane including a top surface of the alternating stack through at least a portion of the alternating stack;
a laterally-extending semiconductor or conductive structure contacting a bottom surface of the at least one pillar structure;
a contact via structure contacting a top surface of the laterally-extending semiconductor or conductive structure and laterally spaced from the at least one pillar structure; and
additional resistor structures, each additional resistor structure comprising:
at least one additional pillar structure extending from the first horizontal plane to a respective electrically conductive layer located at a different level from the laterally-extending semiconductor or conductive structure;
a respective electrically conductive layer contacting a bottom surface of the at least one additional pillar structure; and
an additional contact via structure contacting a top surface of the respective electrically conductive layer;
wherein:
each of the at least one pillar structure comprises at least one doped semiconductor material portion therein;
each semiconductor material portion within the at least one pillar structure has a doping of a same second conductivity type;
the first material layers comprise electrically insulating layers;
the second material layers comprise electrically conductive layers;
the laterally-extending semiconductor or conductive structure comprises one of the electrically conductive layers;
each of the at least one pillar structure consists of a respective doped semiconductor material portion;
the alternating stack comprises a stepped surface region in which each electrically conductive layer having at least one overlying electrically conductive layer laterally extends farther than any overlying electrically conductive layer;
a retro-stepped dielectric material portion overlies the stepped surface region; and
the at least one pillar structure, the laterally-extending semiconductor or conductive structure, and the contact via structure collectively constitute a resistor structure.

4. A semiconductor device, comprising:
an alternating stack of first material layers and second material layers located over a substrate;
at least one pillar structure extending from a first horizontal plane including a top surface of the alternating stack through at least a portion of the alternating stack;
a laterally-extending semiconductor or conductive structure contacting a bottom surface of the at least one pillar structure;
a contact via structure contacting a top surface of the laterally-extending semiconductor or conductive structure and laterally spaced from the at least one pillar structure; and
a vertical NAND memory device located over the substrate, wherein:
the vertical NAND memory device comprises a memory stack structure extending through an alternating stack of electrically insulating layers located at each level of the first material layers and electrically conductive layers located at each level of the second material layers;
the electrically conductive layers comprise, or are electrically connected to, a respective word line of the vertical NAND memory device;
the substrate comprises a silicon substrate;
the vertical NAND memory device comprises an array of monolithic three-dimensional NAND strings over the silicon substrate;
at least one memory cell in the first device level of the three-dimensional array of NAND strings is located over another memory cell in the second device level of the three-dimensional array of NAND strings;
the silicon substrate contains an integrated circuit comprising a driver circuit for the memory device located thereon; and
the three-dimensional array of NAND strings comprises:
a plurality of semiconductor channels, wherein at least one end portion of each of the plurality of semiconductor channels extends substantially perpendicular to a top surface of the silicon substrate;
a plurality of charge storage elements, each charge storage element located adjacent to a respective one of the plurality of semiconductor channels; and
a plurality of control gate electrodes having a strip shape extending substantially parallel to the top surface of the silicon substrate, the plurality of control gate electrodes comprise at least a first control gate electrode located in the first device level and a second control gate electrode located in the second device level;
wherein:
each of the at least one pillar structure comprises at least one doped semiconductor material portion therein;
each semiconductor material portion within the at least one pillar structure has a doping of a same second conductivity type; and
the at least one pillar structure comprises at least a portion of a resistor located in at least one of a kerf region, a first stepped surface region between a peripheral device region and a memory device region, a second stepped surface region which comprises a stepped track between the kerf region and the peripheral device region, and a third stepped surface region which comprises a word line contact region containing word line contact via structures.

* * * * *